US012181452B2

(12) United States Patent
Shiner et al.

(10) Patent No.: US 12,181,452 B2
(45) **Date of Patent: *Dec. 31, 2024**

(54) USE OF VAPOR DEPOSITION COATED FLOW PATHS FOR IMPROVED CHROMATOGRAPHY OF METAL INTERACTING ANALYTES

(71) Applicant: Waters Technologies Corporation, Milford, MA (US)

(72) Inventors: Stephen J. Shiner, Holden, MA (US); Cheryl Boissel, Harrisville, RI (US); Matthew A. Lauber, North Smithfield, RI (US); Kevin Wyndham, Upton, MA (US); Michael O. Fogwill, Uxbridge, MA (US)

(73) Assignee: Waters Technologies Corporation, Milford, MA (US)

( * ) Notice: Subject to any disclaimer, the term of this patent is extended or adjusted under 35 U.S.C. 154(b) by 891 days.

This patent is subject to a terminal disclaimer.

(21) Appl. No.: 17/204,021

(22) Filed: Mar. 17, 2021

(65) Prior Publication Data

US 2021/0223217 A1 Jul. 22, 2021

Related U.S. Application Data

(63) Continuation-in-part of application No. 16/133,089, filed on Sep. 17, 2018, now Pat. No. 11,709,155.

(60) Provisional application No. 62/559,895, filed on Sep. 18, 2017.

(51) Int. Cl.

| | |
|---|---|
| ***G01N 30/60*** | (2006.01) |
| ***B01D 15/22*** | (2006.01) |
| ***B05D 1/00*** | (2006.01) |
| ***B05D 7/14*** | (2006.01) |
| ***G01N 30/02*** | (2006.01) |

(52) U.S. Cl.
CPC .......... *G01N 30/603* (2013.01); *B01D 15/22* (2013.01); *B05D 1/60* (2013.01); *B05D 7/14* (2013.01); *G01N 30/6052* (2013.01); *G01N 2030/027* (2013.01)

(58) Field of Classification Search
CPC ................ G01N 30/60; G01N 30/603; G01N 2030/567; B01D 15/22; B01D 15/10; B01D 15/206
See application file for complete search history.

(56) References Cited

U.S. PATENT DOCUMENTS

| | | | |
|---|---|---|---|
| 2,801,186 | A | 7/1957 | Alexander et al. |
| 4,207,188 | A | 6/1980 | Tsuda et al. |
| 4,708,782 | A | 11/1987 | Andresen et al. |
| 4,711,820 | A | 12/1987 | Arkles et al. |
| 4,833,093 | A | 5/1989 | Malmqvist et al. |
| 4,945,282 | A | 7/1990 | Kawamura et al. |
| 4,999,162 | A | 3/1991 | Wells et al. |
| 5,002,794 | A | 3/1991 | Ratner et al. |
| 5,153,072 | A | 10/1992 | Ratner et al. |
| 5,470,463 | A | 11/1995 | Girot et al. |
| 5,550,184 | A | 8/1996 | Halling |
| 5,595,813 | A | 1/1997 | Ogawa et al. |
| 5,643,436 | A | 7/1997 | Ogawa et al. |
| 5,658,732 | A | 8/1997 | Ebersole et al. |
| 5,688,855 | A | 11/1997 | Stoy et al. |
| 5,856,192 | A | 1/1999 | Bloch |
| 5,876,753 | A | 3/1999 | Timmons et al. |
| 5,877,028 | A | 3/1999 | Chandler et al. |
| 5,909,314 | A | 6/1999 | Oka et al. |
| 6,013,372 | A | 1/2000 | Hayakawa et al. |
| 6,054,227 | A | 4/2000 | Greenberg et al. |
| 6,074,981 | A | 6/2000 | Tada et al. |
| 6,121,608 | A | 9/2000 | Takada et al. |
| 6,194,346 | B1 | 2/2001 | Tada et al. |
| 6,207,263 | B1 | 3/2001 | Takematsu et al. |
| RE37,183 | E | 5/2001 | Kawamura et al. |
| 6,265,026 | B1 | 7/2001 | Wang |

(Continued)

FOREIGN PATENT DOCUMENTS

| | | | |
|---|---|---|---|
| AU | 2020244497 | A1 | 10/2020 |
| CA | 2538124 | C | 7/2010 |

(Continued)

OTHER PUBLICATIONS

International Search Report and Written Opinion issued in International Application No. PCT/IB2021/059534 dated Mar. 10, 2022.

(Continued)

*Primary Examiner* — Ryan B Huang
(74) *Attorney, Agent, or Firm* — WOMBLE BOND DICKINSON (US) LLP; Deborah M. Vernon; Ricardo Joseph

(57) ABSTRACT

A chromatographic device including a coated metallic frit is disclosed. The coating is provided over the fluid exposed surfaces of the frit, thereby covering metallic surfaces to prevent interaction with an analyte in the flowstream. This technology relates to the use of a vapor deposition coated frit together with an uncoated frit in a liquid flow path for improved chromatography. More specifically, this technology relates to liquid chromatographic devices for separating analytes in a sample having a single coated frit within an uncoated metallic fluidic flow path (i.e., the column tube or channel is formed of stainless steel, titanium (pure or alloyed), or some mixture of stainless steel and titanium) and does not include the coating applied to the frit.

18 Claims, 40 Drawing Sheets

(56) References Cited

U.S. PATENT DOCUMENTS 6,277,489 B1 8/2001 Abbott et al.
6,306,506 B1 10/2001 Timmons et al.
6,329,024 B1 12/2001 Timmons et al.
6,329,209 B1 12/2001 Wagner et al.
6,337,129 B1 1/2002 Watanabe et al.
6,340,404 B1 1/2002 Oka et al.
6,383,642 B1 5/2002 Le Bellac et al.
6,436,682 B1 8/2002 Bryan et al.
6,440,565 B1 8/2002 Kim et al.
6,444,326 B1 9/2002 Smith
6,461,334 B1 10/2002 Buch-Rasmussen et al.
6,465,056 B1 10/2002 Chabrecek et al.
6,482,531 B1 11/2002 Timmons et al.
6,547,868 B1 4/2003 Belmares et al.
6,599,594 B1 7/2003 Walther et al.
6,645,378 B1 11/2003 Liu et al.
6,660,338 B1 12/2003 Hargreaves
6,686,035 B2 2/2004 Jiang et al.
6,706,408 B2 3/2004 Jelle
6,743,516 B2 6/2004 Murphy et al.
6,763,437 B1 7/2004 Nguyen et al.
6,783,800 B2 8/2004 Saito et al.
6,844,028 B2 1/2005 Mao et al.
6,873,387 B2 3/2005 Hokazono et al.
6,905,772 B2 6/2005 Shoup et al.
6,916,541 B2 7/2005 Pantano et al.
6,991,826 B2 1/2006 Pellerite et al.
7,067,194 B2 6/2006 Mao et al.
7,138,186 B2 11/2006 Luten, III
7,250,214 B2 7/2007 Walter et al.
7,285,674 B2 10/2007 Palma et al.
7,294,365 B2 11/2007 Hayakawa et al.
7,351,477 B2 4/2008 Yamaya et al.
7,387,836 B2 6/2008 Gianolio et al.
7,413,774 B2 8/2008 Kobrin et al.
7,419,636 B2 9/2008 Aker et al.
7,419,699 B2 9/2008 Kitada et al.
7,431,969 B2 10/2008 Gleason et al.
7,553,514 B2 6/2009 Fan et al.
7,629,029 B2 12/2009 Mao et al.
7,638,167 B2 12/2009 Kobrin et al.
7,662,936 B2 2/2010 Kadkhodayan et al.
7,687,239 B2 3/2010 Goldberg et al.
7,695,775 B2 4/2010 Kobrin et al.
7,732,216 B2 6/2010 Nochumson et al.
7,736,735 B2 6/2010 Kanamori et al.
7,776,396 B2 8/2010 Kobrin et al.
7,785,649 B2 8/2010 Jung et al.
7,815,922 B2 10/2010 Chaney et al.
7,842,393 B2 11/2010 Kuzuya et al.
7,879,396 B2 2/2011 Kobrin et al.
7,901,744 B2 3/2011 Denes et al.
7,935,489 B2 5/2011 O'Neill et al.
7,935,659 B2 5/2011 Nova et al.
7,955,656 B2 6/2011 Murayama et al.
7,955,704 B2 6/2011 Lowery et al.
8,008,225 B2 8/2011 Henze et al.
8,025,915 B2 9/2011 Haines et al.
8,062,881 B2 11/2011 Bookbinder et al.
8,105,821 B2 1/2012 McGall et al.
8,147,954 B2 4/2012 Lee et al.
8,163,354 B2 4/2012 Dang et al.
8,178,168 B2 5/2012 O'Neill et al.
8,178,602 B2 5/2012 Mao et al.
8,323,166 B2 12/2012 Haines et al.
8,349,408 B2 1/2013 Dulka et al.
8,366,814 B2 2/2013 Jones et al.
8,404,621 B2 3/2013 Ikeda et al.
8,512,864 B2 8/2013 Konno et al.
8,557,748 B2 10/2013 Ikeda et al.
8,580,355 B2 11/2013 Durandeau et al.
8,652,588 B2 2/2014 Teer et al.
8,668,972 B2 3/2014 Lewis et al.
8,691,104 B2 4/2014 Greer et al.
8,709,588 B2 4/2014 Cadet et al.
8,741,158 B2 6/2014 Aytug et al.
8,778,278 B2 7/2014 Xiong et al.
8,784,565 B2 7/2014 Hillabrand et al.
8,795,787 B2 8/2014 Jehle
8,841,070 B2 9/2014 Harnack et al.
8,992,590 B2 3/2015 Ott et al.
8,993,479 B2 3/2015 Zuilhof et al.
9,034,660 B2 5/2015 Boday et al.
9,075,189 B2 7/2015 West
9,108,012 B2 8/2015 Pryce Lewis et al.
9,175,026 B2 11/2015 Garrell et al.
9,255,929 B2 2/2016 Jiang et al.
9,272,095 B2 3/2016 Felts et al.
9,308,520 B2 4/2016 Ekeroth
9,340,880 B2 5/2016 Mattzela
9,364,853 B2 6/2016 Chen
9,388,315 B2 7/2016 Hoshino
9,445,504 B2 9/2016 Kang et al.
9,475,225 B2 10/2016 Giraud et al.
9,523,004 B2 12/2016 Hervieu et al.
9,533,006 B2 1/2017 Jiang et al.
9,541,480 B2 1/2017 Chang et al.
9,556,360 B2 1/2017 McGall et al.
9,777,368 B2 10/2017 Smith et al.
9,915,001 B2 3/2018 Yuan et al.
9,925,521 B2 3/2018 Wyndham et al.
9,926,203 B2 3/2018 Zhou
9,975,143 B2 5/2018 Smith et al.
9,999,901 B2 6/2018 Boscher et al.
10,472,769 B2 11/2019 Tuteja et al.
10,604,660 B2 3/2020 Smith et al.
10,813,609 B2 10/2020 Goto et al.
10,813,610 B2 10/2020 Yoshida et al.
10,814,253 B2 10/2020 Lipkens et al.
10,814,305 B2 10/2020 Liao et al.
10,814,319 B2 10/2020 Dasgupta et al.
10,814,320 B2 10/2020 Le et al.
10,814,740 B2 10/2020 Wilhide
10,815,247 B2 10/2020 Flemming et al.
10,815,269 B2 10/2020 Maloisel et al.
10,816,115 B2 10/2020 Buerger et al.
10,816,476 B2 10/2020 Nunney et al.
10,816,487 B2 10/2020 Matney et al.
10,816,515 B2 10/2020 Hollnagel et al.
10,816,518 B2 10/2020 Jarrold et al.
10,816,786 B2 10/2020 Douglas-Hamilton et al.
10,818,485 B2 10/2020 Yamaguchi
10,818,486 B2 10/2020 Corr et al.
10,828,665 B2 11/2020 Stiff-Roberts et al.
10,876,202 B2 12/2020 Verbeck, IV et al.
10,876,210 B1 12/2020 Claussen et al.
10,895,009 B2 1/2021 Carr et al.
10,912,714 B2 2/2021 Weikart et al.
11,435,327 B2 9/2022 Matsumoto
11,442,064 B2 9/2022 Koskinen et al.
11,511,213 B2 11/2022 Belanger et al.
2001/0021446 A1 9/2001 Takematsu et al.
2002/0016250 A1 2/2002 Hayakawa et al.
2002/0020053 A1 2/2002 Fonash et al.
2002/0026899 A1 3/2002 McLaughlin et al.
2002/0142621 A1 10/2002 Wang
2002/0172938 A1 11/2002 Cuomo et al.
2002/0195950 A1 12/2002 Mikhael et al.
2003/0049860 A1 3/2003 Cholewa
2003/0057154 A1 3/2003 Gjerde et al.
2003/0059573 A1 3/2003 Timmons et al.
2003/0109062 A1 6/2003 Inomata et al.
2003/0113477 A1 6/2003 Timmons et al.
2003/0138645 A1 7/2003 Gleason et al.
2004/0261703 A1 12/2004 Kobrin et al.
2005/0118595 A1 6/2005 Lahann
2005/0164402 A1 7/2005 Belisle et al.
2005/0214803 A1 9/2005 Wang
2006/0073521 A1 4/2006 Saito et al.
2006/0110594 A1 5/2006 Frutos et al.
2006/0213441 A1 9/2006 Kobrin et al.
2006/0219598 A1 10/2006 Cody et al.
2006/0251795 A1 11/2006 Kobrin et al.
2007/0031854 A1 2/2007 Katsilometes

(56) References Cited

U.S. PATENT DOCUMENTS

2007/0048747 A1 3/2007 Leslie et al.
2007/0065591 A1 3/2007 Parbhu
2007/0122308 A1 5/2007 Ikeda et al.
2007/0172666 A1 7/2007 Denes et al.
2007/0254378 A1 11/2007 Zhang et al.
2008/0041105 A1 2/2008 Hahn et al.
2008/0075960 A1 3/2008 Pocius et al.
2008/0085528 A1 4/2008 Marcinkeviciene et al.
2008/0170230 A1 7/2008 Gerion
2008/0188010 A1 8/2008 Saitoh et al.
2008/0248589 A1 10/2008 Belisle et al.
2008/0312356 A1 12/2008 Kobrin et al.
2009/0020712 A1 1/2009 Matsumoto
2009/0078633 A1 3/2009 Chen et al.
2009/0081371 A1 3/2009 Minami et al.
2009/0137526 A1 5/2009 Jubert et al.
2009/0162571 A1 6/2009 Haines et al.
2009/0176084 A1 7/2009 Yoshihara et al.
2009/0206034 A1 8/2009 Nakajima
2009/0286435 A1 11/2009 Badyal et al.
2009/0318609 A1 12/2009 Badyal et al.
2010/0038298 A1 2/2010 Angelini et al.
2010/0080903 A1 4/2010 Tamitsuji et al.
2010/0178512 A1 7/2010 Giesenberg et al.
2010/0196724 A1 8/2010 Yamasaki et al.
2010/0200207 A1 8/2010 Fukuda et al.
2010/0203646 A1 8/2010 Larsen et al.
2010/0282077 A1 11/2010 Jones et al.
2010/0285596 A1 11/2010 Yu et al.
2010/0330278 A1 12/2010 Choi et al.
2011/0000658 A1 1/2011 Tanaka et al.
2011/0062047 A1 3/2011 Haines et al.
2011/0120213 A1 5/2011 Hirayama et al.
2011/0120940 A1 5/2011 Allen et al.
2011/0189493 A1 8/2011 Ott et al.
2011/0295033 A1 12/2011 Mayorga et al.
2012/0069295 A1 3/2012 Fukagawa et al.
2012/0100546 A1 4/2012 Lowery, Jr. et al.
2012/0123345 A1 5/2012 Felts et al.
2012/0132794 A1 5/2012 Buchanan et al.
2012/0178848 A1 7/2012 Adkinson et al.
2012/0219697 A1 8/2012 Chen
2012/0219727 A1 8/2012 Gandhiraman et al.
2012/0251797 A1 10/2012 Smith et al.
2012/0252709 A1 10/2012 Felts et al.
2012/0288717 A1 11/2012 Mao et al.
2012/0298585 A1* 11/2012 Ritchie ................ G01N 30/603
210/656
2013/0004780 A1 1/2013 Hervieu et al.
2013/0025503 A1 1/2013 Park et al.
2013/0029138 A1 1/2013 Benard et al.
2013/0090260 A1 4/2013 Nova et al.
2013/0136937 A1 5/2013 Fujii et al.
2013/0157062 A1 6/2013 Kihara et al.
2013/0174642 A1 7/2013 Bourlon et al.
2013/0244025 A1 9/2013 Smith et al.
2013/0266762 A1 10/2013 Mayers et al.
2013/0337226 A1 12/2013 Curran et al.
2014/0004022 A1 1/2014 Sagona et al.
2014/0065368 A1 3/2014 Aytug et al.
2014/0147631 A1 5/2014 Yang et al.
2014/0154399 A1 6/2014 Weikart et al.
2014/0187666 A1 7/2014 Aizenberg et al.
2014/0202355 A1 7/2014 Hoshino
2014/0287240 A1 9/2014 Murotani et al.
2014/0299538 A1 10/2014 Gleason et al.
2014/0318748 A1 10/2014 Svensson et al.
2014/0323981 A1 10/2014 Giraud et al.
2014/0342954 A1 11/2014 Ingber et al.
2014/0357091 A1 12/2014 Mattzela
2014/0370300 A1 12/2014 Smith
2015/0021339 A1 1/2015 Felts et al.
2015/0024152 A1* 1/2015 Carr ....................... B01D 15/22
428/34.1
2015/0030885 A1 1/2015 Smith
2015/0064376 A1 3/2015 Smith et al.
2015/0064451 A1 3/2015 Kalaga et al.
2015/0098084 A1 4/2015 Felts et al.
2015/0118502 A1 4/2015 Mitsuhashi et al.
2015/0118504 A1 4/2015 Ohshita et al.
2015/0122365 A1 5/2015 Carr et al.
2015/0152124 A1 6/2015 Mori et al.
2015/0175814 A1 6/2015 Aizenberg et al.
2015/0209846 A1 7/2015 Aizanberg et al.
2015/0210951 A1 7/2015 Aizenberg et al.
2015/0232806 A1 8/2015 Jung et al.
2015/0239773 A1 8/2015 Aytug
2015/0247051 A1 9/2015 Ha et al.
2015/0273522 A1 10/2015 Boscher et al.
2015/0283307 A1 10/2015 Smith et al.
2015/0298165 A1 10/2015 Smith
2015/0307525 A1 10/2015 Higano et al.
2015/0307719 A1 10/2015 Mitsuhashi et al.
2015/0309216 A1 10/2015 Fournand
2015/0322272 A1 11/2015 Pokroy et al.
2015/0329725 A1 11/2015 Liu
2016/0002488 A1 1/2016 Takao et al.
2016/0002489 A1 1/2016 Gleason et al.
2016/0017397 A1 1/2016 Roy et al.
2016/0038972 A1 2/2016 Lu
2016/0040039 A1 2/2016 Yamane et al.
2016/0059260 A1 3/2016 Smith et al.
2016/0074862 A1 3/2016 Breaux et al.
2016/0082435 A1* 3/2016 Bunner ............. B01L 3/502753
422/503
2016/0168021 A1 6/2016 Goh et al.
2016/0200941 A1 7/2016 Liu et al.
2016/0231594 A1 8/2016 Ang et al.
2016/0243308 A1 8/2016 Giraud et al.
2016/0251261 A1 9/2016 Bureau
2016/0289824 A1 10/2016 Mattzela et al.
2016/0302723 A1 10/2016 Chen
2016/0340544 A1 11/2016 Katsukawa et al.
2017/0001956 A1 1/2017 Chau et al.
2017/0044315 A1 2/2017 Mitsuhashi et al.
2017/0173223 A1 6/2017 Delaney, Jr. et al.
2018/0049644 A1 2/2018 Themelis
2018/0357402 A1 12/2018 Omata et al.
2019/0032201 A1 1/2019 Smith et al.
2019/0077966 A1 3/2019 Koguchi et al.
2019/0271711 A1 9/2019 Egan et al.
2019/0390329 A1 12/2019 Carr et al.
2020/0024155 A1 1/2020 Kano et al.
2020/0024156 A1 1/2020 Kano et al.
2020/0024157 A1 1/2020 Kano et al.
2020/0025729 A1 1/2020 Milburn et al.
2020/0062615 A1 2/2020 Rajagopalan et al.
2020/0109297 A1 4/2020 McDaniel
2020/0189938 A1 6/2020 Kano et al.
2020/0215457 A1 7/2020 DeLano et al.
2020/0239641 A1 7/2020 Kawakami et al.
2020/0328073 A1 10/2020 Peterson et al.
2020/0332801 A1 10/2020 Kimura
2020/0333265 A1 10/2020 Doki et al.
2020/0333369 A1 10/2020 Toyoda et al.
2020/0334792 A1 10/2020 Themelis
2020/0335902 A1 10/2020 Tanaka
2020/0337659 A1 10/2020 Sano et al.
2020/0338528 A1 10/2020 Dong et al.
2020/0339322 A1 10/2020 Christensen et al.
2020/0339665 A1 10/2020 Bruhlmann et al.
2020/0339931 A1 10/2020 Bremer et al.
2020/0339977 A1 10/2020 Lebofsky et al.
2020/0339980 A1 10/2020 Dellinger et al.
2020/0340047 A1 10/2020 Mollerup
2020/0340468 A1 10/2020 Kuntz et al.
2020/0340889 A1 10/2020 Mlcak et al.
2020/0340890 A1 10/2020 Mlcak
2020/0340910 A1 10/2020 Handique
2020/0340946 A1 10/2020 Bateman et al.
2020/0340949 A1 10/2020 Mlcak et al.
2020/0340950 A1 10/2020 Mlcak et al.
2020/0340956 A1 10/2020 Ortmann et al.
2020/0340959 A1 10/2020 Schultz et al.

(56) References Cited

U.S. PATENT DOCUMENTS

2020/0340961 A1 10/2020 Kunimura
2020/0340982 A1 10/2020 Levin et al.
2020/0341253 A1 10/2020 Foelling
2020/0341255 A1 10/2020 Chan
2020/0341259 A1 10/2020 Chan et al.
2020/0341278 A1 10/2020 Tanaka
2020/0341378 A1 10/2020 Wolterink et al.
2020/0342326 A1 10/2020 Rahnama Moghaddam
2020/0342672 A1 10/2020 Schmelig et al.
2020/0343082 A1 10/2020 Richardson et al.
2020/0348307 A1 11/2020 Beierle et al.
2020/0365237 A1 11/2020 Madden et al.
2020/0375846 A1 12/2020 Chang et al.
2021/0009817 A1 1/2021 Poulet et al.
2021/0009883 A1 1/2021 Tuteja et al.
2021/0032157 A1 2/2021 Czihal et al.
2021/0061049 A1 3/2021 Lekon et al.
2021/0098233 A1 4/2021 Kapoor et al.
2021/0101176 A1 4/2021 Baltazar et al.
2021/0108252 A1 4/2021 Beverly

FOREIGN PATENT DOCUMENTS

CA 2881275 C 10/2020
CA 2855353 C 1/2021
CN 104327663 A 2/2015
CN 109225113 A 1/2019
CN 109608680 A 4/2019
CN 111471977 A 7/2020
CN 111560172 A 8/2020
CN 111848755 A 10/2020
CN 111855826 A 10/2020
CN 111855827 A 10/2020
CN 111863585 A 10/2020
CN 111944153 A 11/2020
CN 112011055 A 12/2020
CN 112264272 A 1/2021
EP 1816155 B1 6/2011
EP 2587258 A1 5/2013
EP 2608219 B1 3/2015
EP 2915833 A1 9/2015
EP 3573646 A1 12/2019
EP 3633366 A1 4/2020
EP 2403621 B1 10/2020
EP 2798664 B1 10/2020
EP 2834837 B1 10/2020
EP 2900819 B1 10/2020
EP 3006980 B1 10/2020
EP 3060325 B1 10/2020
EP 3131657 B1 10/2020
EP 3139150 B1 10/2020
EP 3169232 B1 10/2020
EP 3169424 B1 10/2020
EP 3273674 B1 10/2020
EP 3344317 B1 10/2020
EP 3399074 B1 10/2020
EP 3545085 A4 10/2020
EP 3727152 A1 10/2020
EP 3727637 A1 10/2020
EP 3727679 A1 10/2020
EP 3727690 A1 10/2020
EP 3728046 A1 10/2020
EP 3728581 A1 10/2020
EP 3728621 A2 10/2020
EP 3728633 A1 10/2020
EP 3729055 A1 10/2020
EP 3729071 A1 10/2020
EP 3729077 A1 10/2020
EP 3729083 A1 10/2020
EP 3729162 A1 10/2020
EP 3729487 A1 10/2020
EP 3729488 A2 10/2020
EP 3730119 A1 10/2020
EP 3730324 A1 10/2020
EP 3730406 A1 10/2020
EP 3730538 A1 10/2020
EP 3730599 A1 10/2020
EP 3730922 A1 10/2020
EP 3730923 A1 10/2020
EP 3730927 A1 10/2020
EP 3731393 A1 10/2020
EP 3749719 A1 12/2020
EP 3788181 A1 3/2021
FR 3095337 A1 10/2020
GB 2108403 A 5/1983
GB 2429428 A 2/2007
GB 2481687 A 1/2012
GB 2490243 A 10/2012
GB 2501803 A 11/2013
GB 2531126 A 4/2016
GB 2549248 A 10/2017
GB 2534477 B 10/2020
GB 2574723 B 10/2020
IL 174122 A 9/2011
IL 239213 A 3/2020
IL 253518 A 6/2020
IL 262854 A 6/2020
JP 2012232870 A 11/2012
JP 2020507460 A 3/2020
JP 2020507462 A 3/2020
JP 2020507466 A 3/2020
JP 2020510522 A 4/2020
JP 6770727 B2 10/2020
JP 6771390 B2 10/2020
JP 6771801 B2 10/2020
JP 6772721 B2 10/2020
JP 6772764 B2 10/2020
JP 6772953 B2 10/2020
JP 6773138 B2 10/2020
JP 6773236 B2 10/2020
JP 2020169857 A 10/2020
JP 2020171429 A 10/2020
JP 2020171482 A 10/2020
JP 2020171483 A 10/2020
JP 2020171484 A 10/2020
JP 2020171882 A 10/2020
JP 2020172518 A 10/2020
JP 2020172703 A 10/2020
JP 2020173192 A 10/2020
JP 2020173427 A 10/2020
JP 2020176195 A 10/2020
JP 2020177669 A 10/2020
JP 2020530329 A 10/2020
JP 2020530909 A 10/2020
JP 2020536764 A 12/2020
KR 960007179 B1 5/1996
KR 20000019936 A 4/2000
KR 20060130959 A 12/2006
KR 20080071942 A 8/2008
KR 20090103323 A 10/2009
KR 20120007817 A 1/2012
KR 20130020869 A 3/2013
KR 20140082838 A 7/2014
KR 101711786 B1 3/2017
KR 20170021957 A 3/2017
KR 101742683 B1 6/2017
KR 20180008427 A 1/2018
KR 20200139842 A 12/2020
KR 20210008523 A 1/2021
KR 102218186 B1 2/2021
KR 20210013582 A 2/2021
TW 202031738 A 9/2020
TW 202039644 A 11/2020
WO 199119982 A1 12/1991
WO 1998017407 A1 4/1998
WO 1999040038 A1 8/1999
WO 199951773 A1 10/1999
WO 200032044 A1 6/2000
WO 200168240 A2 9/2001
WO 2002085250 A2 10/2002
WO 2002085330 A1 10/2002
WO 2003104394 A2 12/2003
WO 2006015982 A2 2/2006
WO 2006121295 A1 11/2006

(56) References Cited

FOREIGN PATENT DOCUMENTS

WO 2007081387 A1 7/2007
WO 2007117191 A1 10/2007
WO 2007117213 A1 10/2007
WO 2007117214 A1 10/2007
WO 2009007150 A2 1/2009
WO 2010009311 A1 1/2010
WO 2010135660 A2 11/2010
WO 2012170549 A1 12/2012
WO 2013064754 A1 5/2013
WO 2014104495 A1 7/2014
WO 2014104573 A1 7/2014
WO 2014164928 A1 10/2014
WO 2015050449 A2 4/2015
WO 2015054652 A2 4/2015
WO 2015134488 A1 9/2015
WO 2016100923 A1 6/2016
WO 2016114850 A1 7/2016
WO 2016125272 A1 8/2016
WO 2016160702 A1 10/2016
WO 2016166816 A1 10/2016
WO 2017040623 A1 3/2017
WO 2017053891 A1 3/2017
WO 2017060991 A1 4/2017
WO 2017072893 A1 5/2017
WO 2017087032 A1 5/2017
WO 2017098758 A1 6/2017
WO 2017143246 A1 8/2017
WO 2017171546 A1 10/2017
WO 2017189357 A2 11/2017
WO 2017210223 A1 12/2017
WO 2018072862 A1 4/2018
WO 2018146318 A1 8/2018
WO 2018202935 A1 11/2018
WO 2019053693 A1 3/2019
WO 2019063482 A1 4/2019
WO 2019101980 A1 5/2019
WO 2019116619 A1 6/2019
WO 2019122100 A1 6/2019
WO 2019126130 A1 6/2019
WO 2019130536 A1 7/2019
WO 2019138705 A1 7/2019
WO 2019150573 A1 8/2019
WO 2019152724 A1 8/2019
WO 2019154758 A1 8/2019
WO 2019155543 A1 8/2019
WO 2019155545 A1 8/2019
WO 2019165297 A1 8/2019
WO 2019168989 A1 9/2019
WO 2019171085 A1 9/2019
WO 2019175441 A1 9/2019
WO 2019176081 A1 9/2019
WO 2019180045 A1 9/2019
WO 2019185607 A1 10/2019
WO 2019186999 A1 10/2019
WO 2019191269 A1 10/2019
WO 2019191587 A2 10/2019
WO 2019193558 A1 10/2019
WO 2019198280 A1 10/2019
WO 2019200306 A1 10/2019
WO 2019212799 A1 11/2019
WO 2019218088 A1 11/2019
WO 2019224201 A1 11/2019
WO 2019224540 A1 11/2019
WO 2019229171 A1 12/2019
WO 2019238469 A1 12/2019
WO 2019241394 A1 12/2019
WO 2020068174 A2 4/2020
WO 2020095566 A1 5/2020
WO 2020104521 A2 5/2020
WO 2020213061 A1 10/2020
WO 2020213101 A1 10/2020
WO 2020213209 A1 10/2020
WO 2020216966 A1 10/2020
WO 2020219451 A1 10/2020
WO 2020219605 A1 10/2020
WO 2020219659 A1 10/2020
WO 2020219667 A1 10/2020
WO 2020219671 A1 10/2020
WO 2020219784 A1 10/2020
WO 2020219869 A1 10/2020
WO 2021019220 A1 2/2021
WO 2021061049 A1 4/2021
WO 2021072245 A1 4/2021

OTHER PUBLICATIONS

Kanavarioti et al. “HPLC methods for purity evaluation of man-made single-stranded RNAs.” Nature. 9(2019): 1019.

Wyndham et al. “Characterization and Evaluation of C18 HPLC Stationary Phases Based on Ethyl-Bridged Hybrid Organic/Inorganic Particles.” Anal. Chem. 75.24(2003): 6781-6788.

“Carboxy-silane triol.” PubChem, Aug. 12, 2023.

“Corrosion Resistant Coating Properties: Extend Product Life, Prevent Contamination.” SilcoTek. 2023.

“Electrical Property Characterization of SilcoTek Coatings.” Retrieved on Jul. 31, 2023.

“High Purity Coatings, the Secret Weapon in Semiconductor Manufacturing.” SilcoTek, Dec. 12, 2014.

“How Corrosion Resistant Is Dursan? Let’s Find Out.” SilcoTek. Jan. 23, 2025.

“How to Identify and Prevent Fouling (HPL)”. SilcoTek. Jun. 22, 2017.

‘Reliable Sampling & Transfer of Sulfur Passivation vs. Inert Coatings.’ SilcoTek. Jun. 16, 2011.

“Silane Coupling Agents: Connecting Across Boundaries.” Gelest, Inc. 2014.

“Solving Surface Fouling with New Non-Stick CVD Coatings.” SilcoTek. Aug. 31, 2017.

“Specialty Coatings.” https://geniefilters.com/news-room/specialty-coatings. Dec. 29, 2013.

“Visit Us at Pittcon: Make Your HPLC System Faster & More Reliable.” SilcoTek. Mar. 3, 2017.

“What’s SilcoTek Talking About at Pittcon 2018.” SilcoTek. Feb. 16, 2018.

Barone et al. “Characterizing the Performance of Surface Modifications that Enhance Sensitivty, Reliability, Reproducibility and Accuracy of Analytical Instruments.” (2011).

Barone et al. “Improving Reliability of Analytical and Sampling Systems in Challenges and Corrosive Environments.” (2011).

Barone. “Corrosion Control and Chemically inert nano-coatings for use in refining, petrochemical and analytical equipment industries.” 2021.

Barone. “Exciting Developments in Silicon Barrier Coatings for Semicon.” SIlcokTek. Jul. 15, 2015.

Bischof. “Achieving PEEK-like Performance on Stainless Steel HPLC Components with Bio-Inert CVD Coatings.” SilcoTek. Feb. 28, 2019.

Brown et al. “Sampling of gaseous sulfur-containing compounds at low concentrations with a review of best-practice methods for biogas and natural gas applications.” Trends Anal. Chem. 64(2015): 42-52.

Buchmeiser. “New synthetic ways for the preparation of high-performance liquid chromatography supports.” J. Chromatogr. A. 918(2001): 233-266.

Colic et al. “Synergistic Application of Chemical and Electromagnetic Water Treatment in Corrosion and Scale Prevention.” Croatia Chem. Acta. 71.4(1998): 905-916.

Conroy. “Nanostructed surfaces for sening heavy metals and radionuclides in aqueous systems.” Doctorate thesis—Philosophy—The University of Leeds. Oct. 2012.

Dursan: An Inert and Corrosion Resistant High Performance CVD Coating. SilcoTek. Retrieved on Jul. 31, 2023.

Dursan® and SilcoNert® 2000 Coating Comparison Guide. (2000).

Dursan® Coating Data Sheet. 2022.

Dursan® Coating Data Sheet. Jun. 1, 2021.

Gosetti et al. “Signal suppression/enhancement in high-performance liquid chromatography tandem mass spectrometry.” J. Chromatogr. A. 1217(2010): 3929-3937.

(56) References Cited

OTHER PUBLICATIONS

Hayes et al. "Core-shell particles: Preparation fundamentals and applications in high performance liquid chromatography." J. Chromatogr. A. 1357(2014): 36-52.
Kong. "Measuring the Electrostatic Repulsion Forces Beween Glycosaminoglycans Using the Atomic Force Microscope." Masters Thesis—Department of Materials Science Engineering at Massachusetts Institute of Technology, Sep. 1999.
Ntrouka et al. "The effect of chemotherapeutic agents on contaminated titanium surfaces: a systematic review." Clin. Oral Impl. Res. 22(2011): 681-690.
Paleologos et al. "Micelle-mediated separation and cloud-point extraction." Trends Anal. Chem. 24.5(2005): 426-436.
Pfaunmiller et al. "Affinity monolith chromatography: A review of principles and recent analytical applications." Anal. Bionanal. Chem. 405.7(2013): 2133-2145.
Pirok et al. "Pratical Approaches to Overcome the Challenges of Comprehensive Two-Dimensional Liquid Chromatography." LCGC Europe. 31.5(2018): 242-249.
Pirok et al. "Recent Developments in Two-Dimensional Liquid Chromatography: Fundamental Improvements for Practical Applications." Anal. Chem. 91.1(2019): 240-263.
Rivera et al. "Bioinert Versus Biocompatible: The Benefits of Different Column Materials in Liquid Chromatography Separations." LCGC Suppl. 36.6(2018).
SilcoTek Coating Properties: A Comprehensive Analysis of Coating Characteristics and Properties. e-book. Retrieved 2023.
SilcoTek Intellectual Property, Patents and Trademarks. Retrieved Jul. 31, 2023.
SilcoTek® Non-Stick CVD Coatings,. Retrieved Jul. 31, 2023.
Technical Program, Agenda of Sessions: Abstract PDF. Pittcon, Atlanta, GA, Mar. 6-10, 2016.
Vaidya et al. "Protein-Resistant Properties of SilcoTek's Dursan® Coating." SilcoTek. (2017).
Waters Quality Parts®, Chromatography Columns and Supplies Catalog. Dec. 2014.
Al-Hamarneh et al. "Synthesis and characterization of di(ethylene glycol) vinyl ether films deposited by atmospheric pressure corona discharge plasma." Surface Coatings Technol. 234(2013):33-41.
Beigbeder et al. "Marine Fouling Release Silicone/Carbon Nanotube Nanocomposite Coatings: On the Importance of the Nanotube Dispersion State." J. Nanosci. Nanotech, 10(2010): 2972-2978.
Biocyl™ X1, Dec. 20, 2018.
Carretier et al. "Design of PVDF/PEGMA-b-PS-b-PEGMA membranes by VIPS for improved biofouling mitigation." J. Membrane Sci. 510(2016):355-369.
Cheong. "Fritting techniques in chromatography." J. Sep. Sci. 37(2014): 603-617.
Dursan® Coating for Improved, Metal-Free Liquid Chromatography. Dec. 20, 2018.
Dursan® Data Sheet 2018.
HPLC Hardware. Möller Medical. (2007).
Hsieh et al. "Effective Enhancement of Fluorescence Detection Efficiency in Protein Microarray Assays: Application of a Highly Fluorinated Organosilane as the Blocking Agent on the Background Surface by a Facile Vapor-Phase Deposition Process." Anal. Chem. 81(2009): 7908-7916.
Kaliaraj et al. "Bio-inspired YSZ coated titanium by EB-PVD for biomedical applications." Surface and Coatings Technol. 307(2016): 227-235.
Lauber et al. "Rapid Preparation of Released N-Glycans for HILIC Analysis Using a Labeling Reagent that Facilitates Sensitive Fluorescence and ESI-MS Detection." Anal Chem. 87.10(2015): 5401-9.
Lecloux et al. "The safe use of carbon nanotubes in coating applications." OECD Conference on Benefits of nanomaterials. Paris, Jul. 15-17, 2009.
NanoCoatings Product Information. Moller Medical. (2010).
Rahimi et al. "Application of copolymer coated frits for solid-phase extraction of poly cyclic aromatic hydrocarbons in water samples." Anal. Chim. Acta. 836(2014): 45-52.
Rosmaninho et al. "Modified stainless steel surfaces targeted to reduce fouling—Evaluation of fouling by milk components." J. Food Engineering. 80(2007): 1176-1187.
Shih et al. "Silanization of Stainless-Steel Frits for Use in Trace Metal Analysis by High Performance Liquid Chromatography." Talanta. 28(1981): 411-414.
Sun et al. "Vapor-based Grafting of Crosslinked Poly(N-vinyl pyrrolidone) Coatings with Tuned Hydrophilicity and Anti-Biofouling Properties." J. Mater. Chem. B. 4(2016): 2669-2678.
Vaidya et al. "Protein-resistant properties of a chemical vapor deposited alkyl-functional carboxysilane coating characterized using quartz crystal microbalance." Appl. Surface Sci. 364(2016): 896-908.
Velox Plus, Dec. 20, 2018.
Xue et al. "Surface-modified anodic aluminum oxide membrane with hydroxyethyl celluloses as a matrix for bilirubin removal." J. Chromatog. B. 912(2013):1-7.
Yang et al. "Synergistic Prevention of Biofouling in Seawater Desalination by Zwitterionic Surfaces and Low-Level Chloronation." Adv. Mater. 26(2014): 1711-1718.

* cited by examiner

19: MRM OF 2 CHANNELS ES-
346.16>97.05 (AMP)
6.87e5
AREA

UNTREATED
SS TUBE AND FRITS 5.16 399; 5.47 1087; 5.56 10152; 5.76 357; 5.84 187; 5.92 332; 6.05 173; 6.18 103; 6.25 123; 6.37 139; 6.50 55; 6.61 26; 6.69 42

97 % -3

5.00 5.10 5.20 5.30 5.40 5.50 5.60 5.70 5.80 5.90 6.00 6.10 6.20 6.30 6.40 6.50 6.60 6.70 6.80 TIME

USE OF VAPOR DEPOSITION COATED FLOW PATHS FOR IMPROVED CHROMATOGRAPHY OF METAL INTERACTING ANALYTES

CROSS REFERENCE TO RELATED APPLICATIONS

This application is a continuation-in-part of U.S. utility application Ser. No. 16/133,089, entitled "Use of Vapor Deposition Coated Flow Paths for Improved Chromatography of Metal Interacting Analytes" filed on Sep. 17, 2018, which claims priority to and benefit of U.S. provisional application No. 62/559,895 filed Sep. 18, 2017 entitled "Use of Vapor Deposition Coated Flow Paths for Improved Chromatography of Biomolecules." The contents of each of the foregoing applications are incorporated herein by reference in their entirety.

FIELD OF THE TECHNOLOGY

This technology relates to the use of a vapor deposition coated frit in a liquid flow path for improved chromatography. More specifically, this technology relates to liquid chromatographic devices for separating analytes in a sample having a single coated frit within the fluidic flow path, methods of separating analytes in a sample (for example, glycans, peptides, pesticides, and citric acid cycle metabolites) using a fluidic system that includes a coated metallic frit within a liquid flow path, and methods of tailoring a liquid flow path for separation of a sample.

BACKGROUND OF THE TECHNOLOGY

Analytes that interact with metal have often proven to be very challenging to separate. The desire to have high pressure capable chromatographic systems with minimal dispersion has required that flow paths decrease in diameter and be able to withstand increasingly high pressures at increasingly fast flow rates. As a result, the material of choice for chromatographic flow paths (including frits, connectors, and other devices within the wetted path) is often metallic in nature. This is despite the fact that characteristics of certain analytes, for example, biomolecules, proteins, glycans, peptides, oligonucleotides, pesticides, bisphosphonic acids, anionic metabolites, and zwitterions like amino acids and neurotransmitters, are known to have unfavorable interactions, so called chromatographic secondary interactions, with metallic surfaces.

The proposed mechanism for metal specific binding interactions requires an understanding of the Lewis theory of acid-base chemistry. Pure metals and metal alloys (along with their corresponding oxide layers) have terminal metal atoms that have characteristics of a Lewis acid. More simply, these metal atoms show a propensity to accept donor electrons. This propensity is even more pronounced with any surface metal ions bearing a positive charge. Analytes with sufficient Lewis base characteristics (any substance that can donate non-bonding electrons) can potentially adsorb to these sites and thus form problematic non-covalent complexes. It is these substances that are defined as metal-interacting analytes.

For example, analytes having phosphate groups are excellent polydentate ligands capable of high affinity metal chelation. This interaction causes phosphorylated species to bind to the flow path metals thus reducing the detected amounts of such species, a particularly troublesome effect given that phosphorylated species are frequently the most important analytes of an assay.

Other characteristics of analytes can likewise pose problems. For example, carboxylate groups also have the ability to chelate to metals, albeit with lower affinities than phosphate groups. Yet, carboxylate functional groups are ubiquitous in, for example, biomolecules, giving the opportunity for cumulative polydentate-based adsorptive losses. These complications can exist not only on peptides and proteins, but also glycans. For example, N-glycan species can at times contain one or more phosphate groups as well as one or more carboxylate containing sialic acid residues. Additionally, smaller biomolecules such as nucleotides and saccharides, like sugar phosphates, can exhibit similar behavior to the previously mentioned N-glycan molecules. Moreover, chromatographic secondary interactions can be especially problematic with biomolecules, particularly larger structures, because they have a capacity (via their size and structural order) to form microenvironments that can adversely interact with separation components and flow path surfaces. In this case, a biomolecule or analyte having larger structures, can present structural regions with chemical properties that amplify a secondary interaction to the material of a flow path. This, combined with the cumulative metal chelation effects curtails the overall effective separation of biomolecules, pesticides, bisphosphonic acids, anionic metabolites, and zwitterions like amino acids and neurotransmitters.

In a chromatographic system, the sample fluidic pathway is often comprised of several components, such as needles, connecting tubing, unions, valves, and chromatographic columns (including, column tubing and porous frit elements). Each of these components contributes surface area with which injected sample can interact as it passes through the system and ultimately into a detector or mass spectrometer. These components are typically made of metal.

An alternative to using metal flow paths is to use flow paths constructed from polymeric materials, such as polyether ether ketone (PEEK). PEEK tubing, like most polymeric materials, is formed by means of an extrusion process. With polymeric resin, this manufacturing process can lead to highly variable internal diameters. Accordingly, PEEK column hardware yields unfavorable differences in the retention times as can be observed from switching between one column and the next. Often, this variation can be a factor of three higher than a metal constructed column. In addition, the techniques for fabricating polymer based frits are not yet sufficiently optimized to afford suitably rugged components for commercial HPLC columns. For example, commercially available PEEK frits tend to exhibit unacceptably low permeability.

Ongoing efforts to reduce chelation and secondary chromatographic interactions of analytes with metal chromatographic surfaces in an effort to facilitate chromatographic separation having higher resolutions are therefore needed.

SUMMARY OF THE TECHNOLOGY

One advantage of the present technology is that metal chromatographic flow paths (e.g., column tubes or channels formed from stainless steel, titanium, such as pure titanium or a titanium alloy) can be used (e.g., preparatory columns, columns with internal diameters greater than 2 mm, such as, 2.1 mm or 4.6 mm, etc.) while minimizing the interactions between analytes and the chromatographic device. A vapor deposited coating on a single frit (e.g., columns typically have two or more frits) can significantly reduce chelation and secondary interactions. In some embodiments, the coated frit is the inlet frit and the outlet frit is uncoated. In other embodiments, the coated frit is the outlet frit and the inlet frit is uncoated. Coating a metallic frit disposed within a chromatographic device with certain organosilica (e.g., alkylsilyl) compositions improves multiple aspects of liquid chromatography separations where the analyte of interest is a metal-interacting analyte. The use of alkylsilyl coatings on metal flow paths (or a portion of the metal flow path that provides high surface area therein) allow the use of metal chromatographic flow paths, which are able to withstand high pressures at fast flow rates, while minimizing the secondary chromatographic interactions between the analyte and the metal. Therefore, high flow through components can be manufactured out of stainless steel or other metallic or high pressure material as a substrate with a coating disposed thereon.

Provided herein, therefore, are methods for isolating analytes comprising the use of vapor depositing one or more alkylsilyl derivatives to at least one component of a fluidic system (e.g., frit used within the liquid chromatographic column) to form a bioinert or low-bind coating, and eluting the analyte through the system. Unlike ambient, liquid phase silanization, coatings of the present technology which are vapor deposited tend to produce, more resilient modifications of substrates with precisely controlled thicknesses. Also, because vapor deposition is a non-line-of-sight process, this leads to a more uniform coating over substrate contours and complex surfaces, such as the complex shapes of a frit. This advantage allows for coatings to be applied to flow paths with narrow internal diameters, curved surfaces, and fine or mesh-like structures, therefore addressing the need for increasingly high pressures at increasingly fast flow rates.

Also provided herein are methods of tailoring a fluidic flow path for separation of a sample comprising an analyte that includes infiltrating a vaporized source of one or more alkylsilyl derivatives through the fluidic flow path to form a bioinert (or low-bind) coating and controlling temperature and pressure to deposit a first coating on wetted surfaces of the flow path.

Also provided are methods of tailoring a fluidic flow path for separation of a sample including an analyte comprising assessing the polarity of the analyte, selecting an appropriate alkylsilyl derivative, and adjusting the hydrophobicity of wetted surfaces of the flow path by vapor depositing the appropriate alkylsilyl derivative to form a bioinert, low-bind coating.

Further provided herein are methods of improving baseline returns in a chromatographic system comprising introducing a sample including an analyte into a fluidic system comprising at least one vapor deposited alkylsilyl derivative to form a bioinert, low-bind coating on just the frits disposed within the fluidic system, and eluting the sample through the system.

The disclosed methods can be applied to stainless steel, titanium (pure or alloy), or other metallic flow path components and provides a manufacturing advantage over alternative non-metallic or non-metallic lined components.

In one aspect, the technology includes a chromatographic column including an uncoated tube (or channel) comprising stainless steel or titanium or both (e.g., stainless steel tube, a titanium tube, a titanium alloy channel, such as a MP35NLT channel, a titanium stabilized alloy such as a 316Ti stainless steel tube). The column also includes a coated frit including a coating, wherein the coated frit is disposed proximate to an end of the uncoated tube. The uncoated tube does not have the coating, and during separation of sample components in the chromatography column, the coating reduces binding of one or more sample components to the coated frit relative to the binding of the one or more sample components to the uncoated tube.

The above aspect can include one or more of the following features. The coated frit can be a tube outlet frit. The coated frit can be a tube inlet frit. In some embodiments, both the tube outlet frit and tube inlet frit are coated. In other embodiments which feature two frits, just the tube inlet frit is coated and the tube outlet frit is uncoated. In certain embodiments, just the tube outlet frit is coated and the tube inlet frit is uncoated. In embodiments, the chromatography column is a preparative liquid chromatography column. In some embodiments, the preparative liquid chromatography column has an internal diameter of 2.1 mm or greater (e.g., 4.7 mm or greater). The coated frit can include an underlying substrate of stainless or titanium. The coating of the coated frit substantially covers the underlying substrate such that the coating is in contact with sample components. The coating can have a contact angle of at least 15° with respect to the underlying substrate. In some embodiments, the coating has a contact angle less than or equal to 30° or less than or equal to 90° to the underlying substrate.

In some embodiments, the uncoated tube (or uncoated channel) has a length to diameter ratio of between 40 and 4. The coating can have a thickness of at least 100 Å.

In certain embodiments, the coating is an organosilica, and in some instances an alkylsilyl. In some embodiments, the alkylsilyl has the structure of Formula I:

(I)

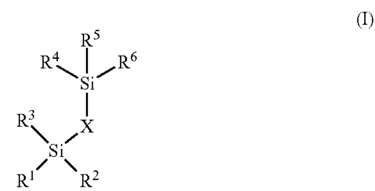

Where at least one of $R^1$, $R^2$, $R^3$, $R^4$, $R^5$, and $R^6$ is $OR^A$. When $R^1$, $R^2$, $R^3$, $R^4$, $R^5$, and $R^6$ are not $OR^A$, then $R^1$, $R^2$, $R^3$, $R^4$, $R^5$, and $R^6$ are each independently selected from $(C_1\text{-}C_6)$alkoxy, $—NH(C_1\text{-}C_6)$alkyl, $—N((C_1\text{-}C_6)\text{alkyl})_2$, OH, and halo. $R^A$ represents a point of attachment to the interior surfaces of the fluidic system. X is $(C_1\text{-}C_{20})$alkyl, $—O[(CH_2)_2O]_{1\text{-}20}—$, $—(C_1\text{-}C_{10})[NH(CO)NH(C_1\text{-}C_{10})]_{1\text{-}20}—$, or $—(C_1\text{-}C_{10})[\text{alkylphenyl}(C_1\text{-}C_{10})\text{alkyl}]_{1\text{-}20}$-. The device can include one or more of the following embodiments in any combination thereof.

In some embodiments, X is $(C_2\text{-}C_{10})$alkyl. In other embodiments, X is ethyl. $R^1$, $R^2$, $R^3$, $R^4$, $R^5$, and $R^6$ can each be methoxy or chloro. In some embodiments, the coating (which is an alkylsilyl coating of Formula I) is formed using a vapor reagent of bis(trichlorosilyl)ethane or bis(trimethoxysilyl)ethane.

In some embodiments, the coating of the chromatographic column includes a primer layer and a top layer. In certain embodiments. The primer layer is an alkylsilyl coating of Formula I. In certain embodiments, the top layer is an alkylsilyl having a structure of Formula II:

(II)

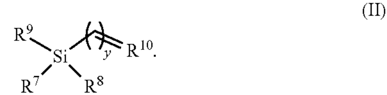

$R^7$, $R^8$, and $R^9$ are each independently selected from —NH$(C_1$-$C_6)$alkyl, —N[$(C_1$-$C_6)$alkyl]$_2$, $(C_1$-$C_6)$alkoxy, $(C_1$-$C_6)$alkyl, $(C_1$-$C_6)$alkenyl, OH, and halo. $R^{10}$ is selected from $(C_1$-$C_6)$alkyl, —$OR^B$, [O$(C_1$-$C_3)$alkyl]$_{1-10}$O$(C_1$-$C_6)$alkyl, —[O$(C_1$-$C_3)$alkyl]$_{1-10}$OH, and phenyl, wherein said $(C_1$-$C_6)$alkyl is optionally substituted with one or more halo and wherein said phenyl is optionally substituted with one or more groups selected from $(C_1$-$C_3)$alkyl, hydroxyl, fluorine, chlorine, bromine, cyano, —C(O)$NH_2$, and carboxyl. $R^B$ is —$(C_1$-$C_3)$alkyloxirane, —$(C_1$-$C_3)$alkyl-3,4-epoxycyclohexyl, or —$(C_1$-$C_4)$alkylOH. The hashed bond to $R^{10}$ represents an optional additional covalent bond between $R^{10}$ and the carbon bridging the silyl group to form an alkene, provided y is not 0. y is an integer from 0 to 20.

In some embodiments, y is an integer from 2 to 9. In some embodiments, is 9, $R^{10}$ is methyl, and $R^7$, $R^8$, and $R^9$ are each ethoxy or chloro.

In some embodiments, in which the top layer is an alkylsilyl of Formula II, a vapor reagent of (3-glycidyloxypropyl)trimethoxysilane, n-decyltrichlorosilane, trimethylchlorosilane, trimethyldimethyaminosilane, methoxy-polyethyleneoxy(1-10) propyl trichlorosilane, or methoxy-polyethyleneoxy(1-10) propyl trimethoxysilane can be used to form the top layer. In some embodiments, a vapor reagent of (3-glycidyloxypropyl)trimethoxysilane followed by hydrolysis is used to form the top layer.

In some embodiments which have a dual layer coating, the vapor reagent used to form the primer layer is bis(trichlorosilyl)ethane or bis(trimethoxysilyl)ethane and the second or different vapor reagent used to form the top layer is (3-glycidyloxypropyl)trimethoxysilane. In some embodiments, the vapor reagent used to form the primer layer is bis(trichlorosilyl)ethane or bis(trimethoxysilyl)ethane and the vapor reagent used to form the top layer is (3-glycidyloxypropyl)trimethoxysilane followed by hydrolysis. In some embodiments, vapor reagent used to form the primer layer is bis(trichlorosilyl)ethane or bis(trimethoxysilyl)ethane and vapor reagent used to form the top layer is n-decyltrichlorosilane. The vapor reagent used to form the primer layer can be bis(trichlorosilyl)ethane or bis(trimethoxysilyl)ethane and the vapor reagent used to form the top layer can be trimethylchlorosilane or trimethyldimethyaminosilane. In some embodiments, the vapor reagent used to form the primer layer is bis(trichlorosilyl)ethane or bis(trimethoxysilyl)ethane and vapor reagent used to form the top layer is methoxy-polyethyleneoxy(3)silane.

The top layer of the coating, in some embodiments, can be an alkylsilyl having the structure Formula III, (III)

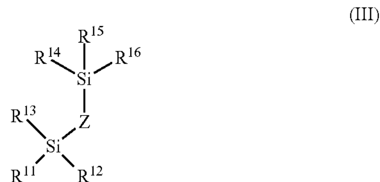

$R^{11}$, $R^{12}$, $R^{13}$, $R^{14}$, $R^{15}$, and $R^{16}$ are each independently selected from $(C_1$-$C_6)$alkoxy, —NH$(C_1$-$C_6)$alkyl, —N($(C_1$-$C_6)$alkyl)$_2$, OH, and halo. Z is $(C_1$-$C_{20})$alkyl, —O[$(CH_2)_2$O]$_{1-20}$—, —$(C_1$-$C_{10})$[NH(CO)NH$(C_1$-$C_{10})$]$_{1-20}$—, or —$(C_1$-$C_{10})$[alkylphenyl$(C_1$-$C_{10})$alkyl]$_{1-20}$-. In some of these embodiments, the top layer is formed using a vapor reagent of bis(trichlorosilyl)ethane or bis(trimethoxysilyl)ethane. The primer layer can be formed of a vapor reagent of bis(trichlorosilyl)ethane or bis(trimethoxysilyl)ethane.

DETAILED DESCRIPTION

Figure 1:
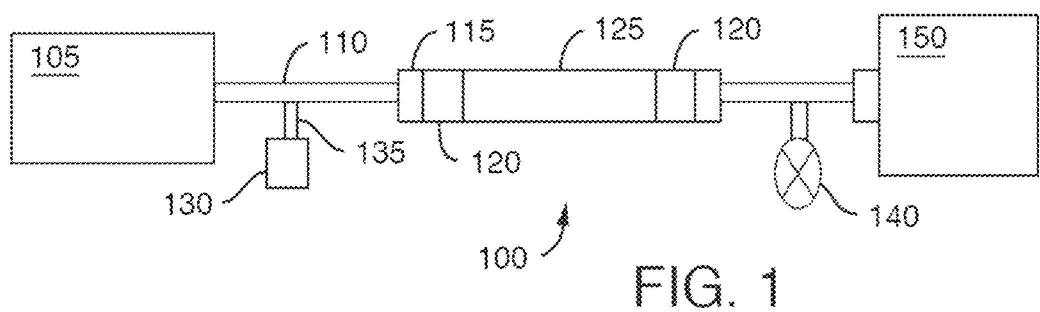
FIG. 1 is a schematic of a chromatographic flow system including a chromatography column and various other components, in accordance with an illustrative embodiment of the technology. A fluid is carried through the chromatographic flow system with a fluidic flow path extending from a fluid manager to a detector.

In general, a number of aspects of the technology are directed to (1) devices having an alkylsilyl coating; (2) methods of tailoring or tuning a liquid flow path for isolation of an analyte, in particular a metal-interacting analyte; (3) method of isolating an analyte in a sample, in particular a metal-interacting analyte; and (4) kits comprising various chromatographic components coated with an alkylsilyl coating and instructions for use. In some aspects, a bioinert, low-bind coating is used to modify a flow path, or at least a portion of the flow path, to address flow path interactions with an analyte. That is, the bioinert, low-bind coating minimizes surface reactions with the metal interacting analyte and allows the analyte to pass along a flow path without clogging, attaching to surfaces, or change in analyte properties. The reduction/elimination of these interactions is advantageous because it allows for accurate quantification and analysis of a sample containing a metal-interacting analyte, for example biomolecules, proteins, glycans, peptides, oligonucleotides, pesticides, bisphosphonic acids, anionic metabolites, and zwitterions like amino acids and neurotransmitters. The biomolecule can be selected from a peptide or peptide fragment, an oligopeptide, a protein, a glycan, a nucleic acid or nucleic acid fragment, a growth factor, a carbohydrate, a fatty acid, and a lipid. In one aspect, the biomolecule is a protein, a peptide, or a glycan. The biomolecule can be a phosphoglycan or a phosphopeptide.

In the present technology, vapor deposited alkylsilyl coatings on wetted surfaces of fluidic systems (e.g., liquid chromatography systems) modify the fluidic path and decrease secondary interactions. In one embodiment, the alkylsilyl coating is vapor deposited on a portion (e.g., 40%, 45, 50%, 55%, 60% or more) of the exposed surface area defining or contributing to the flow path (e.g., column or tubing walls, entire surface area of frits, etc.). As such, the coatings are bioinert or low-bind (meaning that analytes of a sample do not interact, or have minimal interaction, with the alkylsilyl coating). In addition, the deposited coatings are highly tunable to provide a range of desirable contact angles (e.g., make the wetted surfaces hydrophilic or hydrophobic), chemistries, and properties to achieve a desired effect on the flow path and ultimately the sample passing through the flow path.

Due to the generally high surface area nature of frits residing within the interior of a chromatographic column, their contribution to the available surface area in the sample fluidic pathway (fluid contacting surface area) can be substantial (e.g. frit surface area can make up 25% to almost 97% of the fluid contacting surface area of a system). Moreover, sample interaction with frit surfaces is inherently high since the sample is generally distributed over the entire cross-sectional area of the frit and then travels through a complex pathway of micro-channels through the thickness of the frit. By contrast, sample interaction with a column tube wall is limited, as the vast majority of sample travels through the packed bed of stationary phase, avoiding contact with the column walls. Moreover, the amount of available fluid contacting surface area attributable to the frits (i.e., a column interior can have one, two, or multiple frits residing therein) changes with column diameter. For example, for a 2.1 mm UHPLC column for use with a Waters Acquity UPLC system (150 mm column length), the amount of available surface area attributable to the system is calculated to be 20%, attributable to the column tubing is 40%, and attributable to the frits is 40%; for a 4.6 mm UHPLC column (also having 150 mm length) for use on a Waters ARC system, the amount of available surface area attributable to the system is approximately 15%, attributable to the column tubing 20%, and attributable to the frits is 65%; for a 7.8 mm UHPLC column (150 mm column length) for use on a Waters ARC system, the amount of available surface area attributable to the system is approximately 8%, attributable to the column tubing 12%, and attributable to the frits is 80%; and for a 30 mm preparatory column (150 mm length), the amount of available surface area attributable to both the system and column tubing combined is less than 5%, leaving over 95% attributable to the frits. As a result, as the column diameter increases, so does the amount of available fluid contacting surface area attributable to the frits (i.e., from 40% to 65% to 80%, to over 95% in the above example).

While frits can be made from polymeric materials to avoid metal interactions altogether, polymeric frits lack the strength to withstand very high operating pressures and are easily distorted or deformed. Polymeric frits also tend to be less consistent in their flow and permeability properties. Metal frits can be made thinner to reduce surface area, but this also comes at the expense of structural strength. Thin metal frits are susceptible to deformation under high pressure or mechanical force, especially when the column inner diameter is large. Furthermore, very thin frits are in general less capable of holding back fine stationary phase particles, allowing them to escape the column and foul downstream instrument components.

Devices

FIG. 1 is a representative schematic of a chromatographic flow system/device 100 that can be used to separate analytes in a sample. Chromatographic flow system 100 includes several components including a fluid manager system 105 (e.g., controls mobile phase flow through the system), tubing 110 (which could also be replaced or used together with microfabricated fluid conduits), fluid connectors 115 (e.g., fluidic caps), frits 120, a chromatography column 125, a sample injector 135 including a needle (not shown) to insert or inject the sample into the mobile phase, a vial, sinker, or sample reservoir 130 for holding the sample prior to injection, a detector 150 and a pressure regulator 140 for controlling pressure of the flow. Interior surfaces of the components of the chromatographic system/device form a fluidic flow path that has wetted surfaces. The fluidic flow path can have a length to diameter ratio of at least 20, at least 25, at least 30, at least 35 or at least 40.

The detector 150, can be a mass spectrometer. The fluidic flow path can include wetted surfaces of an electrospray needle (not shown).

At least a portion of the wetted surfaces can be coated with an alkyl silyl coating, described in detail herein, to tailor its hydrophobicity. The coating can be applied by vapor deposition. As such, methods and devices of the present technology provide the advantage of being able to use high pressure resistant materials (e.g., stainless steel) for the creation of the flow system, but also being able to tailor the wetted surfaces of the fluidic flow path to provide the appropriate hydrophobicity so deleterious interactions or undesirable chemical effects on the sample can be minimized.

The alkylsilyl coating can be provided throughout the system from the tubing or fluid conduits 110 extending from the fluid manager system 105 all the way through to the detector 150. The coatings can also be applied to portions of the fluidic fluid path. That is, one may choose to coat one or more components or portions of a component and not the entire fluidic path. For example, the internal portions of the column 125 and its frits 120 and end caps 115 can be coated whereas the remainder of the flow path can be left unmodified. Further, removable/replaceable components can be coated. For example, the vial or sinker 130 containing the sample reservoir can be coated as well as frits 120.

In one aspect, the flow path of the fluidic systems described herein is defined at least in part by an interior surface of tubing. In another aspect, the flow path of the fluidic systems described herein is defined at least in part by an interior surface of microfabricated fluid conduits. In another aspect, the flow path of the fluidic systems described herein is defined at least in part by an interior surface of a column. In another aspect, the flow path of the fluidic systems described herein is defined at least in part by passageways through a frit. In another aspect, the flow path of the fluidic systems described herein is defined at least in part by an interior surface of a sample injection needle. In another aspect, the flow path of the fluidic systems described herein extends from the interior surface of a sample injection needle throughout the interior surface of a column. In another aspect, the flow path extends from a sample reservoir container (e.g. sinker) disposed upstream of and in fluidic communication with the interior surface of a sample injection needle throughout the fluidic system to a connector/port to a detector.

In some embodiments, only the wetted surfaces of the chromatographic column and the components located upstream of the chromatographic column are coated with the alkylsilyl coatings described herein while wetted surfaces located downstream of the column are not coated. The coating can be applied to the wetted surfaces via vapor deposition.

In some embodiments, only a portion of the wetted surfaces include the alkylsilyl coating. For example, not all wetted surfaces (i.e., surface area that will be in contact with liquids during use) needs to be coated to tailor a flow path and/or to improve chromatographic results. In some embodiments, 40% or more (e.g., 45%, 50%, 55%, 60%, 65%, 67%, 69%, 70%, 71%, 72%, 73%, 74%, 75%, 77%, 80%, 90% or more) of the surface area defining or contributing to the flow path is coated with an alkylsilyl coating. In certain embodiments, 40% or more of surface area defining or contributing to a metallic flow path (i.e., parts including stainless steel, titanium, titanium alloys, etc.) is coated with an alkylsilyl coating. In some embodiments, 60% or more of the surface area defining or contributing to a metallic flow path is coated with an alkylsilyl coating to provide improved chromatographic results.

In some embodiments, frits 120 contained within the chromatographic column 125 provide the greatest amount of wetted surface area to the flow path. Fluids in the system pass through the frits 120, which have fluid facing and fluid flow through surfaces composed of mesh-like or fine features. As the fluid passes all around these features, the frits 120 contribute greatly to the surface area defining or contributing to the flow path. In particular, systems having two or more frits in short columns (e.g., <150 mm), or columns with large diameters (e.g., >2 mm) tend to have a majority portion (i.e., 51% or more) of the wetted surface area originating just from the frits. For example, for a 4.6 mm by 150 mm column including two frits, approximately 65% of the wetted surface area originates from the two frits. The remaining 35% or less is from the column/tubing walls and the remainder of the system.

In one embodiment, the at least a portion of the wetted surfaces of the fluidic flow path consist of the frits alone.

There are many applications where the highest sensitivity and best analyte recovery are desired. In general, these applications, may include complete or substantially complete coverage (e.g., 93% or more) of metallic surfaces with the alkylsilyl coating. For example, low level drug impurity analysis would likely require a fully coated sample fluidic path to ensure highest possible sensitivity and recovery of analytes. However, there are some embodiments where acceptable performance or improved performance is achieved by applying the vapor deposited coating to the frits alone (i.e., column tubing and connecting tubes and ports are uncoated). Once such embodiment is preparative chromatography, which often utilizes wide (>3 mm, >4 mm, >10 mm) inner diameter columns, and which have very large and thick frits. Another possible embodiment is when the number of frits in the flow path is increased, such as when multiple columns are connected in series or when guard columns are utilized.

In an embodiment, the at least a portion of the wetted surfaces of the fluidic flow path consist of the frits (i.e., column frits 120) and some portion of the column walls and/or tubing upstream of the column. In an embodiment, the at least a portion of the wetted surfaces of the fluidic flow path consist of frits and the sample injector 135. In certain embodiments, the at least a portion of the wetted surfaces of the fluidic flow path consists of frits, the sample injector 135, and the sample reservoir 130. Other components forming or contained within the flow path that are not specifically recited in the foregoing embodiments are not coated (i.e., less than 100% coverage of wetted surfaces, less than 80% coverage of wetted surfaces, less than 75% coverage of wetted surfaces, 65% covered). In some embodiments, just the frits are coated. An exemplary embodiment includes coating just the frits in a preparative column or coating just the frits in a system that includes more than two frits.

At least a portion of the wetted surfaces of the fluidic flow path are coated with an alkylsilyl coating. The alkylsilyl coating is inert to at least one of the analytes in the sample. The alkylsilyl coating can have the Formula I:

(I)

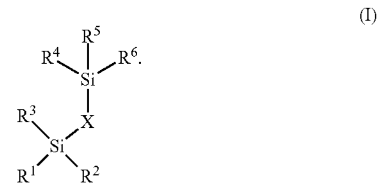

$R^1$, $R^2$, $R^3$, $R^4$, $R^5$, and $R^6$ are each independently selected from $(C_1\text{-}C_6)$alkoxy, —$NH(C_1\text{-}C_6)$alkyl, —$N((C_1\text{-}C_6)$alkyl$)_2$, OH, $OR^A$, and halo (i.e., a halogen, for example chloro). $R^A$ represents a point of attachment to the interior surfaces of the fluidic system. At least one of $R^1$, $R^2$, $R^3$, $R^4$, $R^5$, and $R^6$ is $OR^A$. X is $(C_1\text{-}C_{20})$alkyl, —$O[(CH_2)_2O]_{1\text{-}20}$—, —$(C_1\text{-}C_{10})[NH(CO)NH(C_1\text{-}C_{10})]_{1\text{-}20}$—, or —$(C_1\text{-}C_{10})$[alkylphenyl$(C_1\text{-}C_{10})$alkyl$]_{1\text{-}20}$-.

When used in the context of a chemical formula, a hyphen ("-") indicates the point of attachment. For example, when X is —$[(C_1\text{-}C_{10})$alkylphenyl$(C_1\text{-}C_{10})$alkyl$]_{1\text{-}20}$-, that means that X is connected to $SiR^1R^2R^3$ via the $(C_1\text{-}C_{10})$alkyl and connected to $SiR^4R^5R^6$ via the other $(C_1\text{-}C_{10})$alkyl. This applies to the remaining variables.

In one aspect, X in Formula I is $(C_1\text{-}C_{15})$alkyl, $(C_1\text{-}C_{12})$ alkyl, or $(C_1\text{-}C_{10})$alkyl. In some aspects, X in Formula I is methyl, ethyl, propyl, isopropyl, butyl, sec-butyl, iso-butyl, t-butyl, pentyl, hexyl, heptyl, nonyl, or decanyl. In other aspect, X in Formula I is ethyl or decanyl.

In one aspect, at least one of $R^1$, $R^2$, $R^3$, $R^4$, $R^5$, and $R^6$ is $(C_1\text{-}C_6)$alkoxy, e.g., ethoxy, wherein the values for X are described in Formula I or the preceding paragraph. In another aspect, at least two of $R^1$, $R^2$, $R^3$, $R^4$, $R^5$, and $R^6$ is $(C_1\text{-}C_6)$alkoxy, e.g., ethoxy, wherein the values for X are described in Formula I or the preceding paragraph. In another aspect, at least three of $R^1$, $R^2$, $R^3$, $R^4$, $R^5$, and $R^6$ is $(C_1\text{-}C_6)$alkoxy, e.g., ethoxy, wherein the values for X are described in Formula I or the preceding paragraph. In another aspect, at least four of $R^1$, $R^2$, $R^3$, $R^4$, $R^5$, and $R^6$ is $(C_1\text{-}C_6)$alkoxy, e.g., ethoxy, wherein the values for X are described in Formula I or the preceding paragraph. In another aspect, at least five of $R^1$, $R^2$, $R^3$, $R^4$, $R^5$, and $R^6$ is $(C_1\text{-}C_6)$alkoxy, e.g., ethoxy, wherein the values for X are described in Formula I or the preceding paragraph.

In one aspect, at least one of $R^1$, $R^2$, $R^3$, $R^4$, $R^5$, and $R^6$ is halo, e.g., chloro, wherein the values for X are described in Formula I or the preceding paragraphs above. In another aspect, at least two of $R^1$, $R^2$, $R^3$, $R^4$, $R^5$, and $R^6$ is halo, e.g., chloro, wherein the values for X are described in Formula I or the preceding paragraphs above. In another aspect, at least three of $R^1$, $R^2$, $R^3$, $R^4$, $R^5$, and $R^6$ is halo, e.g., chloro, wherein the values for X are described in Formula I or the preceding paragraphs above. In another aspect, at least four of $R^1$, $R^2$, $R^3$, $R^4$, $R^5$, and $R^6$ is halo, e.g., chloro, wherein the values for X are described in Formula I or the preceding paragraphs above. In another aspect, at least five of $R^1$, $R^2$, $R^3$, $R^4$, $R^5$, and $R^6$ is halo, e.g., chloro, wherein the values for X are described in Formula I or the preceding paragraphs above.

In another aspect, $R^1$, $R^2$, $R^3$, $R^4$, $R^5$, and $R^6$ are each methoxy or chloro.

The alkylsilyl coating of Formula I can have a contact angle of at least about 15°. In some embodiments, the alkylsilyl coating of Formula I can have a contact angle of less than or equal to 30°. The contact angle can be less than or equal to about 90°. In some embodiments, the contact angle of the alkylsilyl coating of Formula I is between about 15 to about 105°. For example, the contact angle of the alkylsilyl coating of Formula I can be about 0°, 5°, 10°, 15°, 20°, 25°, 30°, 35°, 40°, 45°, 50°, 55°, 60°, 65°, 70°, 75°, 80°, 85°, 90°, 95°, 100°, or 105°.

The thickness of the alkylsilyl coating can be at least about 100 Å. For example, the thickness can be between about 100 Å to about 1600 Å. The thickness of the alkylsilyl coating for Formula I can be about 100 Å, 200 Å, 300 Å, 400 Å, 500 Å, 600 Å, 700 Å, 800 Å, 900 Å, 1000 Å, 1100 Å, 1200 Å, 1300 Å, 1400 Å, 1500 Å or 1600 Å. The thickness of the alkylsilyl coating (e.g., a vapor deposited alkylsilyl coating) can be detected optically by the naked eye. For example, more opaqueness and coloration is indicative of a thicker coating. Thus, coatings with pronounced visual distinction are an embodiment of this technology. From thin to thick, the color changes from yellow, to violet, to blue, to slightly greenish and then back to yellow when coated parts are observed under full-spectrum light, such as sunlight. For example, when the alkylsilyl coating is 300 Å thick, the coating can appear yellow and reflect light with a peak wavelength between 560 and 590 nm. When the alkylsilyl coating is 600 Å thick, the coating can appear violet and reflect light with a peak wavelength between 400 and 450 nm. When the alkylsilyl coating is 1000 Å thick, the coating can appear blue and reflect light with a peak wavelength between 450 and 490 nm. See, e.g., Faucheu et al., *Relating Gloss Loss to Topographical Features of a PVDF Coating*, Published Oct. 6, 2004; Bohlin, Erik, *Surface and Porous Structure of Pigment Coatings, Interactions with flexographic ink and effects of print quality*, Dissertation, Karlstad University Studies, 2013:49.

In one aspect, the vapor deposited coating of Formula I is the product of vapor deposited bis(trichlorosilyl)ethane, bis(trimethoxysilyl)ethane, bis(trichlorosilyl)octane, bis (trimethoxysilyl)octane, bis(trimethoxysilyl)hexane, and bis (trichlorosilyl)hexane.

In some aspects, at least a portion of the wetted surfaces of the fluidic flow path are coated with multiple layers of the same or different alkylsilyls, where the thickness of the alkylsilyl coatings correlate with the number of layering steps performed (e.g., the number of deposited layers of alkylsilyl coating on wetted surface of the fluidic flow path of the chromatographic system/device). In this manner, increasingly thick bioinert coatings can be produced and tailored to achieve desirable separations.

The chromatographic device can have a second alkylsilyl coating in direct contact with the alkylsilyl coating of Formula I. The second alkylsilyl coating has the Formula II (II)

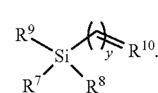

wherein $R^7$, $R^8$, and $R^9$ are each independently selected from —$NH(C_1\text{-}C_6)$alkyl, —$N[(C_1\text{-}C_6)alkyl]_2$, $(C_1\text{-}C_6)$alkoxy, $(C_1\text{-}C_6)$alkyl, $(C_1\text{-}C_6)$alkenyl, OH, and halo; $R^{10}$ is selected from $(C_1\text{-}C_6)$alkyl, —$OR^B$, —$[O(C_1\text{-}C_3)alkyl]_{1\text{-}10}O(C_1\text{-}C_6)$ alkyl, —$[O(C_1\text{-}C_3)alkyl]_{1\text{-}10}OH$ and phenyl. $(C_1\text{-}C_6)$alkyl is optionally substituted with one or more halo. The phenyl is optionally substituted with one or more groups selected from $(C_1\text{-}C_3)$alkyl, hydroxyl, fluorine, chlorine, bromine, cyano, —$C(O)NH_2$, and carboxyl. $R^B$ is —$(C_1\text{-}C_3)$alkyloxirane, —$(C_1\text{-}C_3)$alkyl-3,4-epoxycyclohexyl, or —$(C_1\text{-}C_4)$alkylOH. The hashed bond to $R^{10}$ represents an optional additional covalent bond between $R^{10}$ and the carbon bridging the silyl group to form an alkene, provided y is not 0. y is an integer from 0 to 20.

In one aspect, y in Formula II is an integer from 1 to 15. In another aspect, y in Formula II is an integer from 1 to 12. In another aspect, y in Formula II is an integer from 1 to 10. In another aspect, y in Formula II is an integer from 2 to 9.

In one aspect $R^{10}$ in Formula II is methyl and y is as described above for Formula II or the preceding paragraph.

In one aspect, $R^7$, $R^8$, and $R^9$ in Formula II are each the same, wherein $R^{10}$ and y are as described above. In one aspect, $R^7$, $R^8$, and $R^9$ are each halo (e.g., chloro) or $(C_1\text{-}C_6)$alkoxy such as methoxy, wherein $R^{10}$ and y are as described above.

In one aspect, y in Formula II is 9, $R^{10}$ is methyl, and $R^7$, $R^8$, and $R^9$ are each ethoxy or chloro.

In one aspect, the coating of the formula II is n-decyltrichlorosilane, (3-glycidyloxypropyl)trimethoxysilane (GPTMS), (3-glycidyloxypropyl)trimethoxysilane (GPTMS) followed by hydrolysis, 2-(3,4-epoxycyclohexyl) ethyltrimethoxysilane, trimethylchlorosilane, trimethyldimethyaminosilane, methoxy-polyethyleneoxy(3)silane propyltrichlorosilane, propyltrimethoxysilane, (heptadecafluoro-1,1,2,2-tetrahydrodecyl)tris(dimethylamino)silane, (heptadecafluoro-1,1,2,2-tetrahydrodecyl)trischlorosilane, (heptadecafluoro-1,1,2,2-tetrahydrodecyl)trimethoxysilane vinyltrichlorosilane, vinyltrimethoxysilane, allyltrichlorosilane, 2-[methoxy(polyethyleneoxy)3propyl]trichlorosilane, 2-[methoxy(polyethyleneoxy)3propyl]trimethoxysilane, or 2-[methoxy(polyethyleneoxy)3propyl]tris(dimethylamino)silane.

The alkylsilyl coating of Formula I and II can have a contact angle of at least about 15°. In some embodiments, the alkylsilyl coating of Formula I and II can have a contact angle of less than or equal to 105°. The contact angle can be less than or equal to about 90°. In some embodiments, the contact angle of the alkylsilyl coating of Formula I and II is between about 15 to about 105°. For example, the contact angle of the alkylsilyl coating of Formula I and II can be about 0°, 5°, 10°, 15°, 20°, 25°, 30°, 35°, 40°, 45°, 50°, 55°, 60°, 65°, 70°, 75°, 80°, 85°, 90°, 95°, 100°, or 105°.

The thickness of the multi-layered alkylsilyl coating can be at least about 100 Å. For example, the thickness can be between about 100 Å to about 1600 Å. The thickness of the multi-layered alkylsilyl coating for Formula I can be about 100 Å, 200 Å, 300 Å, 400 Å, 500 Å, 600 Å, 700 Å, 800 Å, 900 Å, 1000 Å, 1100 Å, 1200 Å, 1300 Å, 1400 Å, 1500 Å or 1600 Å.

In one aspect, the alkylsilyl coating of Formula I is bis(trichlorosilyl)ethane or bis(trimethoxysilyl)ethane and the alkylsilyl coating of Formula II is (3-glycidyloxypropyl)trimethoxysilane. In another aspect, the alkylsilyl coating of Formula I is bis(trichlorosilyl)ethane or bis(trimethoxysilyl)ethane and the alkylsilyl coating of Formula II is (3-glycidyloxypropyl)trimethoxysilane followed by hydrolysis. In one aspect, the alkylsilyl coating of Formula I is bis(trichlorosilyl)ethane or bis(trimethoxysilyl)ethane and the alkylsilyl coating of Formula II is n-decyltrichlorosilane. The alkylsilyl coating of Formula I can be bis(trichlorosilyl)ethane or bis(trimethoxysilyl)ethane and the alkylsilyl coating of Formula II can be trimethylchlorosilane or trimethyldimethyaminosilane. In one aspect, the alkylsilyl coating of Formula I is bis(trichlorosilyl)ethane or bis(trimethoxysilyl)ethane and the alkylsilyl coating of Formula II is methoxy-polyethyleneoxy(3) propyl tricholorosilane or methoxy-polyethyleneoxy(3) propyl trimethoxysilane.

The chromatographic device can have an alkylsilyl coating in direct contact with the alkylsilyl coating of Formula III in direct contact with the alkylsilyl coating of Formula I.

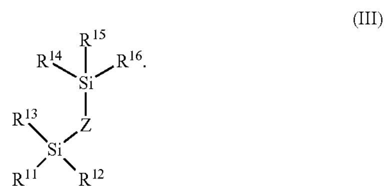

(III)

$R^{11}$, $R^{12}$, $R^{13}$, $R^{14}$, $R^{15}$, and $R^{16}$ are each independently selected from $(C_1-C_6)$alkoxy, —NH$(C_1-C_6)$alkyl, —N($(C_1-C_6)$alkyl$)_2$, OH, and halo (i.e., a halogen, for example, chloro). Z is $(C_1-C_{20})$alkyl, —O$[(CH_2)_2O]_{1-20}$—, —$(C_1-C_{10})$[NH(CO)NH$(C_1-C_{10})]_{1-20}$—, or —$(C_1-C_{10})$[alkylphenyl$(C_1-C_{10})$alkyl$]_{1-20}$-.

In some aspects, Z in Formula III is $(C_1-C_{10})$alkyl; and $R^1$, $R^2$, $R^3$, $R^4$, $R^5$, and $R^6$ are each methoxy or chloro. In other aspects, Z in Formula III is $(C_2-C_{10})$alkyl. In other aspects, Z in Formula III is ethyl.

In the layered alkylsilyl coating of Formula I and Formula III, Formula I and Formula III can be the same (for example, $C_2C_2$) or Formula I and Formula III can be different. Formula III is attached directly to the coating of Formula I, i.e., in Formula III, there is no point of attachment to the interior of the fluidic system; instead Formula III is deposited directly on Formula I.

The alkylsilyl coating of Formula III can be bis(trichlorosilyl)ethane or bis(trimethoxysilyl)ethane. The alkylsilyl coating of Formula I can be bis(trichlorosilyl)ethane or bis(trimethoxysilyl)ethane and the alkylsilyl coating of Formula III can be bis(trichlorosilyl)ethane or bis(trimethoxysilyl)ethane.

The alkylsilyl coating of Formula I and III can have a contact angle of at least about 15°. In some embodiments, the alkylsilyl coating of Formula I and III can have a contact angle of less than or equal to 105°. The contact angle can be less than or equal to about 90°. In some embodiments, the contact angle of the alkylsilyl coating of Formula I and III is between about 15 to about 105°.

For example, the contact angle of the alkylsilyl coating of Formula I and III can be about 0°, 5°, 10°, 15°, 20°, 25°, 30°, 35°, 40°, 45°, 50°, 55°, 60°, 65°, 70°, 75°, 80°, 85°, 90°, 95°, 100°, or 105°.

The thickness of the multi-layered alkylsilyl coating can be at least about 100 Å. For example the thickness can be between about 100 Å to about 1600 Å. The thickness of the multi-layered alkylsilyl coating for Formula I can be about 100 Å, 200 Å, 300 Å, 400 Å, 500 Å, 600 Å, 700 Å, 800 Å, 900 Å, 1000 Å, 1100 Å, 1200 Å, 1300 Å, 1400 Å, 1500 Å or 1600 Å.

In one aspect, the alkylsilyl coating of Formula II is applied directly to wetted surfaces of the fluidic flow path. Therefore, in some embodiments, one of $R^7$, $R^8$, and $R^9$ of Formula II can also include $OR^A$, where $R^A$ represents a point of attachment to the interior surfaces (e.g., wetted surfaces) of the fluidic system. In other embodiments, $R^7$, $R^8$, and $R^9$ of the alkylsilyl coating of Formula II does not include $OR^A$, by the alkylsilyl coating of Formula II is deposited directly onto wetted surfaces of the fluidic flow path that have been pre-treated with, for example, a plasma.

In one aspect, stainless steel flow path components, including but not limited to tubing, microfabricated fluid conduits, column frits, column inlet tubing, and sample injection needles, are coated via vapor deposition with one or more of the disclosed alkylsilyls. In one aspect, these coated components are annealed to alter their chemical or physical properties.

In another aspect, flow path components that are made of other materials than stainless steel or other metallics, (e.g., polymers, glass, etc.) are coated via vapor deposition with one or more of the disclosed alkylsilyls. In particular, frits for use within the system or sample vials connectable to the injection needle are coated.

In yet a further aspect, metallic flow path components, such as the frits, are coated with two layers. A primer layer, or layer in direct contact with the metal substrate (i.e., metallic frit) is an alkylsilyl coating that is vapor deposited, such as, for example, an alkylsilyl coating having Formula I. The second or top layer is deposited on top of or in contact with the primer layer. The top layer can be a second layer of the primer layer or, in some embodiments, formed of a different material (e.g., Formula II).

Exemplary coatings with their respective approximate thickness and contact angle are provided in Table 1.

TABLE 1

| VPD# | Vapor Deposited Material | Alternative Coating Abbreviation | Approximate Thickness of Product | Approximate Contact Angle |
|---|---|---|---|---|
| 1 | bis(trichlorosilyl)ethane or bis(trismethoxysilyl)ethane as a first layer followed by GPTMS followed by hydrolysis to form GPTMS—OH | $C_2$—GPTMS—OH | 500 Å | 15° |
| 2 | bis(trichlorosilyl)ethane or bis(trimethoxysilyl)ethane | $C_2$ | 500 Å | 35° |
| 3 | bis(trichlorosilyl)ethane or bis(trimethoxysilyl)ethane as a first layer followed by bis(trichlorosilyl)ethane or bis(trimethoxysilyl)ethane as a second layer. | $C_2$—$C_2$ | 1600 Å | 35° |
| 4 | bis(trichlorosilyl)ethane or bis(trimethoxysilyl)ethane as a first layer followed by GPTMS as a second layer | $C_2$—GPTMS | 500 Å | 50° |
| 5 | Annealed bis(trichlorosilyl)ethane or bis(trimethoxysilyl)ethane | Annealed $C_2$ | 500 Å | 95° |
| 6 | Annealed bis(trichlorosilyl)ethane or bis(trimethoxysilyl)ethane as a first layer followed by annealed bis(trichlorosilyl)ethane or bis(trimethoxysilyl)ethane as a second layer | Annealed $C_2$—$C_2$ | 1600 Å | 95° |
| 7 | bis(trichlorosilyl)ethane or bis(trimethoxysilyl)ethane as a first layer followed by n-decyltrichlorosilane as a second layer | $C_2C_{10}$ | 500 Å | 105° |
| 8 | Annealed bis(trichlorosilyl)ethane or bis(trimethoxysilyl)ethane as a first layer followed by annealed n-decyltrichlorosilane as a second layer | Annealed $C_2C_{10}$ | 500 Å | 105° |
| 9 | GPTMS | GPTMS | 100 to 200 Å | ~50° |
| 10 | GPTMS followed by hydrolysis to form GPTMS—OH | GPTMS—OH | 100 to 200 Å | ~20° |
| 11 | bis(trichlorosilyl)ethane or bis(trimethoxysilyl)ethane as a first layer followed by trimethylchlorosilane or trimethyldimethylaminosilane | $C_2C_3$ | 500 Å | 40-90° |
| 12 | annealed bis(trichlorosilyl)ethane or bis(trimethoxysilyl)ethane as a first layer followed by trimethylchlorosilane or trimethyldimethylaminosilane | Annealed $C_2C_3$ | 500 Å | 95° |
| 13 | bis(trichlorosilyl)ethane or bis(trimethoxysilyl)ethane as a first layer followed by a methoxy-polyethyleneoxy(3) propyl trichlorosilane or methoxy-polyethyleneoxy(3) propyl trimethoxysilane | $C_2$PEO | 500 Å | 15° |

Referring to VPD #1 ($C_2$-GPTMS-OH), the first coating layer, $C_2$ shown below, is a layer according to Formula I, described above.

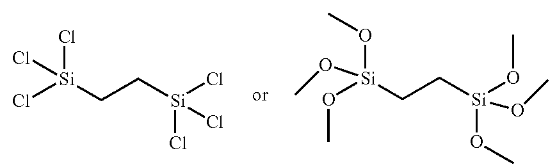

Structure of bis(trichlorosilyl)ethane or bis(trismethoxysilyl)ethane ($C_2$)

The second layer of VPD #1, GPTMS-OH, shown below, is a layer according to Formula II.

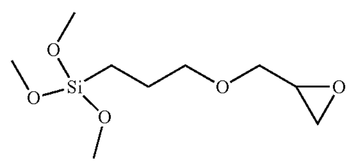

Structure of GPTMS-OH

VPD #3 ($C_2$-$C_2$) is an example of a coating of Formula I and then a coating for Formula III.

VPD #7 ($C_2C_{10}$) is another example of a coating of Formula I and a second layer of Formula II. The structure of bis(trichlorosilyl)ethane or bis(trismethoxysilyl)ethane ($C_2$) is shown above. The structure of $C_{10}$ is shown below.

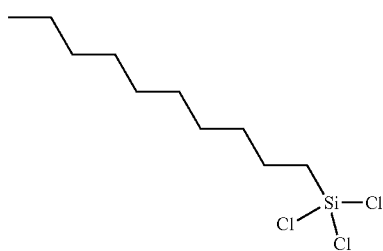

Structure of n-decyltrichlorosilane ($C_{10}$)

VPD #11 ($C_2C_3$) is another example of a coating of Formula I and a second layer of Formula II. The structure of bis(trichlorosilyl)ethane or bis(trismethoxysilyl)ethane ($C_2$) is shown above. The structure of $C_3$ is shown below.

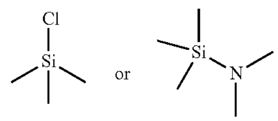

Structure of trimethylchlorosilane or trimethyldimethylaminosilane ($C_3$)

VPD #13 is another example of a coating of Formula I and a second layer of Formula II. The structure of bis(trichlorosilyl)ethane or bis(trismethoxysilyl)ethane ($C_2$) is shown above. The structure of methoxy-polyethyleneoxy(3)propyl trichlorosilane (PEO) is shown below.

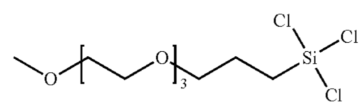

Structure of methoxy-polyethyleneoxy(3)propyl trichlorosilane (PEO)

Alternatively, commercially available vapor deposition coatings can be used in the disclosed systems, devices, and methods, including but not limited to Dursan® (commercially available from SilcoTek Corporation, Bellefonte, Pa.).

In one aspect, the alkylsilyl coatings described herein enhance the corrosion performance of metals, e.g., as in metallic chromatography columns. Depending on the denseness and thickness, the coatings act as a barrier, thereby preventing water and corrosive molecules from reacting with the base metal. While increasing the hydrophobicity and density improves the corrosion performance, even coatings derived from $C_2$ and GPTMS ($C_2$-GPTMS) followed by hydrolysis to form $C_2$-GPTMS-OH shows a 10× improvement in the ASTM G48 Method A pitting corrosion, see e.g., Example 4 below. In terms of most corrosion resistant to least, the ranking is the material formed from VPD #7>2>1 (bis(trichlorosilyl)ethane or bis(trimethoxysilyl)ethane as a first layer followed by GPTMS then hydrolysis to form GPTMS-OH as a second layer). This also correlates to hydrophobicity rankings.

Methods of Tailoring a Fluidic Flow Path

The coatings described above can be used to tailor a fluidic flow path of a chromatography system for the separation of a sample. The coatings can be vapor deposited. In general, the deposited coatings can be used to adjust the hydrophobicity of internal surfaces of the fluidic flow path that come into contact with a fluid (i.e. wetted surfaces or surfaces coming into contact with the mobile phase and/or sample/analyte). By coating wetted surfaces of one or more components of a flow path within a chromatography system, a user can tailor the wetted surfaces to provide a desired interaction (or lack of interaction) between the flow path and fluids therein (including any sample, such as biomolecules, proteins, glycans, peptides, oligonucleotides, pesticides, bisphosphonic acids, anionic metabolites, and zwitterions like amino acids and neurotransmitters, within the fluid).

In one aspect, an effective coating is produced from a low temperature, vacuum-assisted vapor deposition process. In one aspect, an oxygen plasma pretreatment step precedes the coating deposition. The oxygen plasma removes organic compounds and improves surface wettability for the coatings. Time, temperature, and pressure are controlled for each processing step. Each coating run can use a silicon wafer to monitor the thickness and contact angle of the resultant coating. Ellipsometry can be used to measure the coating thickness, and an optical goniometer can be used to measure the contact angle of the coating. A post coating annealing step can be utilized to increase coating cross-linking and increase coating hydrophobicity.

Figure 2:
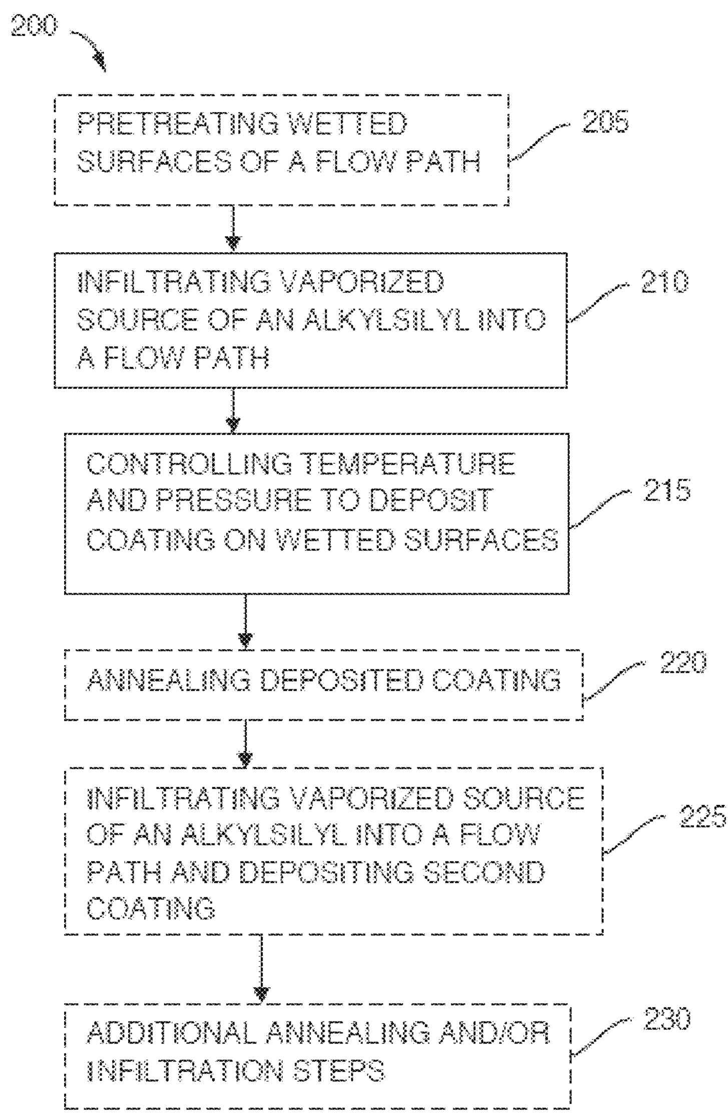
FIG. 2 is a flow chart showing a method of tailoring wetted surfaces of a flow path, in accordance with an illustrative embodiment of the technology.

FIG. 2 is a flow chart illustrating method 200 for tailoring a fluidic flow path for separation of a sample including biomolecules, proteins, glycans, peptides, oligonucleotides, pesticides, bisphosphonic acids, anionic metabolites, and zwitterions like amino acids and neurotransmitters. The method has certain steps which are optional as indicated by the dashed outline surrounding a particular step. Method 200 can start with a pretreatment step (205) for cleaning and/or preparing a flow path within a component for tailoring. Pretreatment step 205 can include cleaning the flow path with plasma, such as oxygen plasma. This pretreatment step is optional.

Next, an infiltration step (210) is initiated. A vaporized source of an alkylsilyl compound (e.g., the alkylsilyl compounds of Formulas I, II and/or III) is infiltrated into the flow path. The vaporized source is free to travel throughout and along the internal surfaces of the flow path. Temperature and/or pressure is controlled during infiltration such that the vaporized source is allowed to permeate throughout the internal flow path and to deposit a coating from the vaporized source on the exposed surface (e.g., wetted surfaces) of the flow path as shown in step 215.

Additional steps can be taken to further tailor the flow path. For example, after the coating is deposited, it can be heat treated or annealed (step 220) to create cross linking within the deposited coating and/or to adjust the contact angle or hydrophobicity of the coating. Additionally or alternatively, a second coating of alkylsilyl compound (having the same or different form) can be deposited by infiltrating a vaporized source into the flow path and depositing a second or additional layers in contact with the first deposited layer as shown in step 225. After the deposition of each coating layer, an annealing step can occur. Numerous infiltration and annealing steps can be provided to tailor the flow path accordingly (step 230).

In some embodiments, not the entirety of the flow path is coated. For example, in some embodiments, just one or more frits used within the chromatography column is coated. In this embodiment, the frit can be coated using vapor deposition prior to placement within a column.

Figure 3:
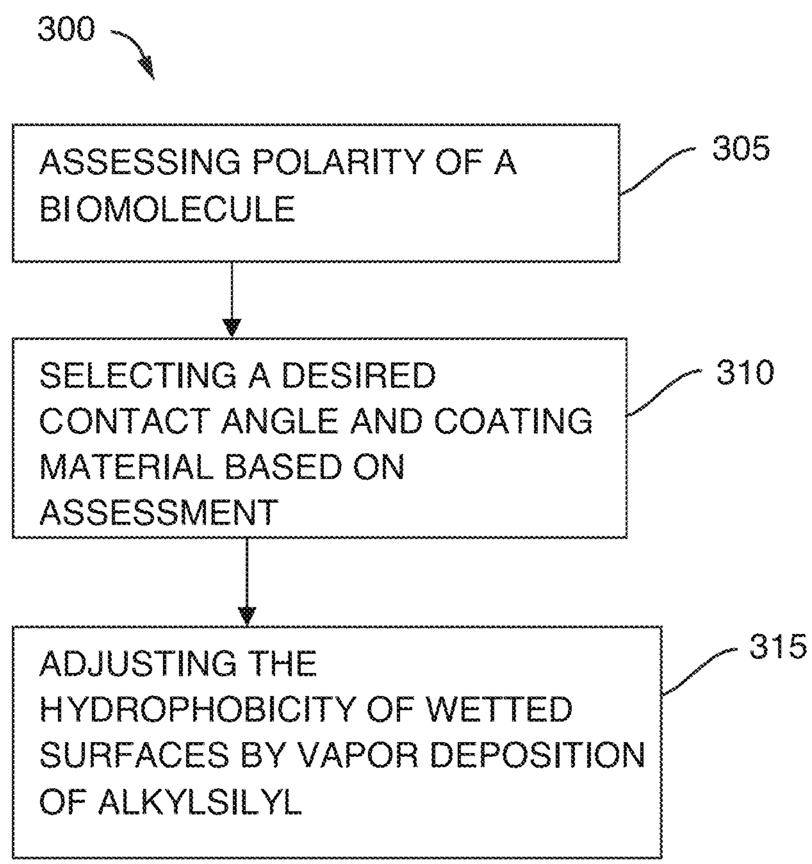
FIG. 3 is a flow chart showing a method of tailoring a fluidic flow path for separation of a sample including a biomolecule, in accordance with an illustrative embodiment of the technology.

FIG. 3 provides a flow chart illustrating a method (300) of tailoring a fluidic flow path for separation of a sample including a biomolecule or a metal interacting analyte. The method can be used to tailor a flow system for use in isolating, separating, and/or analyzing the biomolecule or metal interacting analyte. In step 305, the analyte is assessed to determine its polarity. Understanding the polarity will allow an operator to select (by either look up table or make a determination) a desired coating chemistry and, optionally, contact angle as shown in step 310. In some embodiments, in addition to assessing the polarity of the biomolecule or metal interacting analyte, the polarity of a stationary phase to be used to separate the biomolecule or metal interacting analyte (e.g., stationary phase to be included in at least a portion of the fluidic flow path) is also assessed. A chromatographic media can be selected based on the analyte in the sample. Understanding the polarity of both the analyte and the stationary phase is used in certain embodiments, by the operator to select the desired coating chemistry and contact angle in step 310. The components to be tailored can then be positioned within a chemical infiltration system with environmental control (e.g., pressure, atmosphere, temperature, etc.) and precursor materials are infiltrated into the flow path of the component to deposit one or more coatings along the wetted surfaces to adjust the hydrophobicity as shown in step 315. During any one of infiltration, deposition, and condition steps (e.g. annealing), coatings deposited from the infiltration system can be monitored and if necessary precursors and or depositing conditions can be adjusted if required allowing for fine tuning of coating properties. The alkylsilyl coating material selected in step 310 can be the alkylsilyl compounds of Formulas I, II and/or III.

A method of tailoring a fluidic flow path for separation of a sample is provided that includes assessing a polarity of an analyte in the sample and selecting a chromatographic media based on the analyte in the sample. An alkylsilyl coating is selected based on the polarity of the analyte in the sample. The alkylsilyl coating is selected so that the coating is inert to the analyte(s) being separated. In other words, the alkylsilyl coating does not produce any secondary chromatographic effects that are attributable to the alkylsilyl coating. In some embodiments, the analyte is a biomolecule. The biomolecule can be a peptide or peptide fragment, an oligopeptide, a protein, a glycan, a nucleic acid or nucleic acid fragment, a growth factor, a carbohydrate, a fatty acid or a lipid. The analyte can be a citric acid cycle metabolite. The analyte can be a pesticide.

The alkylsilyl coating can have the Formula I, II, or III as described above. In one embodiment, the alkylsilyl coating has the Formula I as a first layer and Formula II as a second layer. In some embodiments, there is only a single layer coating having Formula I (e.g., bis(trichlorosilyl)ethane or bis(trimethoxysilyl)eithane). In some embodiments, there is only a single layer coating having Formula II (e.g., (3-glycidyloxypropyl)trimethoxysilane, n-decyltrichlorosilane, trimethylchlorosilane, trimethyldimethyaminosilane, or methoxy-polyethyleneoxy(3)silane). In some embodiments, there is only a single layer coating having Formula III (e.g., bis(trichlorosilyl)ethane or bis(trimethoxysilyl)eithane).

The method also includes adjusting a hydrophobicity of the wetted surfaces of the fluidic flow path by vapor depositing the alkylsilyl coating onto the wetted surfaces of the fluidic flow path. In some embodiments, the hydrophobicity of the wetted surfaces is adjusted by adjusting the contact angle of the alkylsilyl coating. For example, the contact angle of the alkylsilyl coating can be between about 0° to about 105°.

The analyte in the sample can be retained with a retentivity within 10% of the retentivity attributable to the chromatography media. In some embodiments, the sample can be retained with a retentivity within 5% or within 1% of the retentivity attributable to the chromatography media. Therefore, the alkylsilyl coating solves the problem of metal interaction between the analyte and the metal chromatographic materials without introducing any secondary reactions that would have a negative effect on the quality of the separation. The alkylsilyl coating does not impart any retention mechanism on the analyte of interest, making the coating inert to the analyte of interest and low-bind.

In addition, the alkylsilyl coating does not produce any changes to peak width. The analyte in the sample has a peak width that is within 10%, 5%, or 1% of the peak width attributable to the chromatographic media.

The wetted surfaces of the fluidic flow path can be any of those described above with respect to aspects and embodiments of the chromatographic device.

The method can also include annealing the alkylsilyl coating after vapor depositing the alkylsilyl coating on the wetted surfaces of the fluidic flow path. Typically, the annealing cycle involves subjecting the coating to 200° C. for 3 hours under vacuum.

The method can also include assessing the polarity of the chromatographic media and selecting the alkylsilyl coating based on the polarity of the analyte and the chromatographic media. The method can also include eluting the sample through the fluidic flow path, thereby isolating the analyte.

In some embodiments, the alkylsilyl coating is modified with a silanizing reagent to obtain a desired thickness of the alkylsilyl coating. The silanizing reagent can be a non-volatile zwitterion. The non-volatile zwitterion can be sulfobetaine or carboxybetaine. In some embodiments, the silanizing reagent is an acidic or basic silane. The silanizing reagent can introduce polyethylene oxide moieties, such as methoxy-polyethyleneoxy(6-9)silane, the structure of which is shown below.

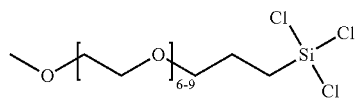

Structure of methoxy-polyethyleneoxy(6-9)silane

In some aspects, the method of tailoring a fluidic flow path for separation of a sample including a biomolecule further comprises: pretreating the wetted surfaces of the flow path with a plasma prior to depositing the first coating. In other aspects, the method of tailoring a fluidic flow path for separation of a sample including a metal interacting analyte further comprises annealing the first coating at a temperature to increase cross-linking in the first coating. In yet another aspect, the method of tailoring a fluidic flow path for separation of a sample including a metal interacting analyte further comprises annealing the first coating at a temperature to alter hydrophobicity.

In one aspect, the method of tailoring a fluidic flow path for separation of a sample including a metal interacting analyte further comprises performing a second infiltration with a vaporized source having the Formula II, wherein the features for Formula II are as described above; along and throughout the interior flow path of the fluidic system to form a second coating deposited in direct contact with the first coating. In one aspect, the step of performing a second infiltration in the preceding method further comprises performing an annealing step after depositing the second coating. In another aspect, the preceding method further comprises connecting in fluid communication with the flow path at least one coated component selected from the group consisting of a sample reservoir container and a frit.

Also provided herein is a method of tailoring a fluidic flow path for separation of a sample including a metal interacting analyte, the method comprising: assessing polarity of the analyte in the sample; selecting an alkylsilyl coating having the Formula I, wherein the features for Formula I are as described above, and desired contact angle based on polarity assessment; and adjusting the hydrophobicity of wetted surfaces of the flow path by vapor depositing an alkylsilyl having the Formula III, wherein the features for Formula III are as described above, and providing the desired contact angle. In some embodiments of the above method, in addition to assessing polarity of the analyte in the sample, the polarity of a stationary phase disposed within at least a portion of the flow path is also assessed and the polarity assessment is obtained from both the polarity of the biomolecule in the sample and the stationary phase.

Methods of Isolating an Analyte

In one aspect, provided herein are methods of isolating an analyte. The method includes introducing a sample including a glycan, a peptide, a pesticide, or a citric acid cycle metabolite into a fluidic system including a flow path disposed in an interior of the fluidic system. The flow path includes a first vapor deposited alkylsilyl inert coating having the Formula I described above and a second vapor deposited coating of the Formula II described above. The sample is eluted through the fluidic system, thereby isolating the glycan, peptide, pesticide, or citric acid cycle metabolite.

The glycan can be a phosphoglycan. The peptide can be a phosphopeptide and the pesticide can be glyphosate. The citric acid cycle metabolite can be citric acid or malic acid.

When the analyte is a glycan, peptide or pesticide, the alkylsilyl coating of Formula I can be bis(trichlorosilyl) ethane or bis(trimethoxysilyl)ethane and the alkylsilyl coating of Formula II can be n-decyltrichlorosilane. When the analyte is a citric acid cycle metabolite, the alkylsilyl coating of Formula I can be bis(trichlorosilyl)ethane or bis (trimethoxysilyl)ethane and the alkylsilyl coating of Formula II can be trimethylchlorosilane or trimethyldimethyaminosilane.

The flow path can be defined at least in part by the interior surface of a chromatographic system. The flow path can be further defined at least in part by passageways through a frit of the chromatographic column. The flow path can be defined at least in part by interior surfaces of tubing. The flow path can be any flow path described herein, for example, the flow paths described with respect to the chromatographic device.

Methods of Improving Baseline Returns

Also provided herein is a method of improving baseline returns in a chromatographic system, the method comprising: introducing a sample including an analyte into a fluidic system including a flow path disposed in an interior of the fluidic system, the flow path having a length to diameter ratio of at least 20 and comprising a vapor deposited alkylsilyl coating having the Formula I, wherein the features for Formula I are as described above, a thickness of at least 100 angstroms and a contact angle of about 30 degrees to 110 degrees; and eluting the sample through the fluidic system, thereby isolating the biomolecule. In some embodiments, the method includes a second layer of Formula II or Formula III, wherein the features of Formula II and II are described above.

Kits

Also provided here are kits. The kits include chromatographic components, for example, a chromatographic column, that has been coated with an alkylsilyl coating of Formulas I, II, and/or III, as described above. In addition to including the alkylsilyl coating of Formulas I, II, and/or III as a primer layer, the chromatographic component (i.e., frit) can include a second layer deposited on the top of the primer layer. The second layer can be a second alkylsilyl coating (e.g., Formula I, Formula II or Formula III). Other components can be provided in the kit that can also include the coatings described herein, for example, the tubing, frits, and/or connectors. In one embodiment, only a single frit (i.e., inlet frit or the outlet frit) is coated and the remainder of the flow path is uncoated (i.e., uncoated surfaces can directly expose the analyte and the flow path to metal). The kit can also include instructions for separating analytes, for example, biomolecules, proteins, glycans, peptides, oligonucleotides, pesticides, bisphosphonic acids, anionic metabolites, and zwitterions like amino acids and neurotransmitters.

Exemplary Separations

Separation of Phosphoglygans

Figure 4A:
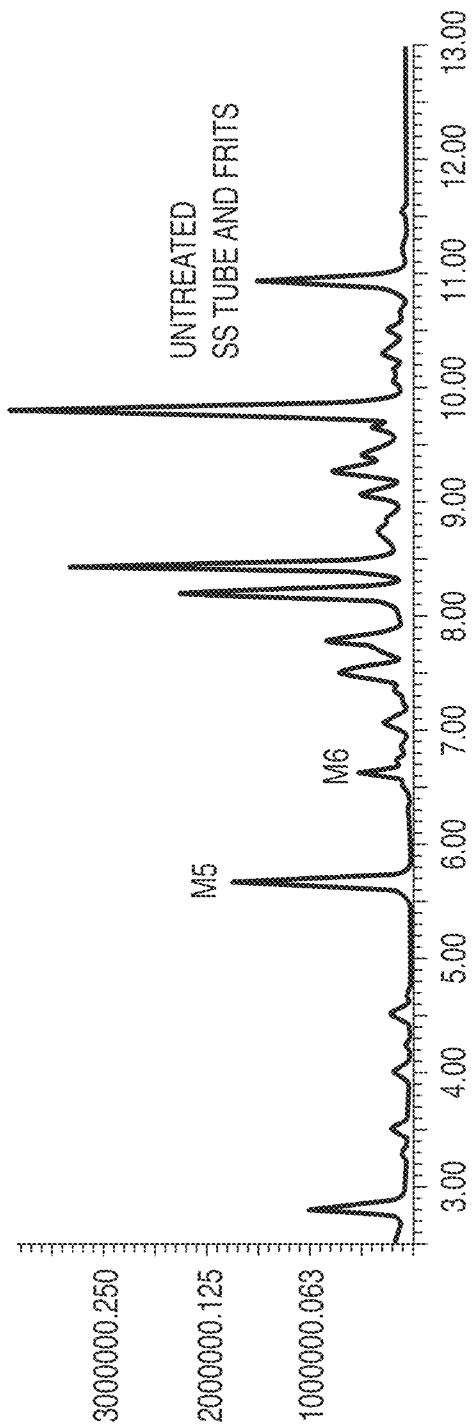
FIG. 4A shows a fluorescence chromatogram obtained using uncoated stainless steel hardware, in accordance with an illustrative embodiment of the technology.
Figure 4B:
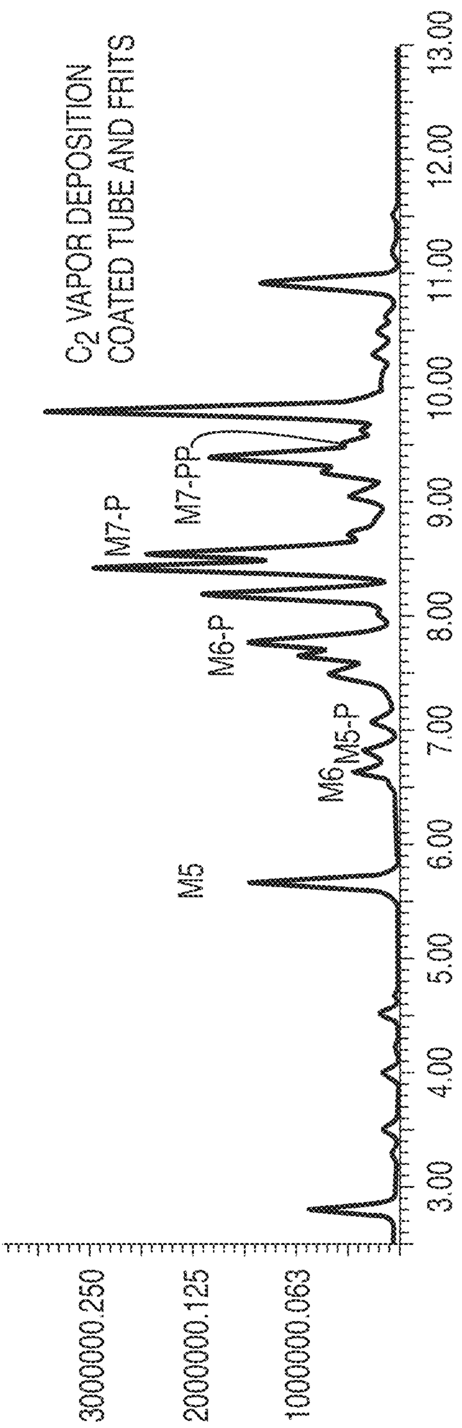
FIG. 4B shows a fluorescence chromatogram obtained using hardware coated with exemplary vapor deposited alkylsilyl, in accordance with an illustrative embodiment of the technology.
Figure 4C:
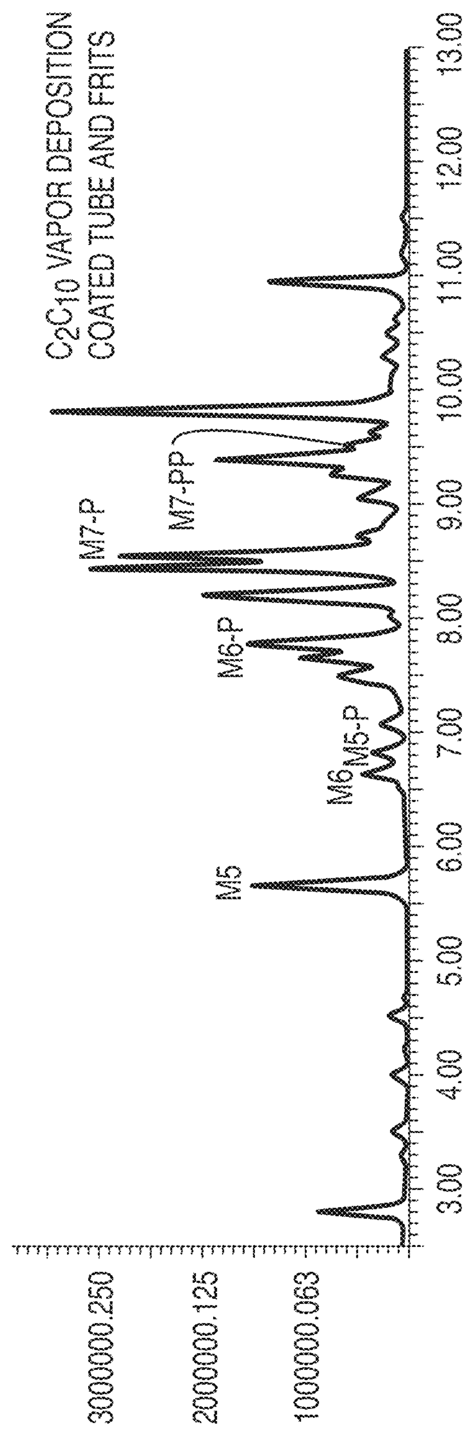
FIG. 4C shows a fluorescence chromatogram obtained using hardware coated with exemplary vapor deposited alkylsilyl, in accordance with an illustrative embodiment of the technology.

The disclosed coatings, which can be vapor deposited, have been found to dramatically improve separations of phosphoglycans by hydrophilic interaction chromatography (HILIC). To demonstrate the significance of this, the released N-glycans from a recombinant alpha-galactosidase which can be used as an enzyme replacement therapy for Fabry's disease were evaluated. This particular type of enzyme is taken up from circulation and delivered intercellularly to lysosomes through the mannose-6-phosphate pathway, making it important to identify and monitor the levels of phosphorylated glycans that are present on its surface. Vapor deposition coated stainless steel column tubes along with matching coated stainless steel frits were first tested against corresponding untreated stainless steel hardware. In this instance, two different types of coating chemistries were used. The coating chemistries used to coat the frits and tubing were VPD #2 and VPD #7. FIG. 4A-4C show fluorescence chromatograms obtained with these types of column hardware. From these data, it was found that use of coated column hardware significantly improved the recovery of each phosphorylated N-glycan species. For example, there was a marked increase in the peak area of Man7-PP, a high mannose glycan with two mannose-6-phosphate residues, mannose-7-bisphosphate. Where Man7-PP could not be detected with stainless steel column hardware, it was easily detected with vapor deposition coated column hardware. This indicated that this species of N-glycan was interacting with the metallic surfaces of the column hardware in such a way that prevented it from reaching the detector. When using vapor deposition coated hardware, the peak area ratio of Man-7-PP to Man5 (a high mannose glycan without phosphorylation) was 0.24:1 (FIG. 4A-4C).

Figure 5A:
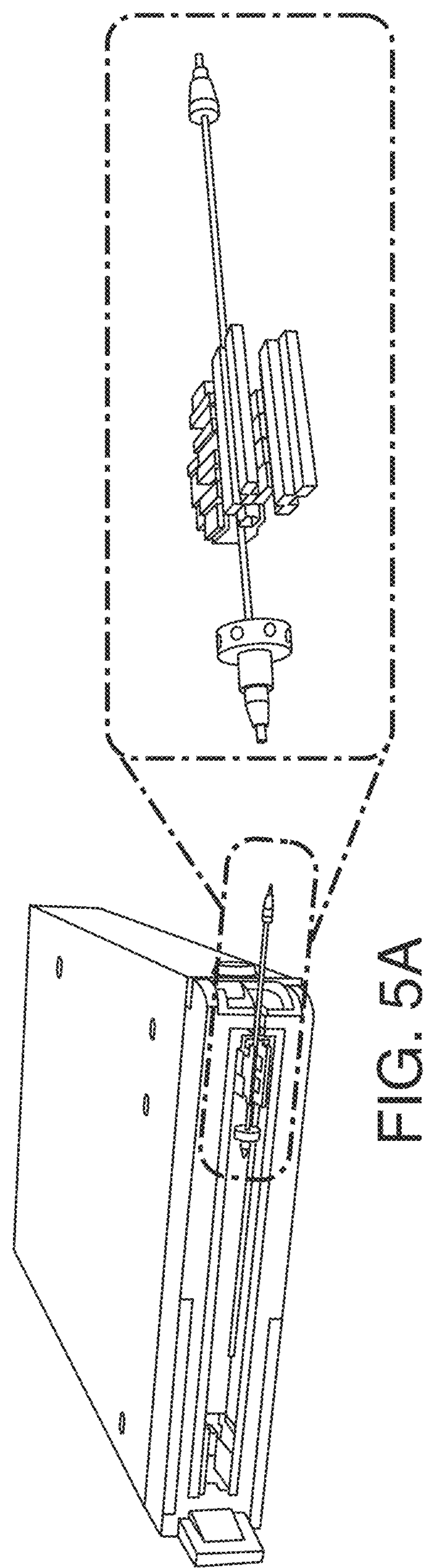
FIG. 5A is a schematic of exemplified bioinert alkysilyl coated stainless steel sample flow path components, including column inlet tubing, in accordance with an illustrative embodiment of the technology.
Figure 5B:
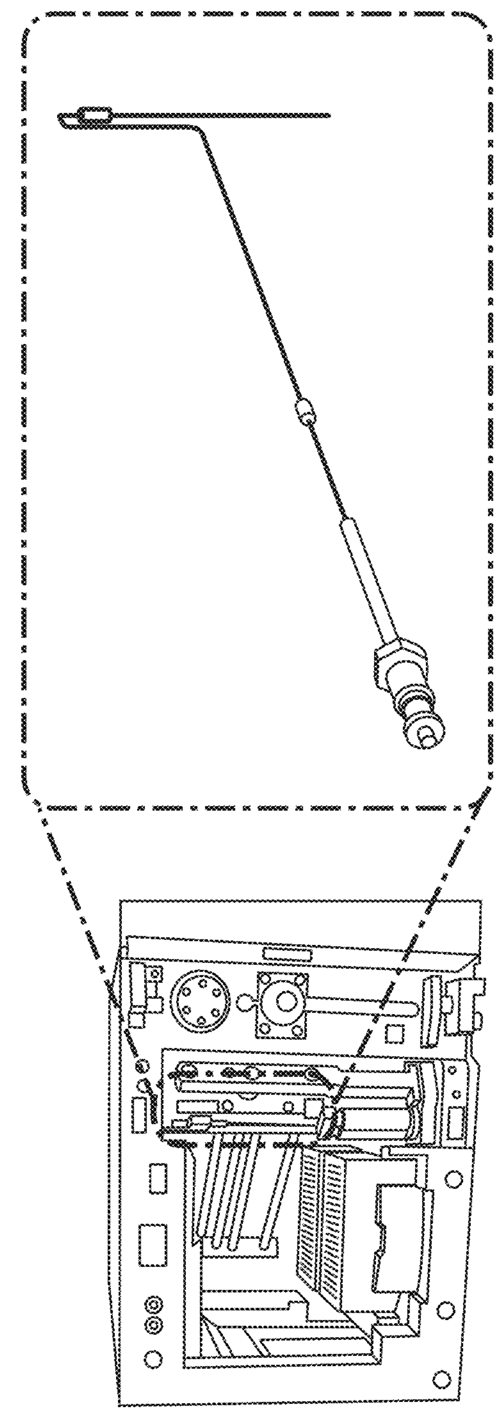
FIG. 5B is a schematic of exemplified bioinert alkysilyl coated stainless steel sample flow path components, including a sample needle, in accordance with an illustrative embodiment of the technology.
Figure 6A:
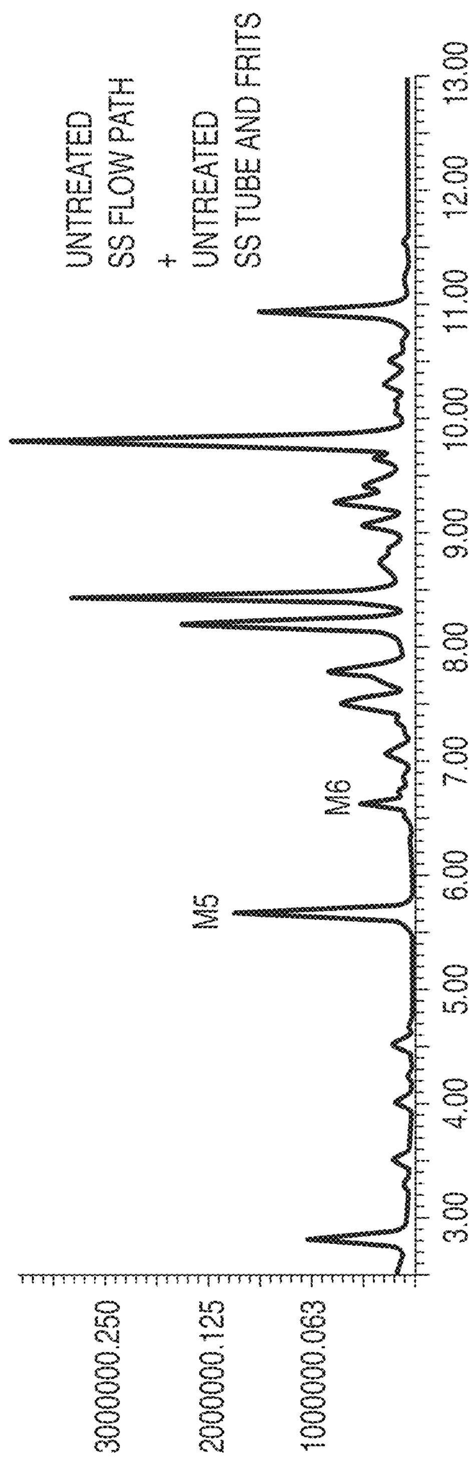
FIG. 6A shows a fluorescence chromatogram obtained using an untreated flow path and untreated tube and frit combination in accordance with an embodiment of the technology.
Figure 6B:
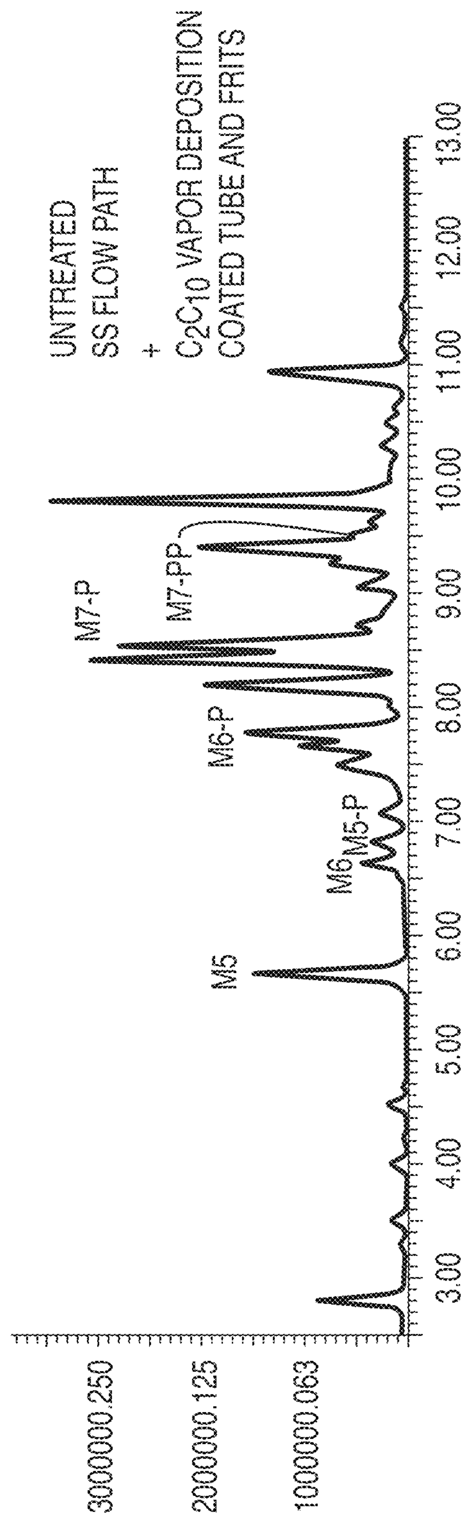
FIG. 6B shows a fluorescence chromatogram obtained using an untreated flow path and coated tube and frit combination, in accordance with an embodiment of the technology.
Figure 6C:
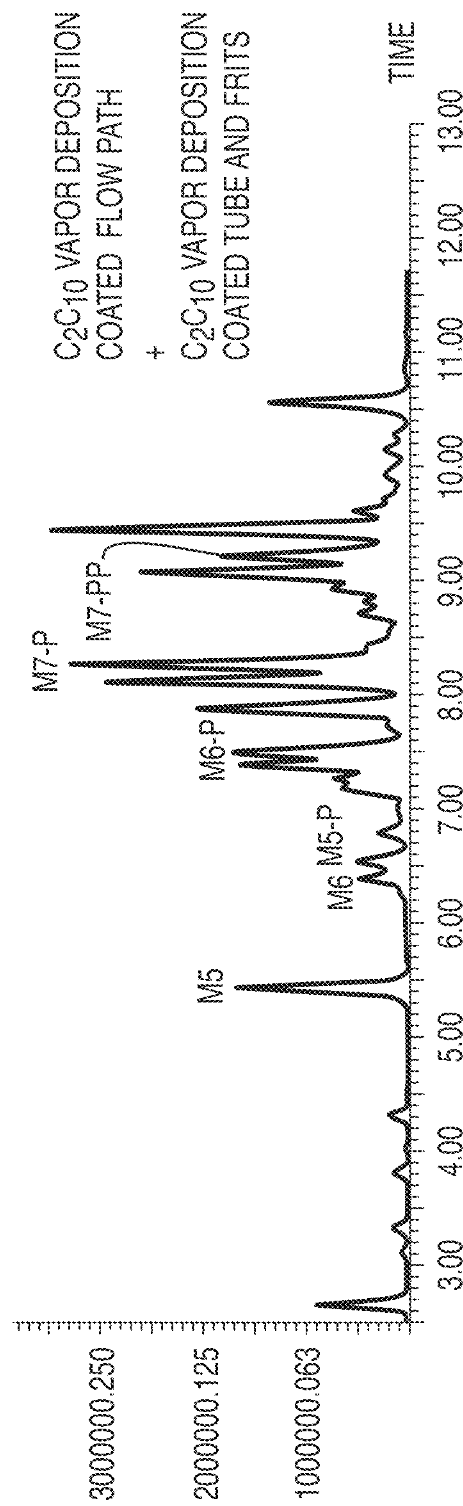
FIG. 6C shows a fluorescence chromatogram obtained using a coated flow path and coated tube and frit combination, in accordance with an embodiment of the technology.

The increased recovery of phosphorylated glycans using coated column hardware and frits shows that adsorption to metallic column hardware surfaces is detrimental to recovery. With this in mind, separations were also performed with vapor deposition coated stainless steel sample flow path components (FIGS. 5A and 5B). FIG. 6A-6C show fluorescence chromatograms obtained using coated LC system components in conjunction with coated stainless steel column hardware. Phosphoglycan recovery improved even more with the use of coated column hardware and $C_2C_{10}$ vapor deposition coated flow path components. Most notably, the peak area ratio of Man7-PP to Man5 increased to 0.8:1 from the ratio of 0.24:1 that was obtained by using coated column hardware alone. The observed relative abundance for Man7-PP with the coated system and coated column hardware is indicative of full recovery for the phosphorylated glycans, as can be determined by orthogonal assays to HILIC of RapiFluor-MS labeled released glycans. In sum, these results confirm that the loss of phosphorylated N-glycan species to sample flow path surfaces can be alleviated with the use of vapor deposition coatings.

Separation of Other Phosphorylated Molecules

Figure 7A:
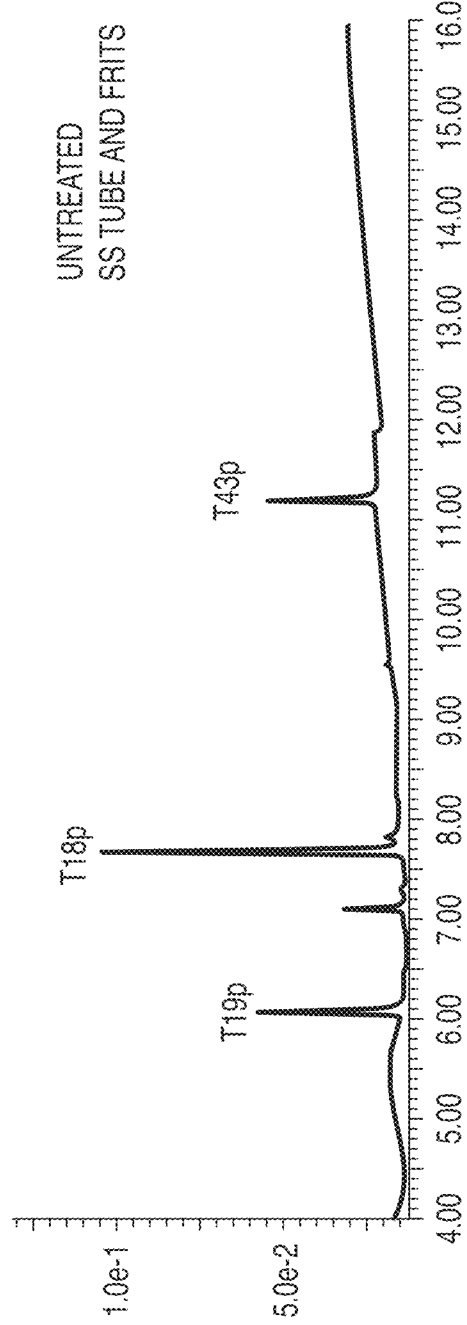
FIG. 7A shows a UV chromatogram obtained using an untreated stainless steel tube/frit combination.
Figure 7B:
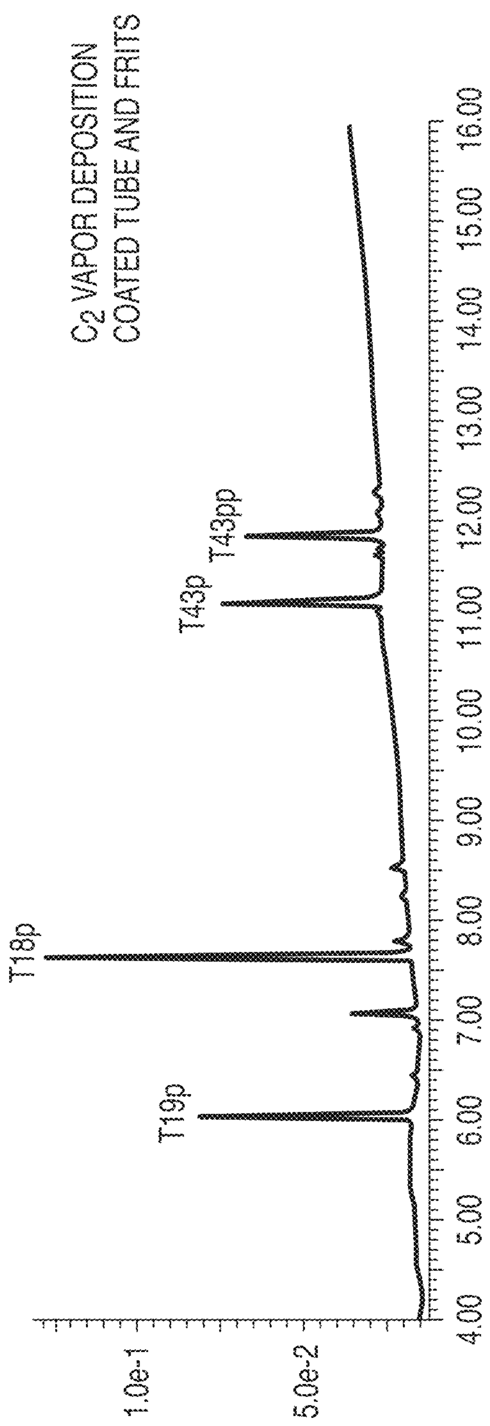
FIG. 7B shows a UV chromatogram obtained using a $C_2$ vapor deposition coated tube/frit combination, in accordance with an embodiment of the technology.
Figure 7C:
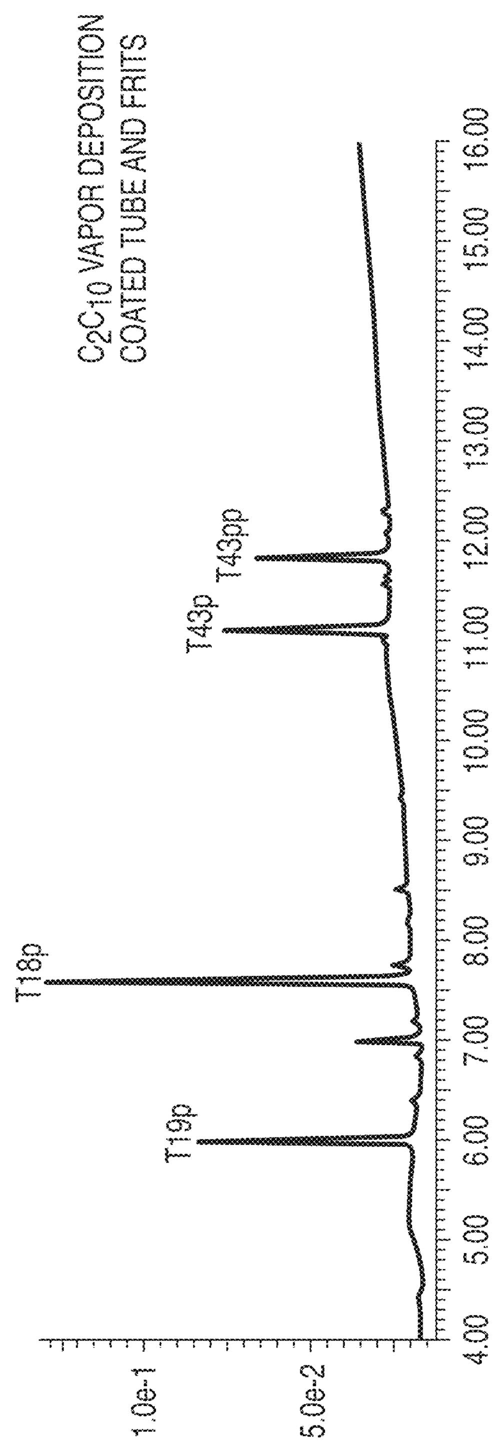
FIG. 7C shows a UV chromatogram obtained using a $C_2C_{10}$ vapor deposition coated tube/frit combination, in accordance with an embodiment of the technology.
Figure 8A:
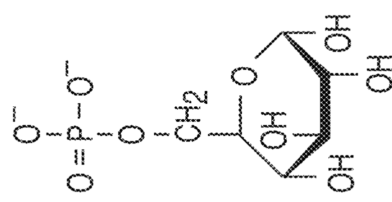
FIG. 8A is a chromatogram showing the effects of employing vapor deposition coated column hardware for the reversed phase LC analyses of glucose-6-phosphate, in accordance with an illustrative embodiment of the technology.
Figure 8A:
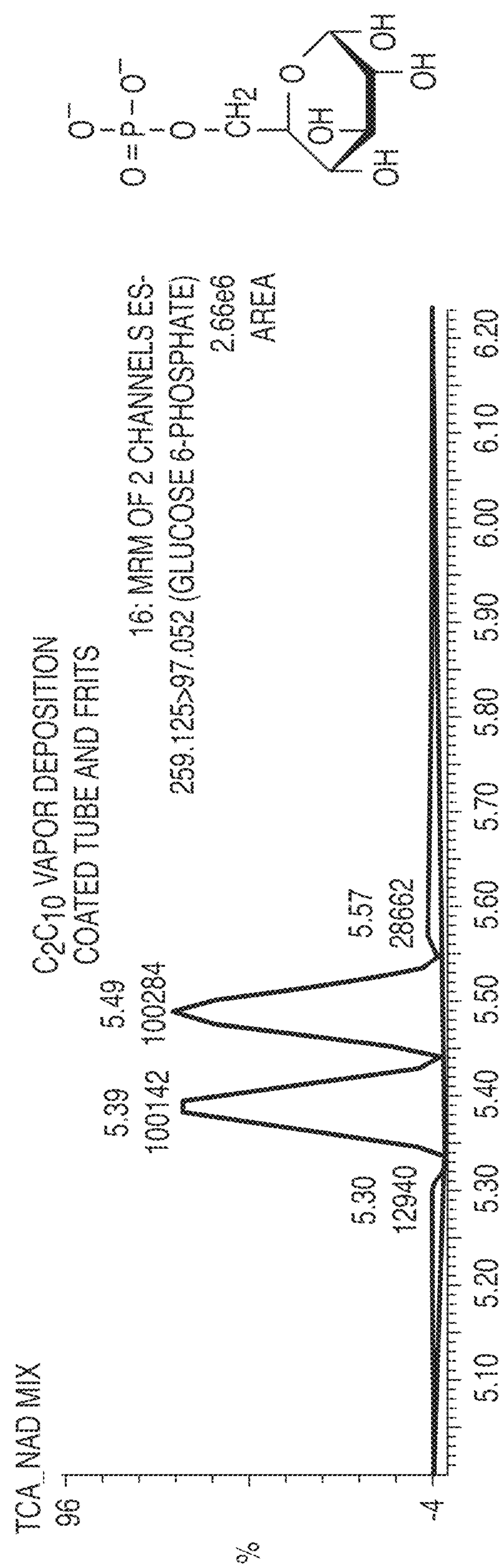
Figure 8B:
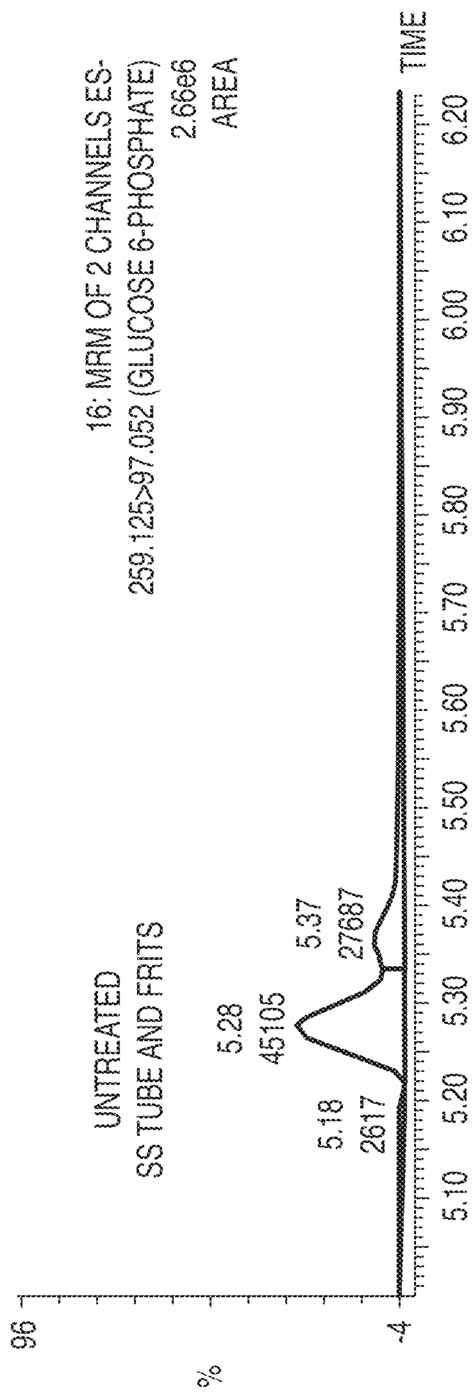
FIG. 8B is a chromatogram showing the effects of employing untreated column hardware for the reversed phase LC analyses of glucose-6-phosphate.
Figure 9A:
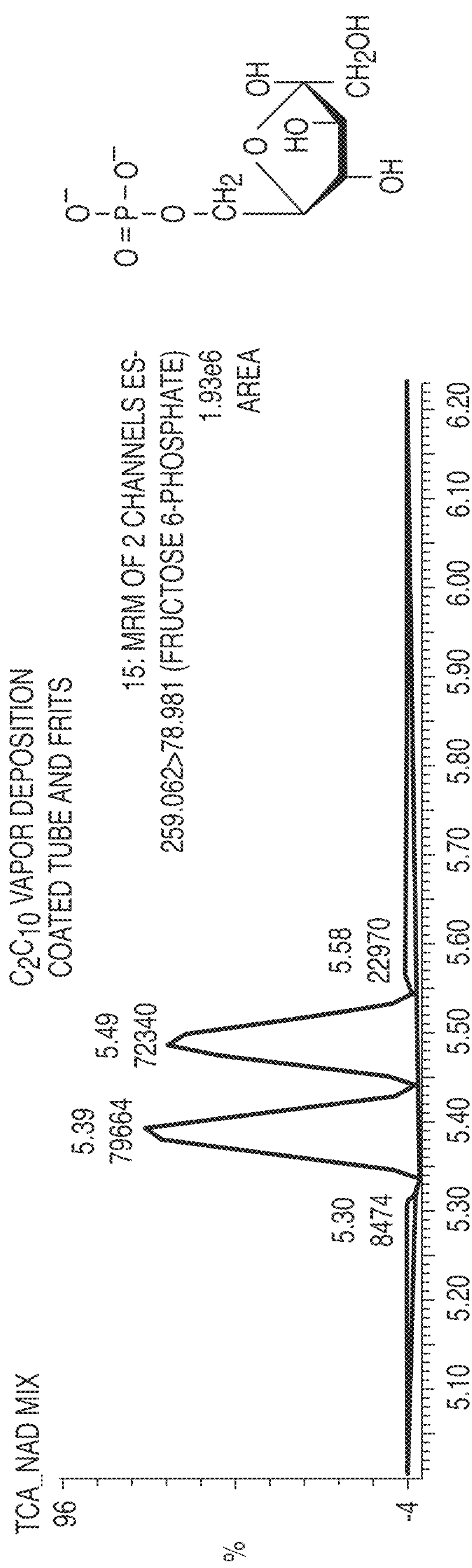
FIG. 9A is a chromatogram showing the effects of employing vapor deposition coated column hardware for the reversed phase LC analyses of fructose-6-phosphate, in accordance with an illustrative embodiment of the technology.
Figure 9B:
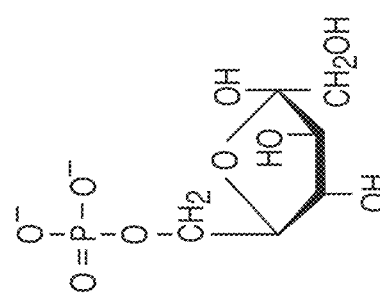
FIG. 9B is a chromatogram showing the effects of employing untreated column hardware for the reversed phase LC analyses of fructose-6-phosphate.
Figure 9B:
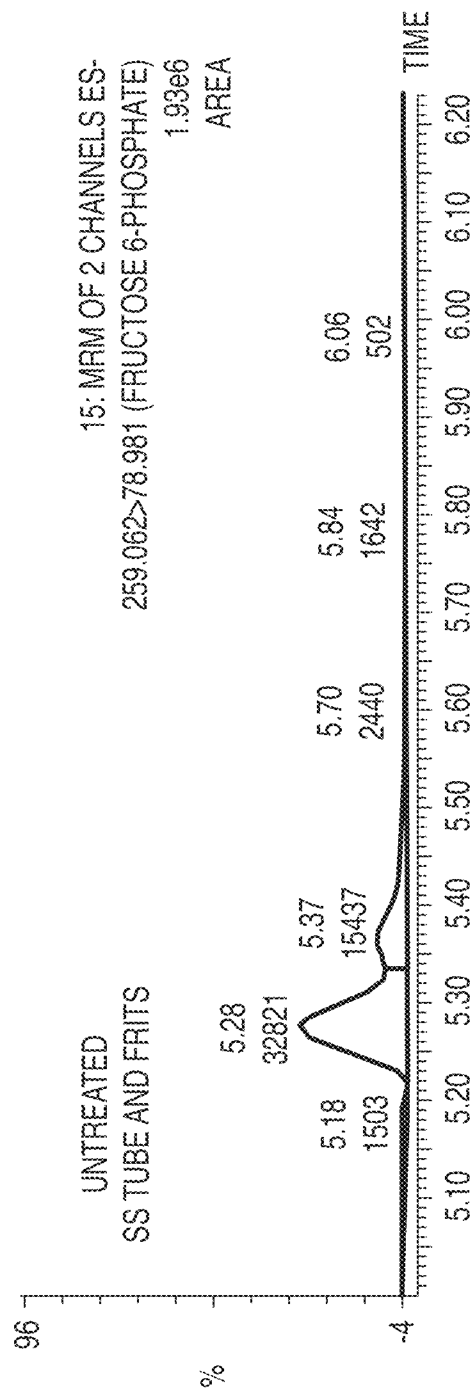
Figure 10A:
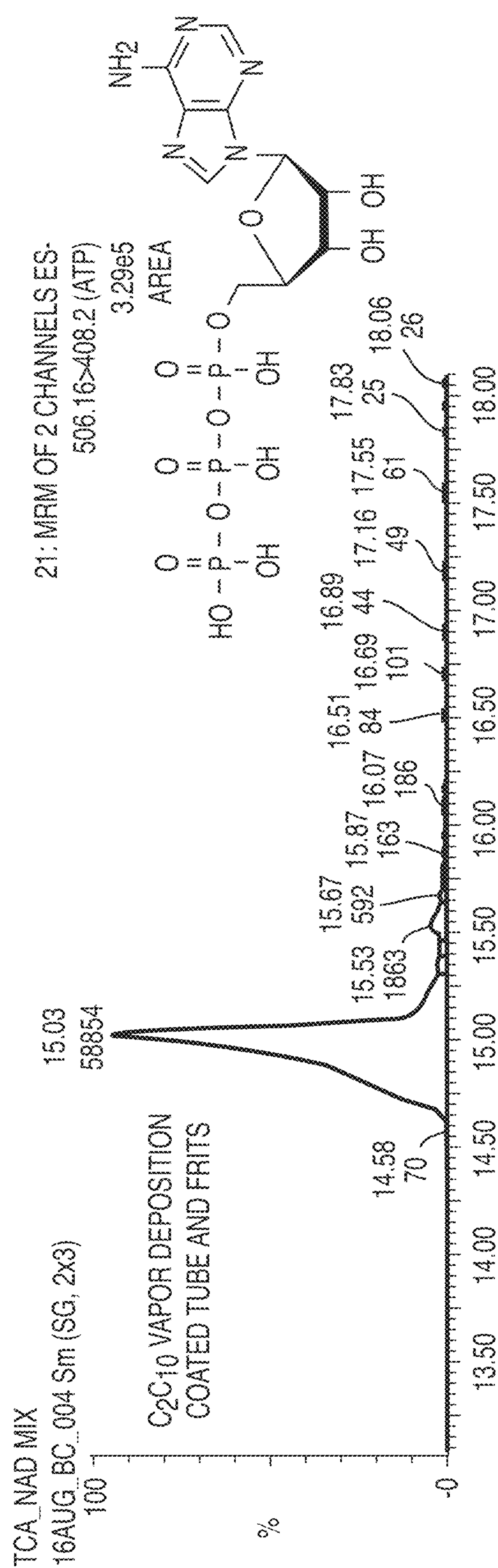
FIG. 10A is a chromatogram showing the effects of employing vapor deposition coated column hardware for the reversed phase LC analyses of adenosine triphosphate, in accordance with an illustrative embodiment of the technology.
Figure 10B:
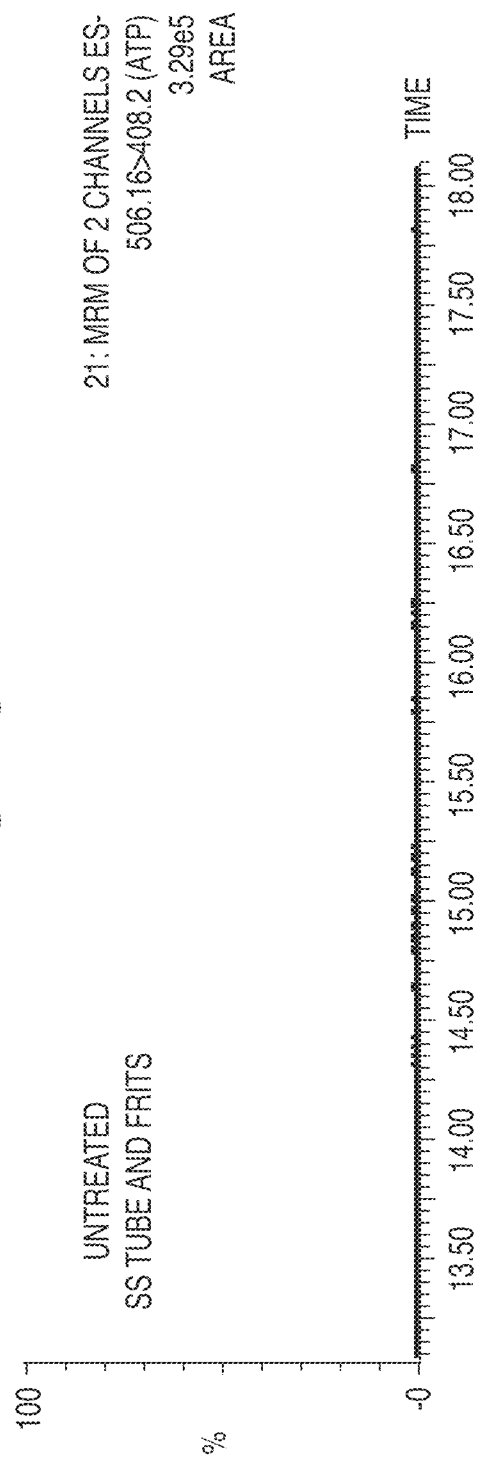
FIG. 10B is a chromatogram showing the effects of employing untreated column hardware for the reversed phase LC analyses of adenosine triphosphate.
Figures 11A, 11B:
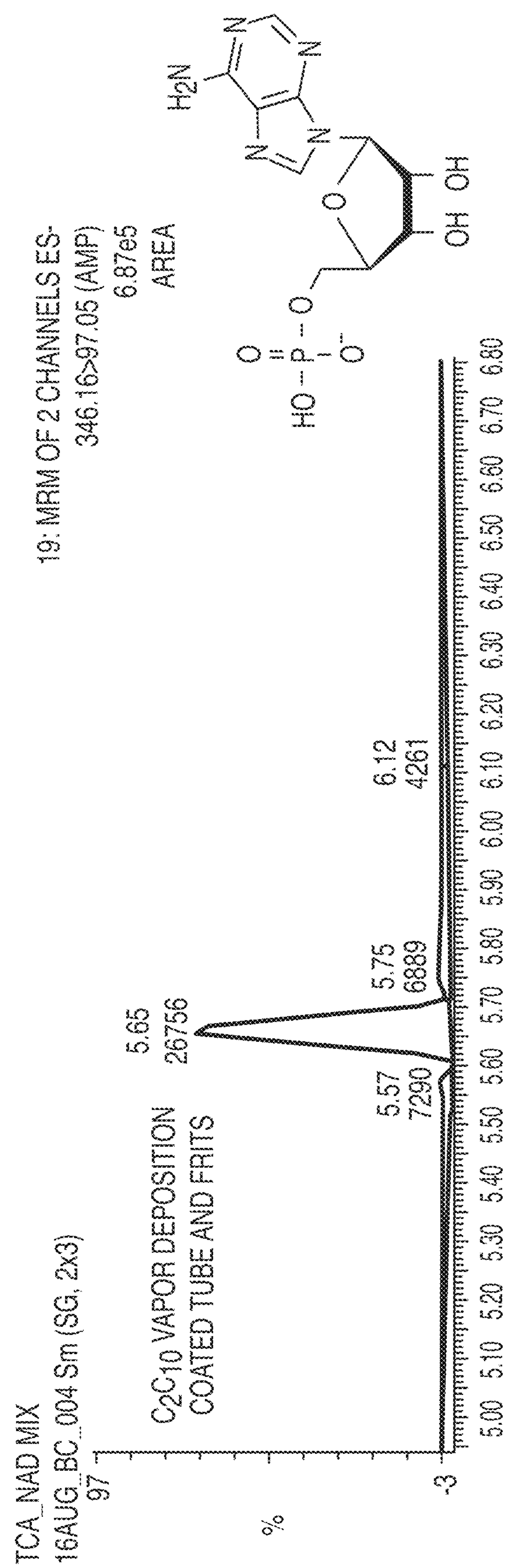
FIG. 11A is a chromatogram showing the effects of employing vapor deposition coated column hardware for the reversed phase LC analyses of adenosine monophosphate, in accordance with an illustrative embodiment of the technology.
FIG. 11B is a chromatogram showing the effects of employing untreated column hardware for the reversed phase LC analyses of adenosine monophosphate.

The principles learned from using vapor deposition coatings for phosphoglycan analysis were extended to facilitate the analysis of other types of phosphorylated biomolecules. In which case, the coatings have been found to be beneficial to improving the recovery of phosphorylated peptides under reversed phase chromatography conditions. To demonstrate these recovery advantages, we evaluated a mixture containing phosphopeptides. This particular sample contains three peptides that are singly phosphorylated and one that is doubly phosphorylated. Vapor deposition coated stainless steel column tubes along with matching coated stainless steel frits were first tested against corresponding untreated stainless steel hardware. FIG. 7A-7C show UV chromatograms obtained with these types of column hardware. In each case, the addition of the VPD #2, and the VPD #7 coatings increased the recovery of the singly phosphorylated peptides by at least 13% over the stainless steel alone (FIG. 4A-4C). The impact of coating the chromatographic flow path was much more pronounced with the doubly phosphorylated peptide. When using the stainless steel column hardware, there was no detectable recovery of the doubly phosphorylated peptide. However, when using either type of coated column hardware (VPD #2, and the VPD #7), this peptide became clearly visible in the obtained chromatograms. This result indicates, once again, that vapor deposition coatings can be used to minimize undesirable interactions with the metallic surfaces of chromatographic flow paths and in doing so allow for improved analyses of phosphorylated biomolecules.

As such, in one aspect, the vapor deposition coated column hardware is used to improve the recovery of phosphorylated biomolecules during analyses by liquid chromatography. In yet another embodiment of this invention, vapor deposition coated flow path components are used in conjunction with vapor deposition coated column hardware to improve the recovery of phosphorylated biomolecules during analyses by liquid chromatography.

The effects of this finding have been demonstrated for two examples of phosphorylated biomolecules, phosphorylated glycans and phosphorylated peptides. Phosphorylated biomolecules refer to any molecule naturally produced by an organism that contains a phospho group, including but not limited to phosphorylated proteins and polynucleotides. Furthermore, it is reasonable to envision this disclosure being used to improve liquid chromatographic analyses of smaller biomolecules, including but not limited to phospholipids, nucleotides and sugar phosphates. Indeed, vapor deposition coated column hardware has been found to be useful in improving the recovery and peak shape of sugar phosphates and nucleotides. The effects of employing vapor deposition coated versus untreated column hardware for the reversed phase LC analyses of glucose-6-phosphate, fructose-6-phosphate, adenosine triphosphate, and adenosine monophosphate are captured in FIGS. 8-11. Interestingly, these data indicate that the use of the vapor deposition coated column hardware can yield a significant improvement in both the overall recovery and peak shape of these phosphate containing small biomolecules. Thus, it is foreseeable that this disclosure could also be used to improve the chromatography of non-biomolecules, such as small-molecule pharmaceuticals containing either phospho or phosphonate functional groups.

Separation of Sialylated Glycans and Molecules Having Carboxylic Acid Moieties

It has additionally been discovered that vapor deposition coated hardware can be of benefit to mixed mode separations of sialylated glycans. In such a technique, sialylated glycans can be resolved using a stationary phase that exhibits anion exchange and reversed phase retention mechanisms. It was just recently discovered that a unique class of stationary phase, referred to as charged surface reversed phase chromatographic materials and described in International Application No. PCT/US2017/028856, entitled "CHARGED SURFACE REVERSED PHASE CHROMATOGRAPHIC MATERIALS METHOD FOR ANALYSIS OF GLYCANS MODIFIED WITH AMPHIPATHIC, STRONGLY BASED MOIETIES" and published as WO2017/189357 (and incorporated herein by reference in its entirety), is ideally suited to producing these types of separations. The use of a high purity chromatographic material (HPCM) with a chromatographic surface comprised of a diethylaminopropyl (DEAP) ionizable modifier, a C18 hydrophobic group and endcapping on a bridged ethylene hybrid particle has proven to be an exemplary embodiment for the separation of glycans labeled with amphipathic, strongly basic moieties, like that imparted by the novel labeling reagent described in International Application No. PCT/US2017/028856 (WO2017/189357). This so-called diethylaminopropyl high purity chromatographic material (DEAP HPCM) stationary phase is effective in separating acidic glycans as a result of it being modified with a relatively high pKa (~10) ionizable modifier that yields uniquely pronounced anionic retention.

Figure 12A:
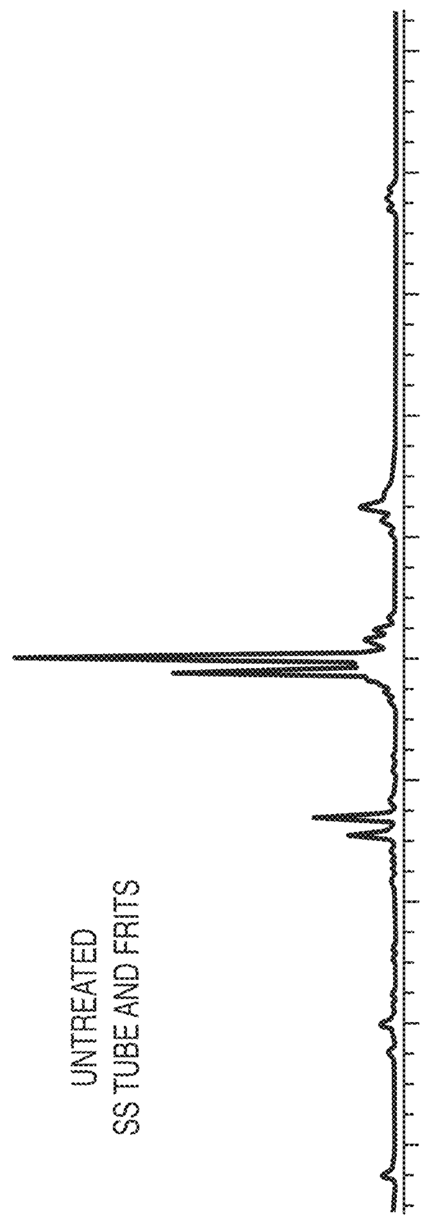
FIG. 12A is a fluorescence chromatogram for fetuin N-glycans obtained with untreated stainless steel hardware.
Figure 12B:
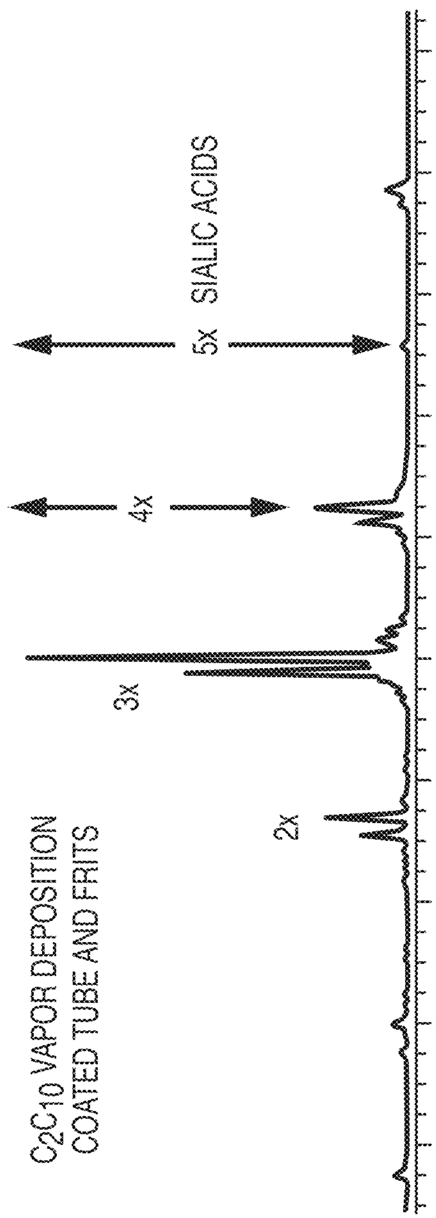
FIG. 12B is a fluorescence chromatogram for fetuin N-glycans obtained with vapor deposition coated hardware, in accordance with an illustrative embodiment of the technology.
Figures 13A, 13B, 13C, 13D:
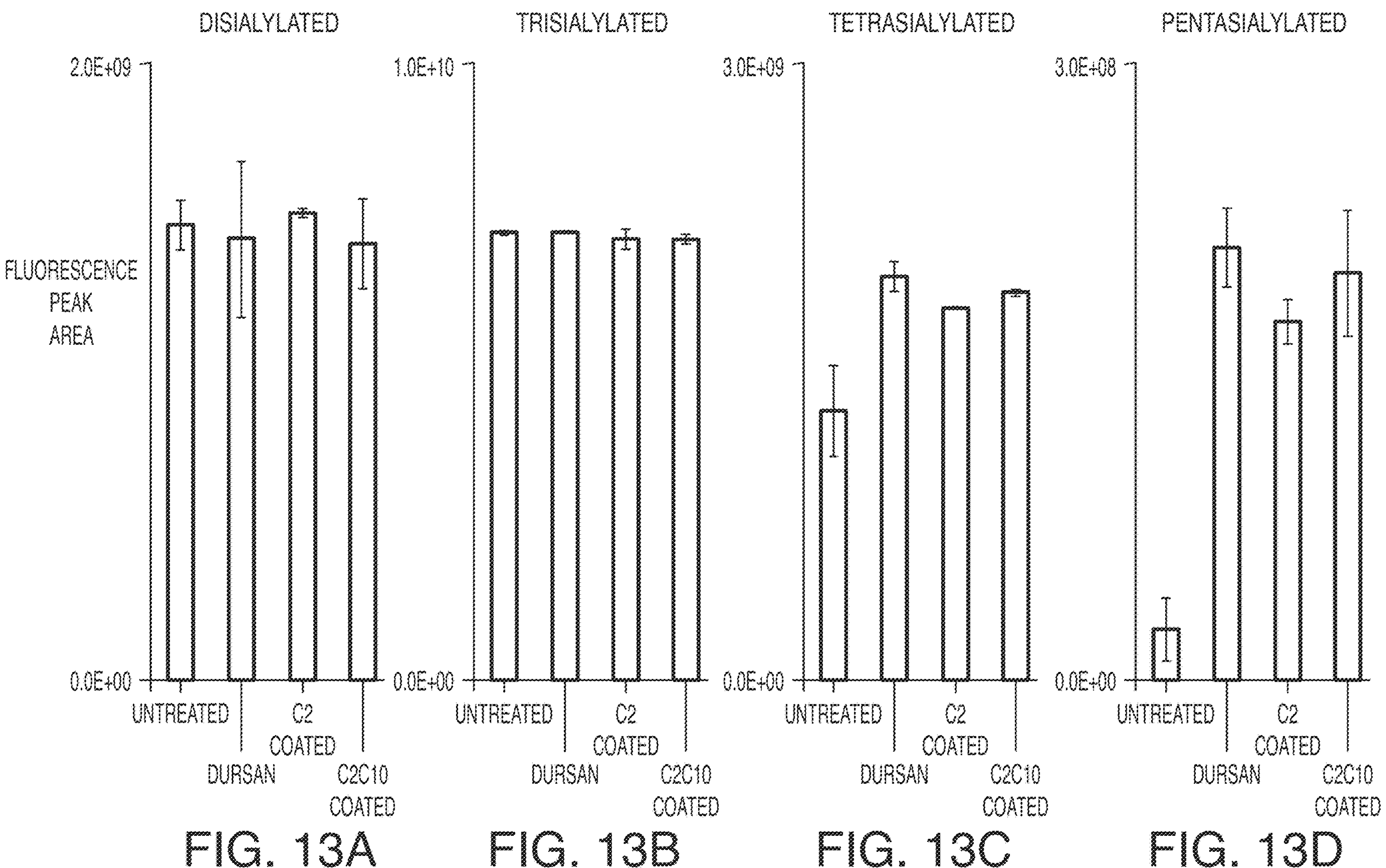
FIG. 13A is a graph showing fluorescence peak areas for disialyated glycans obtained with untreated stainless steel hardware compared to stainless steel hardware coated different types of vapor deposited coatings, in accordance with an illustrative embodiment of the technology.
FIG. 13B is a graph showing fluorescence peak areas for trisialyated glycans obtained with untreated stainless steel hardware compared to stainless steel hardware coated different types of vapor deposited coatings, in accordance with an illustrative embodiment of the technology.
FIG. 13C is a graph showing fluorescence peak areas for tetrasialyated glycans obtained with untreated stainless steel hardware compared to stainless steel hardware coated different types of vapor deposited coatings, in accordance with an illustrative embodiment of the technology.
FIG. 13D is a graph showing fluorescence peak areas for pentasialyated glycans obtained with untreated stainless steel hardware compared to stainless steel hardware coated different types of vapor deposited coatings, in accordance with an illustrative embodiment of the technology.

In an application to DEAP HPCM mixed mode separations of sialylated glycans, vapor deposition coated hardware has been shown to yield improved chromatographic recoveries and peak shapes of glycans containing greater than three sialic acid residues. A comparison of fluorescence chromatograms for fetuin N-glycans obtained with untreated stainless steel versus VPD #7 coated hardware is provided in FIG. 12, wherein the effect on peak shape and recovery of tetra- and penta-sialylated glycans is easily visualized. The observed chromatographic differences are likewise easily quantified. In particular, fluorescence peak areas for the most abundant di-, tri-, tetra- and penta-sialylated glycans showed there were indeed very distinct differences in recoveries (FIG. 13). This testing was also used to demonstrate that other, chemically unique vapor deposition coating could be used with equally good effect. Much like the VPD #7 coated hardware, VPD #2 and SilcoTek Dursan® coated hardware showed equivalent capabilities in improving peak shape and recovery of the tetra- and penta-sialylated N-glycans. Interestingly though, it was not found to be necessary to use a coated flow through needle or column inlet in order to optimize peak shape and recovery.

As with phosphorylated species, this effect on the chromatography of sialylated glycans is believed to result from masking the metallic surface of the hardware and minimizing adsorptive sample losses that can occur with analytes that exhibit a propensity for metal chelation. However, the origin of the metal chelation is different in that the effect is a consequence of a glycan carrying multiple carboxylate residues versus one or two phosphorylated residues. Carboxylate containing compounds generally have a weak affinity for metals. Yet, when there are multiple carboxylate moieties present in one molecule, an opportunity for polydentate chelation is created, as is the case with tetra- and penta-sialylated glycans.

Accordingly, in an embodiment of this invention, vapor deposition coated column hardware is used during liquid chromatography of biomolecules containing greater than three carboxylic acid residues as a means to improve their peak shape and recovery. In yet another embodiment of this invention, vapor deposition coated flow path components are used in conjunction with vapor deposition coated column hardware to improve the peak shape and recovery of biomolecules containing greater than three carboxylic acid residues.

Separation of Proteins

Figures 14A, 14B:
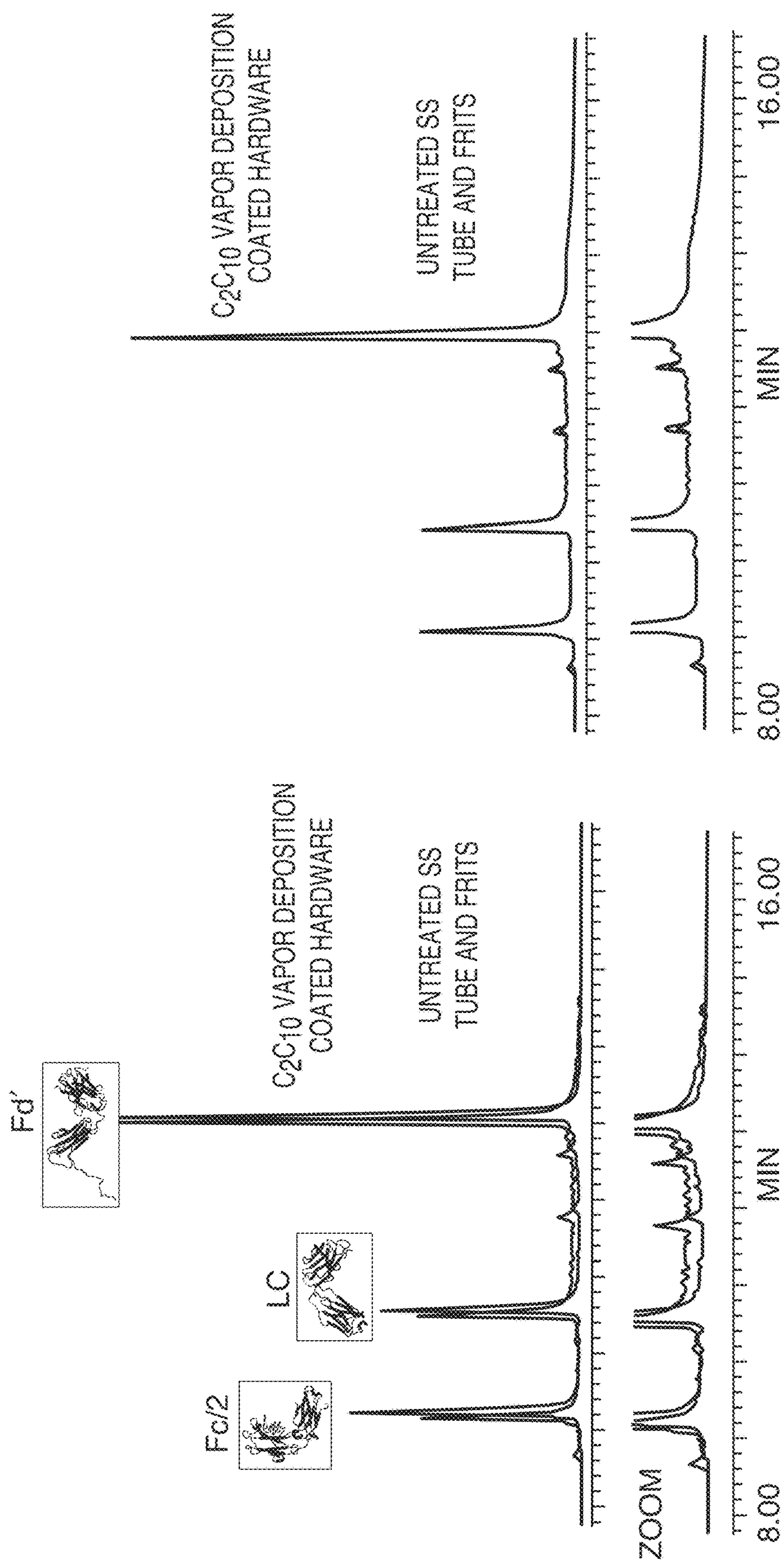
FIG. 14A is a reversed phase fluorescence chromatogram of reduced, IdeS-digested NIST Reference Material 8671 obtained with column hardware components treated with coatings in accordance with illustrative embodiments of the technology.
FIG. 14B is a reversed phase fluorescence chromatogram of reduced, IdeS-digested NIST Reference Material 8671 obtained with column hardware components treated with coatings in accordance with illustrative embodiments of the technology.

Certain vapor deposition coatings have also been found to beneficially impact protein reversed phase chromatography. To demonstrate such, we evaluated a paradigmatic protein separation that is very important to the analysis of biopharmaceuticals, a monoclonal (mAb) subunit separation with MS-friendly, formic acid modified mobile phase. Using such a test, numerous combinations of column hardware materials have been examined. Vapor deposition coated stainless steel column tubes along with matching coated stainless steel frits were first tested against corresponding untreated stainless steel hardware. FIGS. 14A and 14B show fluorescence chromatograms obtained with these column hardware materials. From these data, it was found that hardware coated with VPD #7, but not hardware coated with VPD #2, was uniquely able to improve the baseline quality of the model separation, particularly in providing quicker returns to baseline. This improvement to the chromatographic performance of the separation is underscored by the fact that the chromatogram produced with the VPD #7 coated column also shows higher peak intensities for some of the subunits. The nature of this baseline issue, as it exists with stainless steel hardware, can be reasoned to be a result of the protein analytes undergoing problematic secondary interactions and not homogenously eluting at one particular eluotropic strength. Interestingly, in this example, the VPD #7 MVD hardware did not appear to significantly improve half height peak capacity nor the carryover of the columns, which was universally found to be ~0.9%. That is to say, for protein reversed phase chromatography, it would seem that vapor deposition coatings improve the quality of separation predominately through affecting baseline properties.

Figures 15A, 15B:
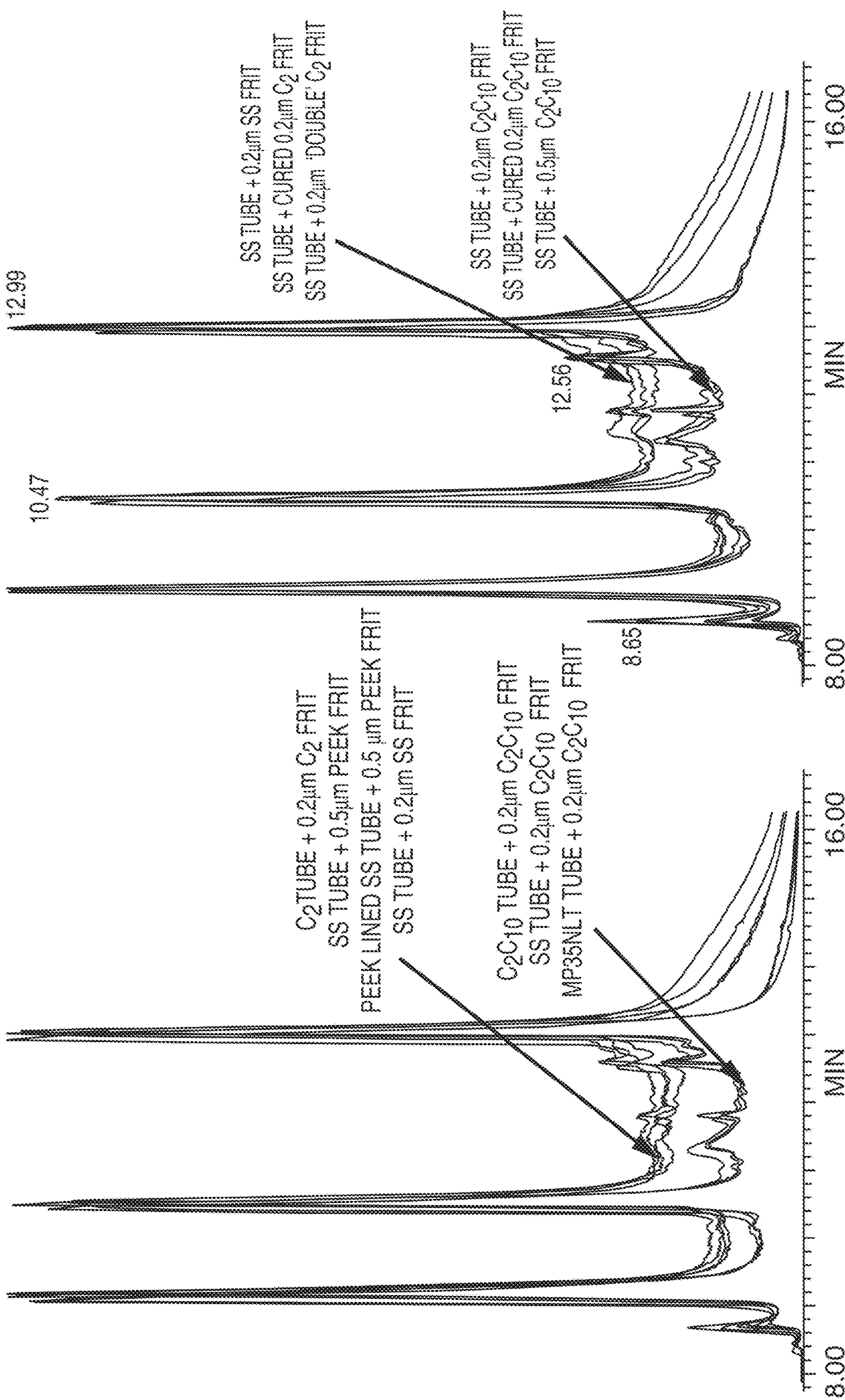
FIG. 15A is a reversed phase total ion chromatogram for columns constructed with stainless steel alternatives, namely polyether ether ketone (PEEK) and a low titanium, nickel cobalt alloy (MP35NLT) with various components coated, in accordance with an illustrative embodiment of the technology.
FIG. 15B is a reversed phase total ion chromatogram for column components (i.e., frits) constructed with stainless steel, $C_2$ coatings and $C_2C_{10}$ coatings, in accordance with an illustrative embodiment of the technology.
Figures 16A, 16B, 16C:
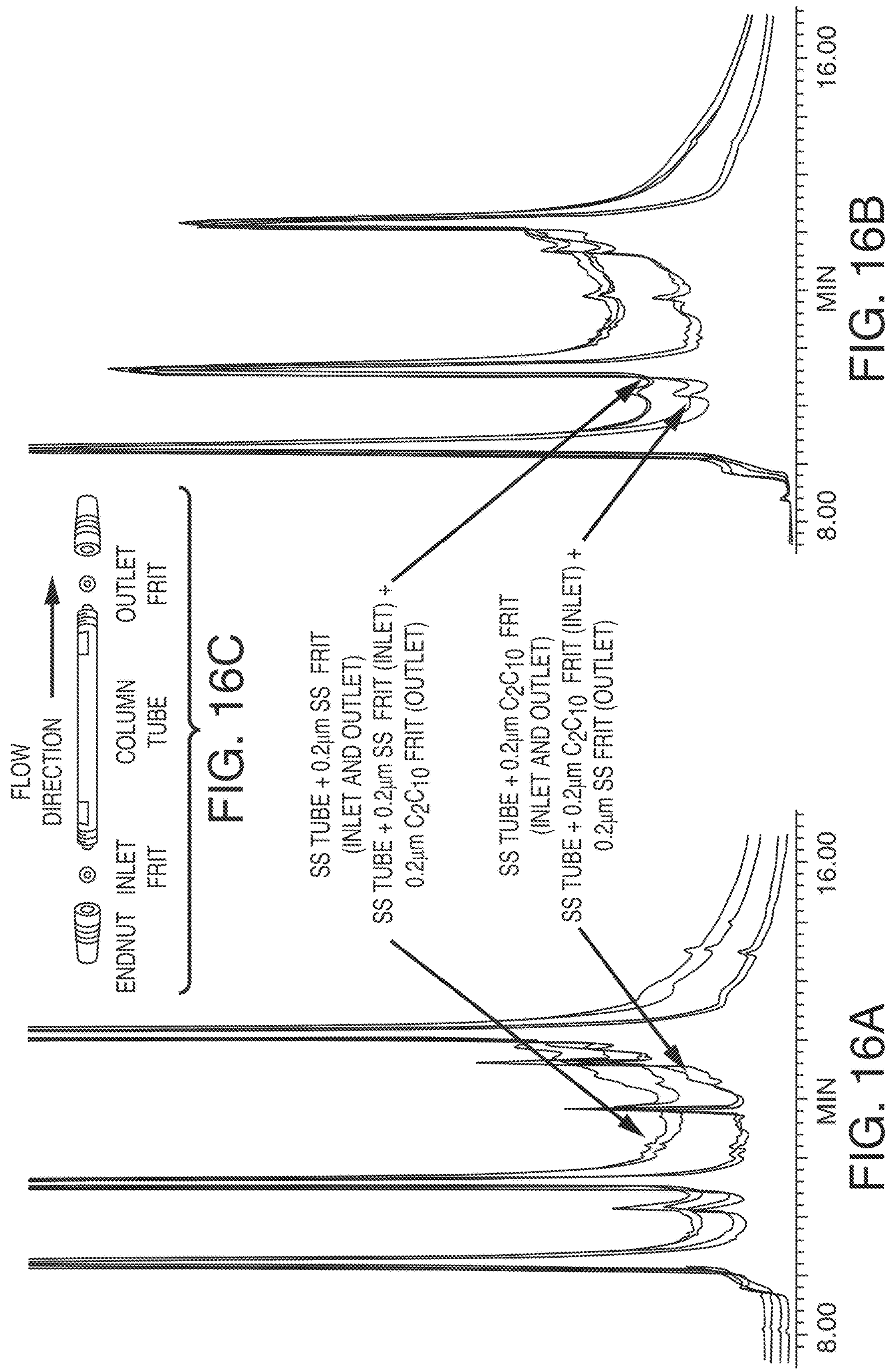
FIG. 16A shows fluorescence chromatograms of reduced, IdeS-digested NIST Reference Material 8671 and the effect on baseline return when various components of the system are coated, in accordance with an illustrative embodiment of the technology.
FIG. 16B shows reversed phase total ion chromatograms (TICs) reduced, IdeS-digested NIST Reference Material 8671 and the effect on baseline return when various components of the system are coated, in accordance with an illustrative embodiment of the technology.
FIG. 16C is a schematic of the column tube and frits that were coated and used to obtain the chromatograms of FIGS. 16A and 16B, in accordance with an illustrative embodiment of the technology.

An effect such as this can be very significant to protein reversed phase separations, particularly those intended to facilitate detection by online electrospray ionization (ESI)-mass spectrometry (MS). Often, it is critical to have quick returns to baseline in ESI-MS data given that it will make the assignment of chromatographic peaks less ambiguous. Signal from previously eluted species will be less abundant and therefore less confounding in data accumulated for later eluting peaks. With this in mind, 11 additional combinations of column hardware materials were screened, using ESI-MS detection as the means to assessing the quality of the data. FIG. 15A presents total ion chromatograms (TICs) for some of these materials, including columns constructed with stainless steel alternatives, namely polyether ether ketone (PEEK) and a low titanium, nickel cobalt alloy (MP35NLT). Surprisingly, columns constructed of VPD #7 coated hardware were the only found to give uniquely quick returns to baseline. Stainless steel, PEEK, and VPD #2 coated hardware showed comparatively slower returns to baseline. In addition, control experiments showed that the improvement to baseline quality can be achieved through the use of a VPD #7 coated frit alone and that coated tubing is not required to achieve an effect. Further experimentation culminating in the chromatograms of FIG. 15B has made it possible to glean additional insights. One of which is that it does not matter if the frit has a 0.2 or 0.5 m porosity or if the VPD #7 coating has been thermally cured in the form of an annealing process (resulting in a VPD #8 coating). In contrast, neither a thicker VPD #3 coating (~1800 Å thickness) nor a cured coating (VPD #5) with an increased contact angle of 900 (up from ~35°) were able to produce the effect. Accordingly, VPD #7 coated frits are very unique in their ability being to affect the baseline of the example protein separation. While not limited to theory, it would seem reasonable to suggest that this effect derives from the hydrophobicity/contact angle of this coating. It could be that these coated frits closely mimic the surface chemistry of the reversed phase stationary phase. Consequently, a column with VPD #7 coated frits might exhibit adsorption sites (particularly those near the frit surface) that are more uniform in their chemical properties. Testing has shown that this effect on the protein reversed phase separation can be localized to the inlet frit of the column, lending credence to this hypothesis (FIG. 16). Indeed, one hydrophobic VPD #7 vapor deposition coated frit at the column inlet is sufficient to produce uniquely quick returns to baseline for the example mAb subunit separations. Proteins undergo reversed phase chromatography via fairly discrete adsorption/desorption events. Consequently, upon loading, protein analytes will be most concentrated at and likewise spend a significant amount of time at the head of the column, where an interface exists between the inlet frit and the packed bed of the stationary phase. At this interface, a protein analyte would have an opportunity to establish undesired secondary interactions that would be cumulative to and energetically different than the desired hydrophobic interaction with the stationary phase. It is plausible that using a frit with surface properties similar to the stationary phase mitigates any chromatographic problems related to there being energetically and chemically diverse adsorption sites present at this packed bed interface. While not limited to theory, it may also be possible that a frit, such as the $C_2C_{10}$ vapor deposition coated inlet frit (e.g., frit coated with VPD #7), imparts an entirely novel focusing effect to protein reversed phase separations that cannot be explained by the understanding and descriptions noted above. In addition, it is possible that a frit, such as the VPD #7 vapor deposition coated inlet frit, makes a unique contribution to how a stationary phase packs into a column. Use of a vapor deposition coated frit as the substrate for building a packed column bed may advantageously impact the properties of a stationary phase and resultant chromatography.

While the spectra obtained from coating just a single frit with VPD #7 (that is, only the inlet frit or outlet frit is coated and the tube and the opposing frit are uncoated) indicates that coating the inlet frit is sufficient to produce uniquely quick returns to baseline for the example mAb subunit separations, the spectra (FIG. 16A and FIG. 16B) also indicate that coating the outlet frit alone provides benefit over uncoated stainless steel embodiments. The improvement provided by the VPD #7 coated outlet frit may provide enough benefit, especially in larger column width dimensions, to produce quick returns to baselines. Without wishing to be bound to theory, in embodiments featuring a coated metal outlet frit with the remainder of the flow path including uncoated metal reduced secondary metal interactions are provided as the flow path through the frit provides a significant portion of the wetted surface. See Examples 15 and 16 below for further discussion of the surface area provided by a frit.

A number of different coating can be applied to either the inlet or outlet frit. For example, in some embodiments, VPD #7 is utilized. In certain embodiments, VPD #2 or VPD #3 is applied to coat the metal inlet and/or outlet frit. In other embodiments, any coating described in Table 1 can be applied. Also the coating can be a multilayered coating. For example, a first or primer layer in direct contact with the frit can be applied first followed by a second layer (and in some instances a top layer). The top layer would be exposed to the flow path. In some embodiments a primer layer of VPD #2 is vapor deposited on to a stainless steel or titanium frit. After the primer layer is deposited, a top layer comprising VPD #7 is vapor deposited to coat the primer layer.

As such, in an embodiment of this invention, vapor deposition coated column hardware is used to improve the chromatographic performance of protein reversed phase separations. In yet another embodiment of this invention, a vapor deposition coating with a contact angle of >90°, more preferably greater than 100 Å, is used to coat the tubing and frits of a column, or chromatographic device, as a means to improve the baseline and/or tailing factors of protein separations.

Figures 17A, 17B, 17C:
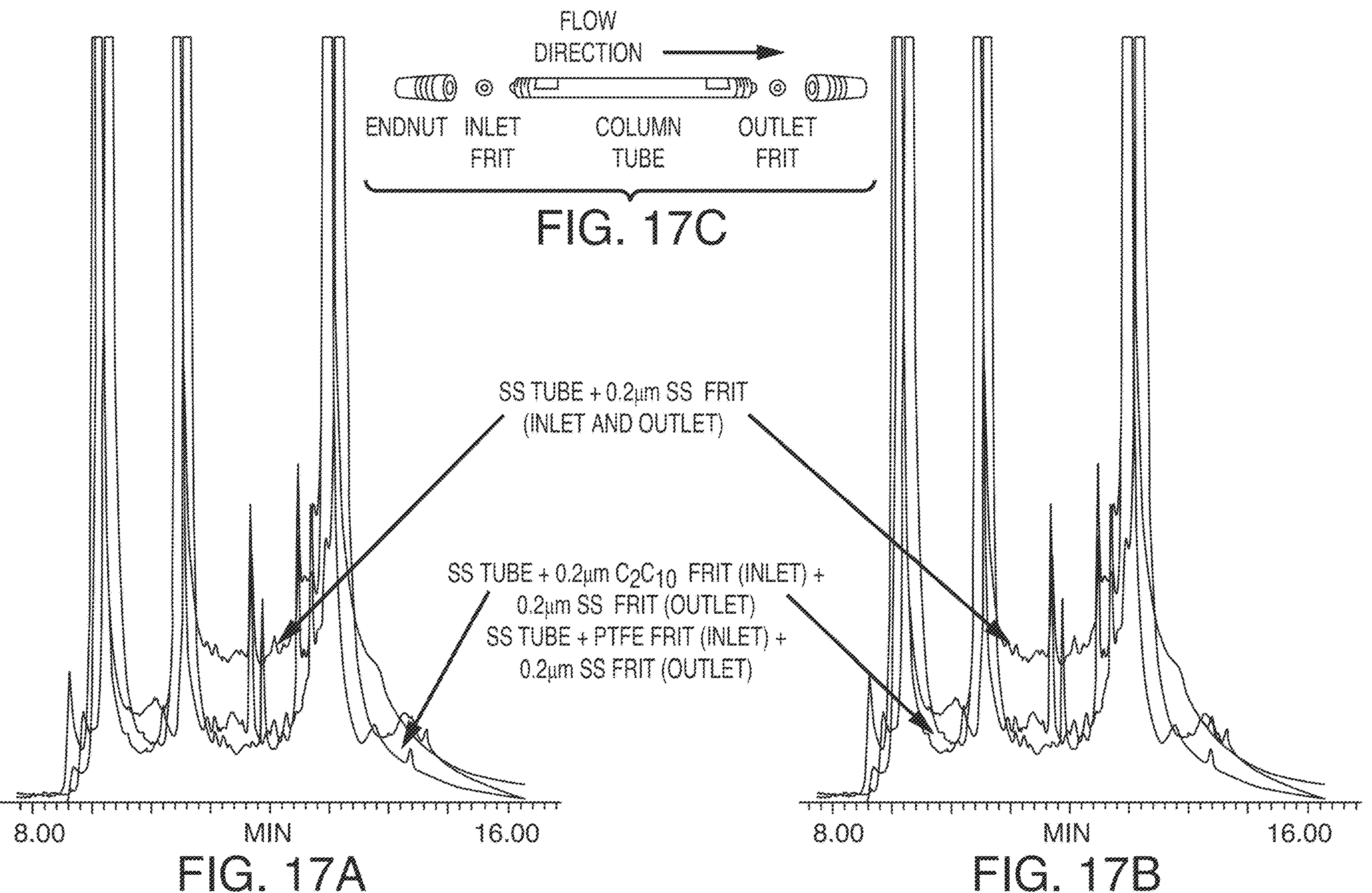
FIG. 17A shows fluorescence chromatograms of reduced, IdeS-digested NIST Reference Material 8671 and the effect on baseline return when various components of the system are coated, in accordance with an illustrative embodiment of the technology.
FIG. 17B shows reversed phase total ion chromatograms (TICs) of reduced, IdeS-digested NIST Reference Material 8671 and the effect on baseline return when various components of the system are coated, in accordance with an illustrative embodiment of the technology.
FIG. 17C is a schematic of the column tube and frits that were coated and used to obtain the chromatograms of FIGS. 17A and 17B, in accordance with an illustrative embodiment of the technology

In a separate embodiment, this invention may utilize a frit material that is constructed of a specific polymer, such that an equivalently hydrophobic surface is achieved, specifically one with a contact angle greater than 90°, more preferably greater than 100 Å. Polytetrafluoroethylene (PTFE), polymethylpentene (PMP), high density polyethylene (HDPE), low density polyethylene (LDPE) and ultra high molecular weight polyethylene (UHMWPE) are examples of hydrophobic polymers that could be suitable for use as the frit or column material in other embodiments of this invention. In fact, an inlet frit constructed of porous PTFE (1.5 mm thick, Porex PM0515) was found to favorably affect protein reversed phase baselines, in a manner similar to that of the previously mentioned VPD #7 vapor deposition coated inlet frit (FIG. 17). Frits of alternative compositions are also relevant to this invention. In yet another embodiment, parylene, that is poly p-xylene polymer, coatings could be used treat column frits and to thereby improve the properties of a protein reversed phase separation. In addition, glass membranes could be used as the basis of a frit material. Onto the glass membrane substrate, silanes could be bonded to advantageously manipulate the hydrophobicity and contact angle of the material. These and other such membranes could also be used in conjunction with a backing material, like a porous polymer sheet, to lend physical rigidity to the apparatus.

Finally, vapor deposition coated hardware has been found to be of benefit to aqueous biomolecule separations, such as protein ion exchange chromatography. When looking to understand the charge heterogeneity of a sample, an analyst will often choose to resolve the components of a sample by ion exchange. In the case of protein therapeutics, this type of analysis is performed as a means to interrogate so-called charge variants, such as deamidiation variants, that can have a detrimental effect on the efficacy of the corresponding drug product. Charge variant separations by way of ion exchange can therefore be critical to the effectiveness of a characterization approach for a protein therapeutic, most particularly a monoclonal antibody. Being such an important analytical approach, protein ion exchange must be robust and able to quickly and reliably yield accurate information.

Figure 22:
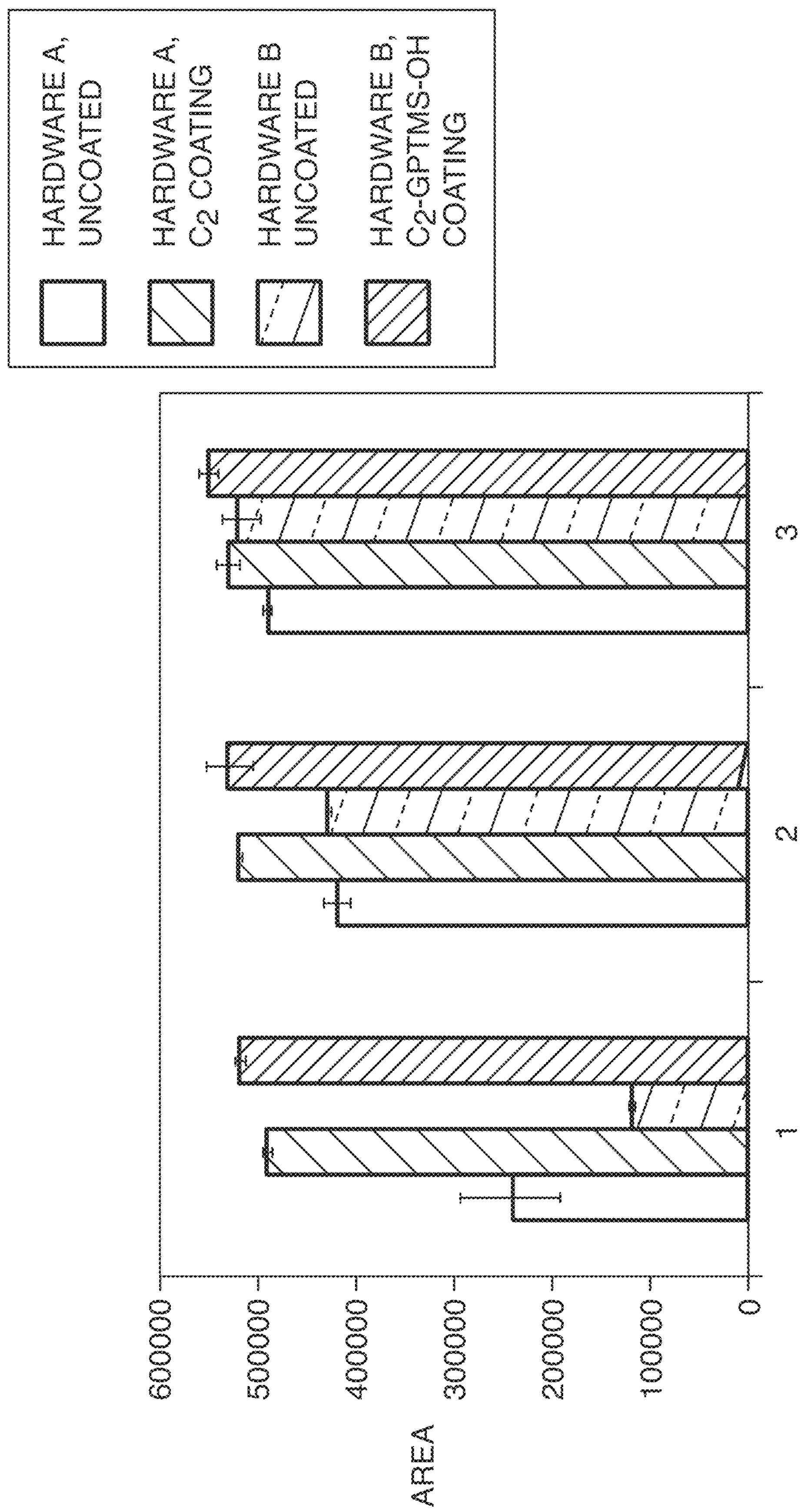
FIG. 22 presents a bar graph showing peak areas of NIST reference materials 8671 obtained from sequential cation exchange separations over three injections of the sample. This bar graph compares the peak areas for four different constructions in which the left most bar in each injection is an uncoated hardware A construction. The second from the left is a coated version of hardware A. The third bar from the left is an uncoated hardware B construction and the fourth or last bar per injection is a coated hardware B construction.
Figure 23A:
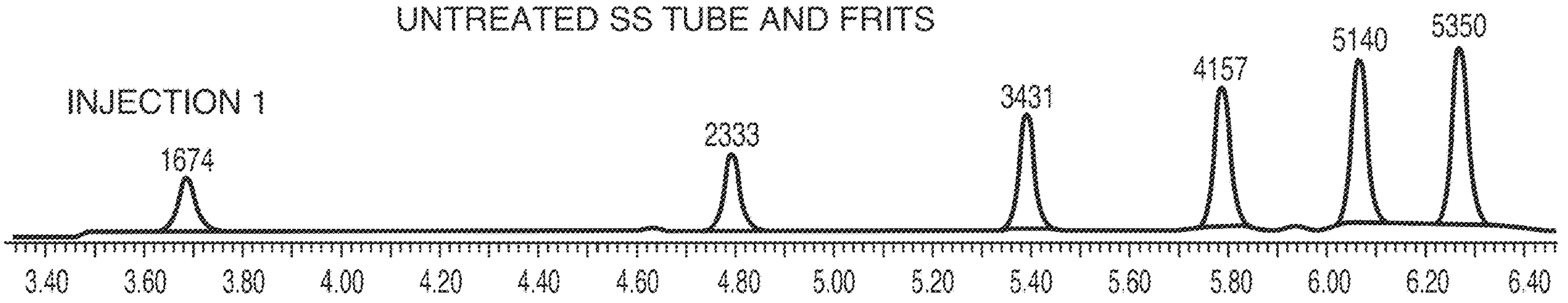
FIG. 23A is a reversed-phase chromatogram of the first injection of 5 picomoles of deoxythymidine oligomers (15, 20, 25, 30, and 35-mer) obtained from a 2.1×50 mm 1.7 μm organosilica 130 Å $C_{18}$ column constructed with an untreated stainless steel (SS) tube and frits.
Figure 23B:
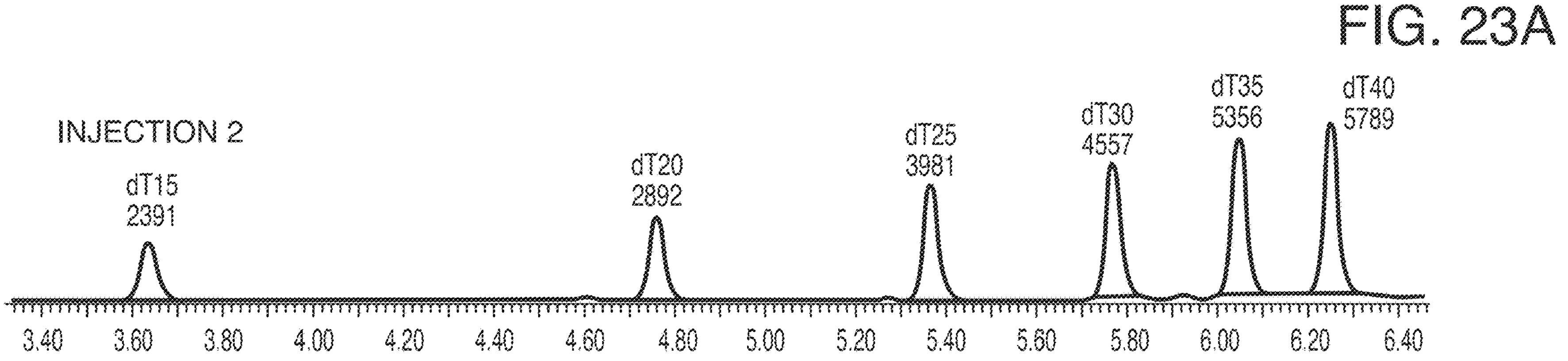
FIG. 23B is a reversed-phase chromatogram of the second injection of 5 picomoles of deoxythymidine oligomers (15, 20, 25, 30, and 35-mer) obtained from a 2.1×50 mm 1.7 μm organosilica 130 Å $C_{18}$ column constructed with an untreated stainless steel (SS) tube and frits.
Figure 23C:
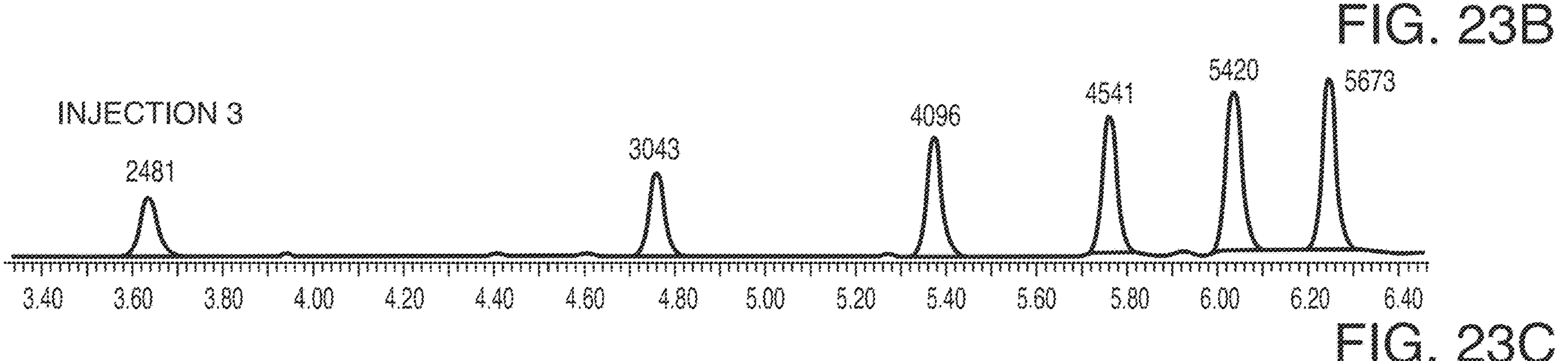
FIG. 23C is a reversed-phase chromatogram of the third injection of 5 picomoles of deoxythymidine oligomers (15, 20, 25, 30, and 35-mer) obtained from a 2.1×50 mm 1.7 μm organosilica 130 Å $C_{18}$ column constructed with an untreated stainless steel (SS) tube and frits.
Figure 23D:
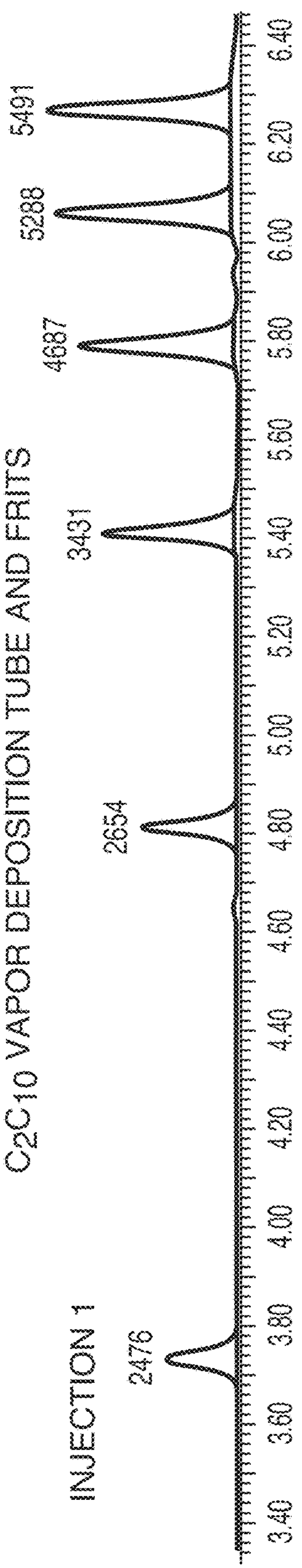
FIG. 23D is a reversed-phase chromatogram of the first injection of 5 picomoles of deoxythymidine oligomers (15, 20, 25, 30, and 35-mer) obtained from a column constructed with a $C_2C_{10}$ vapor deposition coated tube and frits, in accordance with an illustrative embodiment of the technology.
Figure 23E:
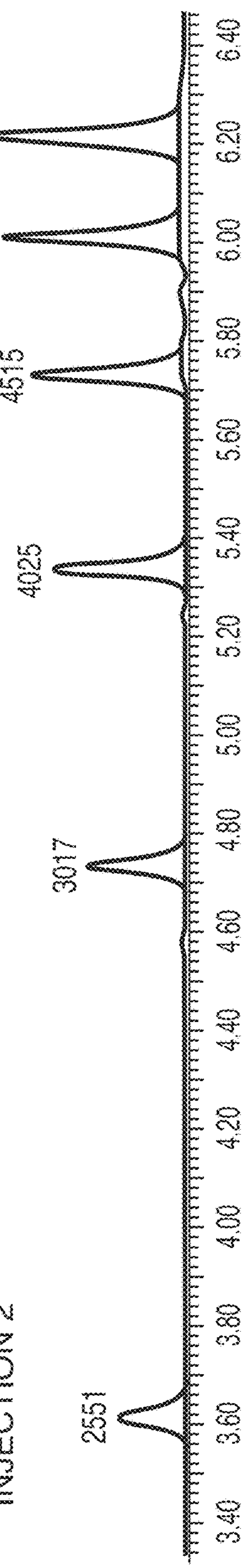
FIG. 23E is a reversed-phase chromatogram of the second injection of 5 picomoles of deoxythymidine oligomers (15, 20, 25, 30, and 35-mer) obtained from a column constructed with a $C_2C_{10}$ vapor deposition coated tube and frits, in accordance with an illustrative embodiment of the technology.
Figure 23F:
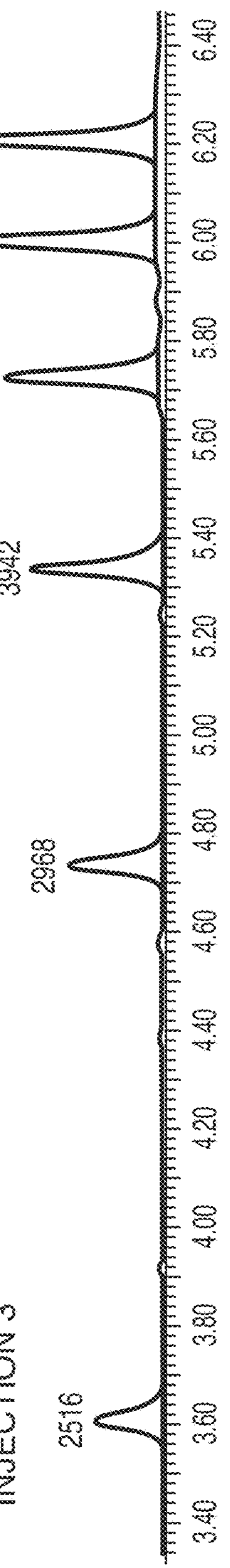
FIG. 23F is a reversed-phase chromatogram of the third injection of 5 picomoles of deoxythymidine oligomers (15, 20, 25, 30, and 35-mer) obtained from a column constructed with a $C_2C_{10}$ vapor deposition coated tube and frits, in accordance with an illustrative embodiment of the technology.
Figure 24:
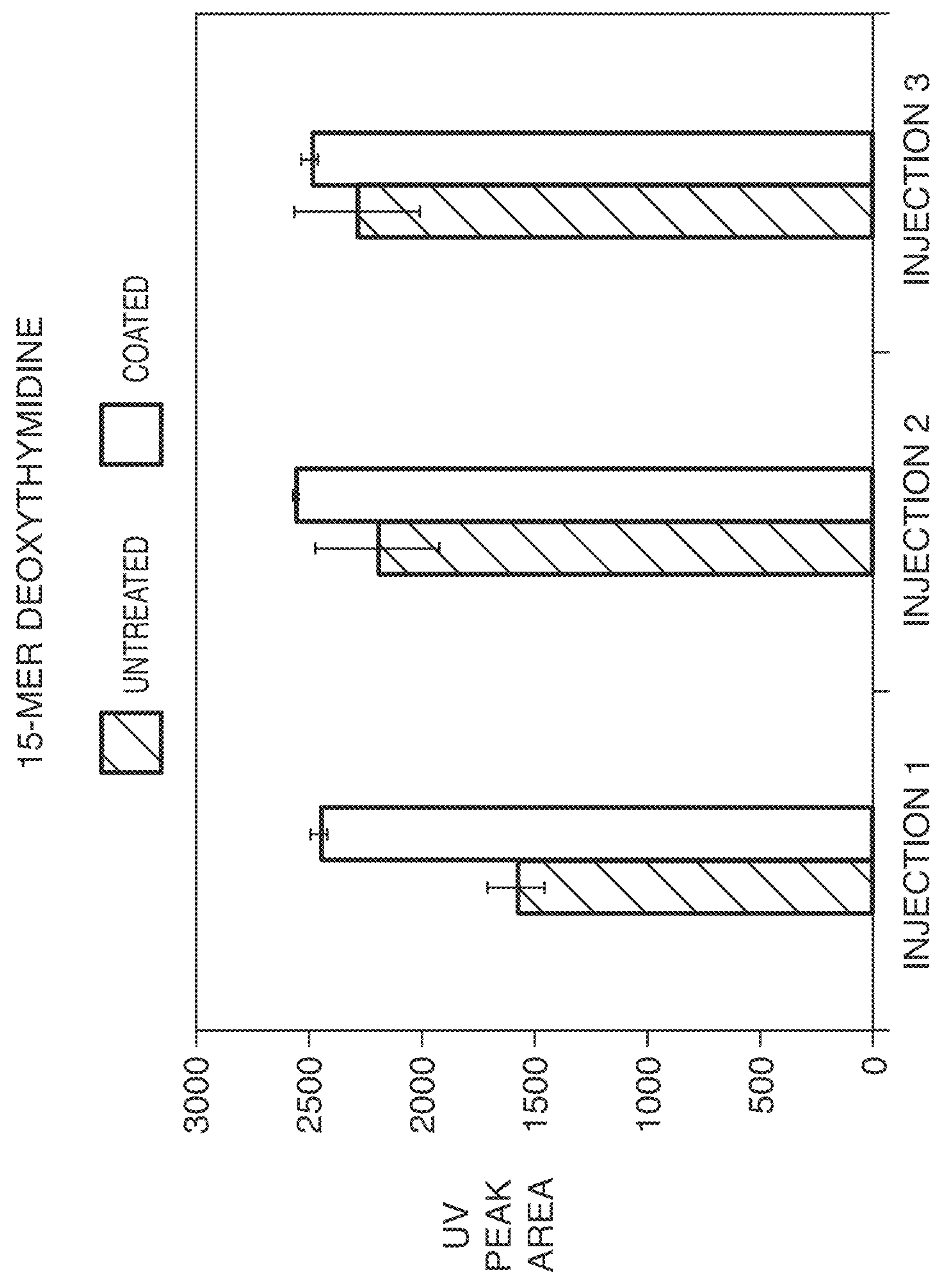
FIG. 24 is a graph showing the average UV peak areas of a 15-mer deoxythymidine analyte as observed during reversed phase chromatography and initial injections onto either a 2.1×50 mm 1.7 μm organosilica 130 Å $C_{18}$ column constructed with untreated stainless steel (SS) or $C_2C_{10}$ vapor deposition coated components, in accordance with an illustrative embodiment of the technology. Analyses were performed in duplicate using two untreated columns and two $C_2C_{10}$ vapor deposition coated columns.
Figures 25A, 25B:
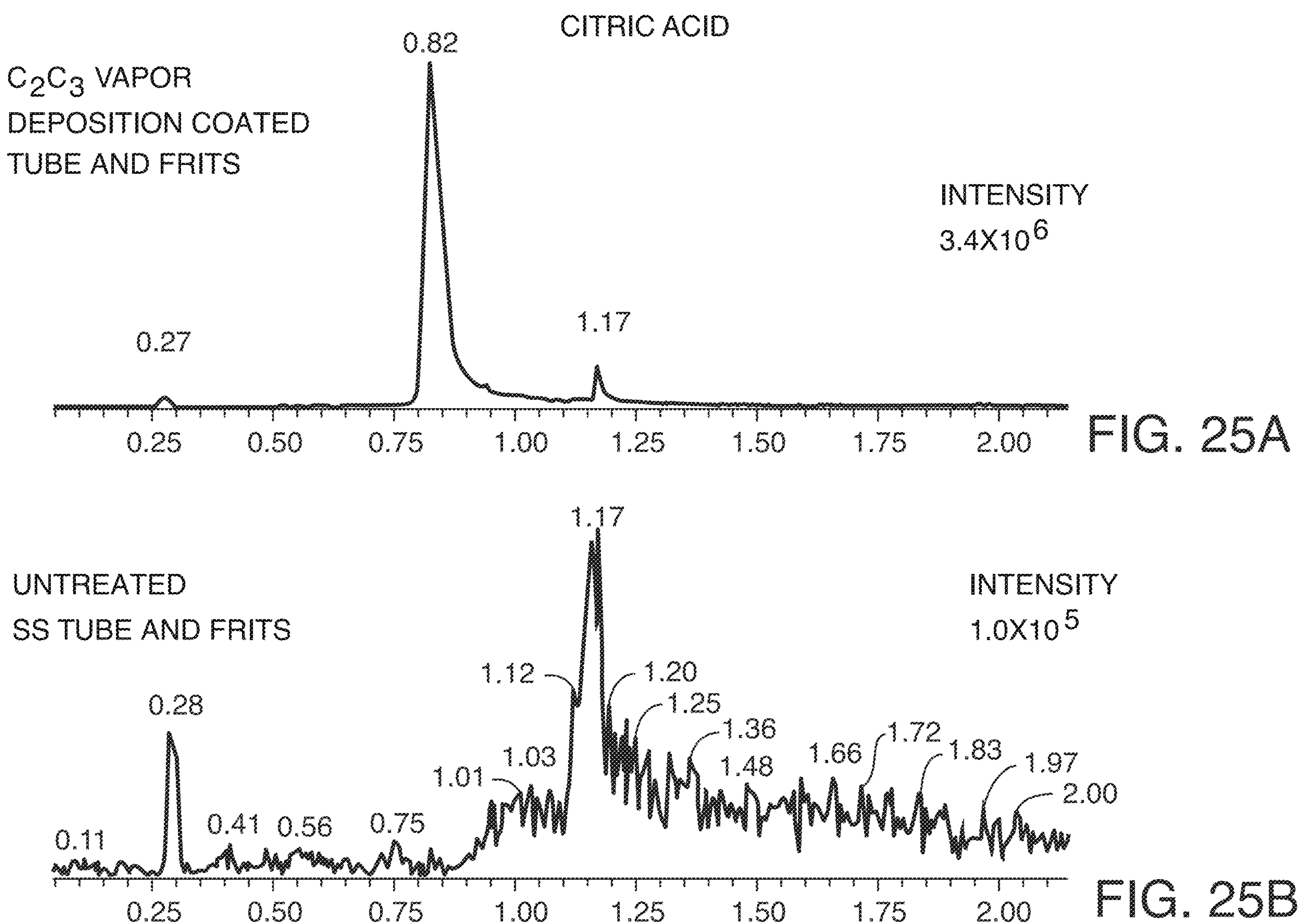
FIG. 25A is a reversed phase MRM (multiple reaction monitoring) chromatogram obtained for citric acid with the use of a 2.1×50 mm 1.8 μm silica 100 Å $C_{18}$ 1.8 m column constructed with $C_2C_3$ vapor deposition coated components, in accordance with an illustrative embodiment of the technology.
FIG. 25B is a reversed phase MRM (multiple reaction monitoring) chromatogram obtained for citric acid with the use of a 2.1×50 mm 1.8 μm silica 100 Å $C_{18}$ 1.8 m column constructed with untreated components.
Figures 25C, 25D:
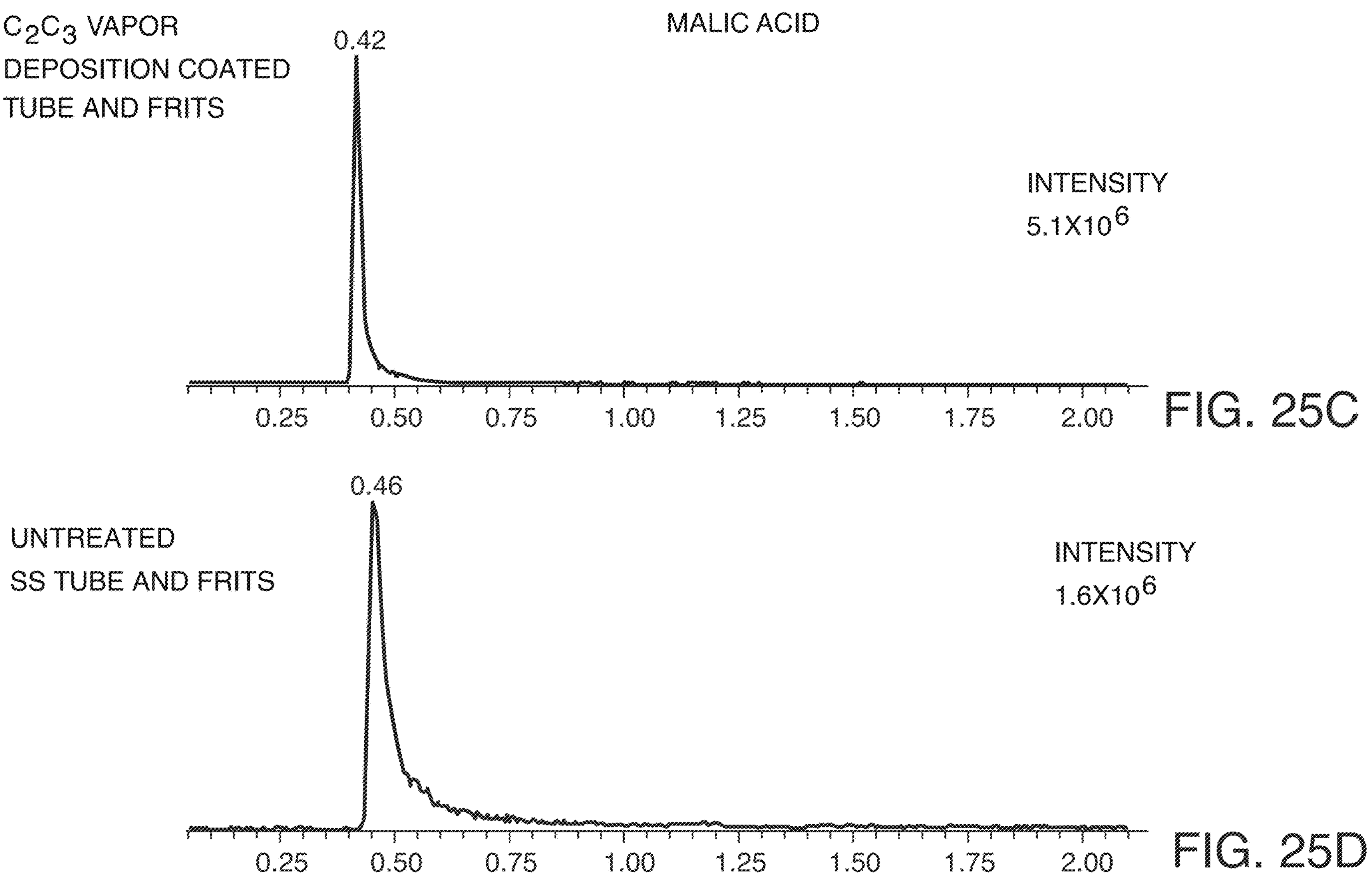
FIG. 25C is a reversed phase MRM (multiple reaction monitoring) chromatogram obtained for malic acid with the use of a 2.1×50 mm 1.8 μm silica 100 Å $C_{18}$ 1.8 m column constructed with $C_2C_3$ vapor deposition coated components, in accordance with an illustrative embodiment of the technology.
FIG. 25D is a reversed phase MRM (multiple reaction monitoring) chromatogram obtained for malic acid with the use of a 2.1×50 mm 1.8 μm silica 100 Å $C_{18}$ 1.8 m column constructed with untreated components.

To this end, ion exchange separations of a monoclonal antibody were evaluated, and the effects of using uncoated versus vapor deposition coated column hardware were contrasted. FIGS. 21A-21L presents chromatograms of NIST reference material 8671, an IgG1κ mAb, as obtained from sequential cation exchange separations and repeat injections of sample. In this evaluation, columns derived from four different constructions were tested. These columns varied with respect to both hardware design and vapor deposition coating. From the observed results, it was most apparent that uncoated hardware showed a prominent conditioning effect, as manifest in there having been low peak areas on initial injections. While not limited to theory, it is believed that the metallic surfaces of the uncoated column hardware imposed adsorptive losses on these separations and thereby hindered recovery of the sample. In contrast, vapor deposition coated hardware, both $C_2$ or $C_2$-GPTMS-OH chemistries, yielded comparatively high peak areas even on the very first runs of the columns (FIG. 22). That is, coated hardware showed no evidence of requiring a passivation step, giving it the unique advantage of more quickly providing accurate chromatographic data. Here, it is clear that the noted vapor deposition coatings enhance the chromatographic properties of metallic hardware. Little can be seen in the way of distinguishing the chromatographic performance of the two tested vapor deposition coatings, namely the $C_2$ and $C_2$-GPTMS-OH chemistries. However, the $C_2$-GPTMS-OH coating has an inordinately low contact angle (as does $C_2$PEO). It is foreseeable that certain types and classes of biomolecules will require a highly hydrophilic flow path. One such example could indeed be aqueous protein separations in which hydrophobic interactions could lead to poor recovery or peak tailing. As a whole, it is believed that vapor deposition coated hardware will show advantages for numerous forms of aqueous separations, including but not limited to ion exchange, size exclusion and hydrophobic interaction chromatography, and that the most ideal vapor deposition coating would be one that is very hydrophilic. Accordingly, in an embodiment of this invention, a vapor deposition coated column is used to improve the recovery of samples from aqueous chromatographic separations. In a more specific embodiment, a vapor deposition coating with a contact angle less than 200 is used to improve the recovery of biomolecules in ion exchange, size exclusion or hydrophobic interaction chromatography.

EXAMPLES

Example 1A $C_2$ and $C_2C_{10}$ Vapor Deposition Coatings

Prior to coating, all metal components are passivated according to a nitric acid passivation. Passivated parts and a silicon wafer are then introduced to the vapor deposition chamber and vacuum is established. The first step is a 15 minute, 200 Watt, 200 cc/min oxygen plasma cleaning step. Next is the first vapor deposition cycle. Each vapor deposition cycle contains a silane vapor deposition, followed by the introduction of water vapor for silane hydrolysis. The silane vapor is delivered at a pressure of 2.0 Torr for 5 seconds, and then the water vapor is delivered at a pressure of 50 Torr for 5 seconds. Following delivery, the silane and water is left to react with the substrate for 15 minutes. This cycle is repeated to produce the desired number of layers and coating thickness. An additional processing cycle can be implemented to functionalize the coating with yet another silane (if two layers of different materials is desired—this is optional). Moreover, a post coating annealing step can be used to further cross-link and increase the hydrophobicity of the coating. Typically, the annealing cycle involves subjecting the coating to 200° C. for 3 hours under vacuum.

A silicon wafer is used as a coupon to measure the thickness and contact angle of the coating. To measure the thickness, a Gaertner Scientific Corporation stokes ellipsometer model LSE is used. By analyzing the change in polarization of light, and comparing to a model, the film thickness can be established. To measure the contact angle, a Ramé-Hart goniometer model 190 is used. After dropping a controlled amount of water onto a perfectly level silicon wafer, optical techniques are used to measure the contact angle.

Example 2

$C_2$-GPTMS-OH Vapor Deposition Coatings

Prior to coating, all metal components are passivated according to a nitric acid passivation. Passivated parts and a silicon wafer are then introduced to the vapor deposition chamber and vacuum is established. The first step is a 15 minute, 200 Watt, 200 cc/min oxygen plasma cleaning step. Next is the first vapor deposition cycle. Each vapor deposition cycle contains a silane vapor deposition, followed by the introduction of water vapor for silane hydrolysis. The silane vapor is delivered at a pressure of 2.0 Torr for 5 seconds, and then the water vapor is delivered at a pressure of 50 Torr for 5 seconds. Following delivery, the silane and water is left to react with the substrate for 15 minutes. This cycle is repeated to produce the desired number of layers and coating thickness. In this example, the bis(trichlorosilyl) ethane silane is used to build up an adhesion or primer layer of approximately 800 Å. After $C_2$ deposition, the 3-(glycidoxypropyl)trimethoxysilane is delivered anhydrously to a pressure of 0.4 Torr in the vapor deposition chamber. This silane vapor is left to react with the $C_2$ coated substrate for one hour. This process results in an epoxide terminated coating, with a contact angle of 50°. After deposition, the next step is to hydrolyze the epoxide groups. This is performed either in the liquid phase or the vapor phase, with 0.1M acetic acid. After epoxide hydrolysis, the contact angle is <20°. Contact angle measurements are taken on a silicon wafer using a Ramé-Hart goniometer model 190.

Example 3

Alternative Contact Angle Measurement

It is relatively easy to measure the contact angle on the flat silicon wafers using a goniometer. However, not all our substrates have such smooth and flat surfaces. Frits can be considered a chromatography column's most important substrate, since the fluidic surface area to mass ratio is higher in the frit than in any other column hardware component. In order to measure the solid-liquid wetting properties of frit porosity, and confirm the presence of a coating, we can use the bubble point test. The bubble point test is used to determine the largest pore diameter of a frit structure, and the bubble point pressure is related to this diameter with the following equation:

$$P=(2\gamma \cos \theta)/r$$

Where,

P=bubble point pressure, Pa (measured)

γ=surface tension of test liquid, N/m (known)

Θ=contact angle between test liquid and pore material (calculated)

r=largest pore radius, m (calculated)

This equation is from ASTM E128 and is derived from the equilibrium condition of capillary rise.

Figure 18:
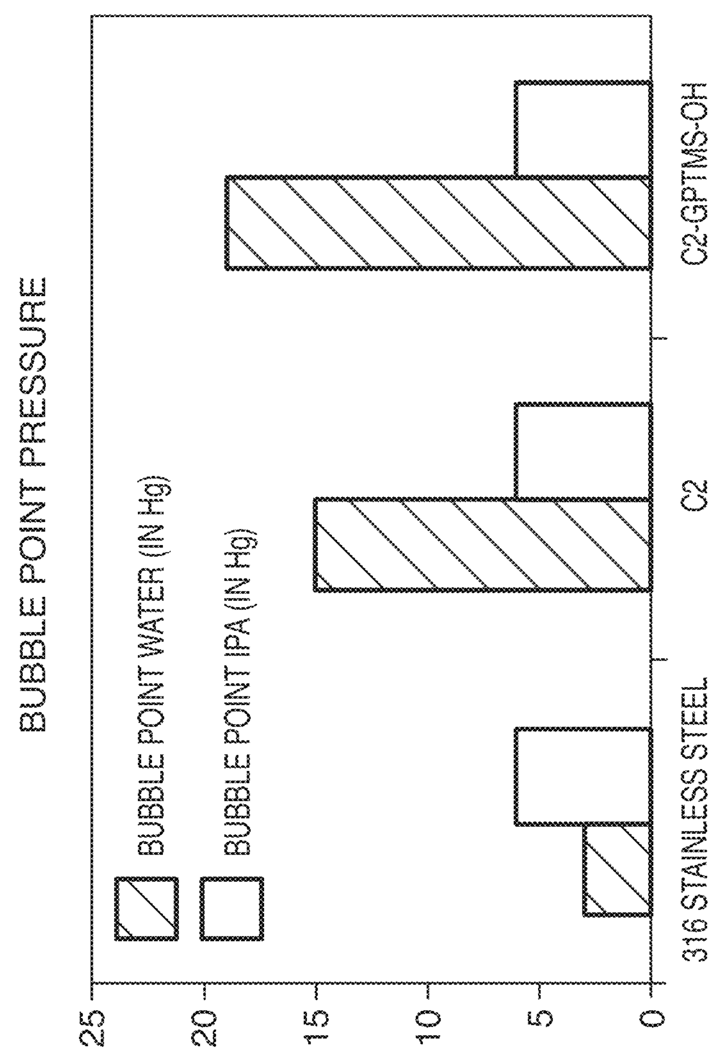
FIG. 18 is a bar graph showing bubble point pressure in each of water and IPA for a non-coated stainless steel frit and stainless steel frits coated in accordance with one or more illustrative embodiments of the technology. The bubble point in water is provided as the left bar, and the bubble point in IPA is provided as the right bar for each type of frit.
Figure 19:
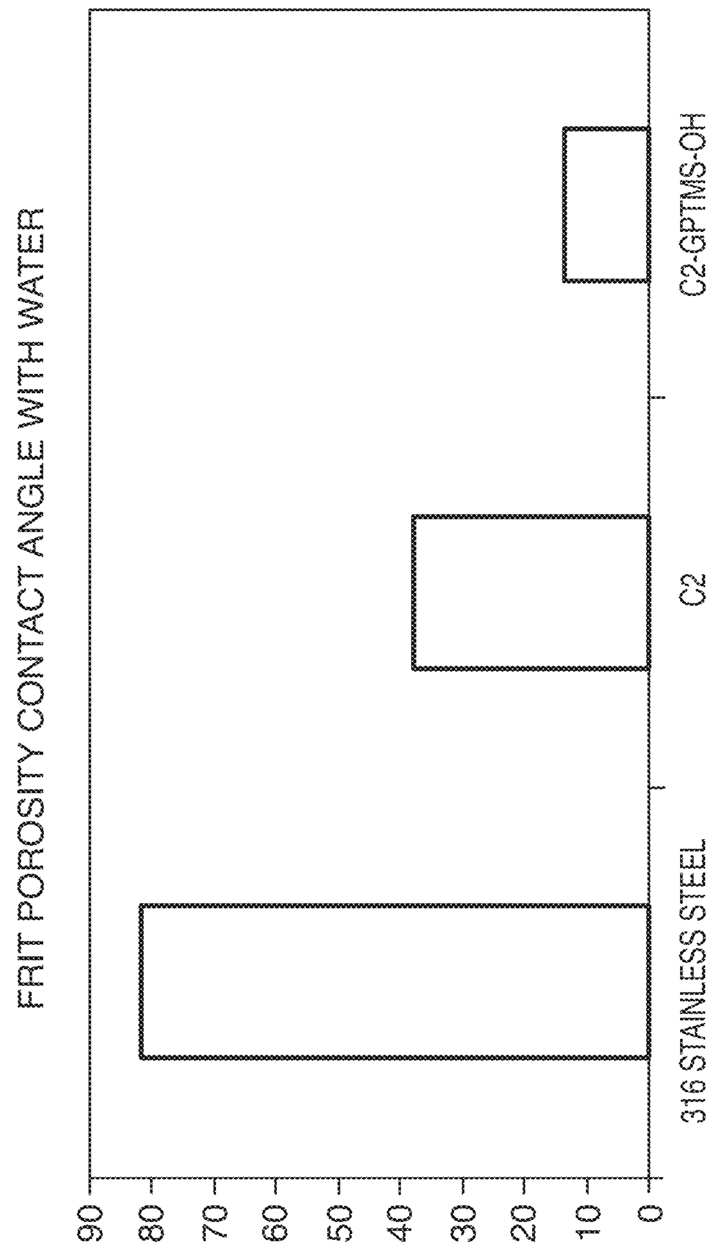
FIG. 19 is a bar graph showing a comparison of frit porosity contact angle with water for a non-coated stainless steel frit versus stainless steel frits coated in accordance with one or more embodiments of the technology.

Using the bubble point test to calculate a contact angle requires two steps. This first is to test the frit in IPA, and assume a 0 contact angle, since IPA has excellent wetting characteristics. This will yield a maximum pore diameter. The next step is to repeat the experiment with water as the test liquid, and the known pore radius. This will yield the contact angle with water, relative to the assumed 0 degree contact angle of IPA. FIG. 18 displays the different bubble point pressures recorded versus coating composition. FIG. 19 displays the derived contact angles versus coating composition. These values correlate well with measurements taken with a goniometer on a flat silicon wafer.

Example 4

Corrosion Performance of Silane Coatings

Figure 20:
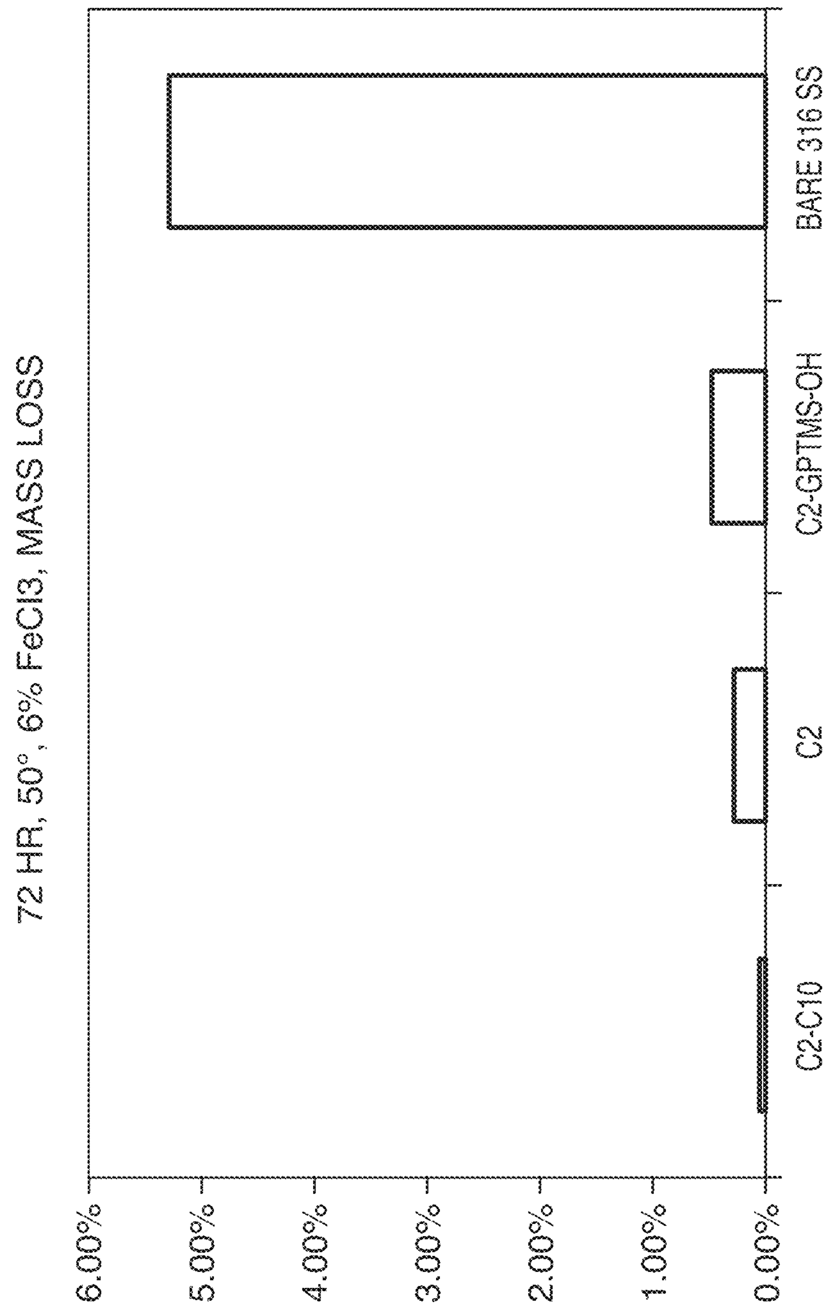
FIG. 20 is a bar graph showing a comparison of mass loss test according to ASTM G48 Method A for a bare or uncoated stainless steel frit versus stainless steel frits coated in accordance with one or more embodiments of the technology.
Figure 21A:
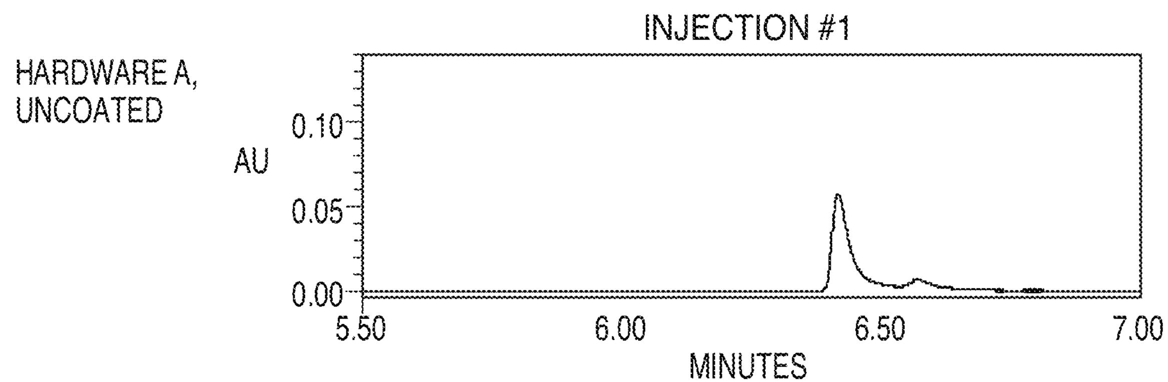
FIG. 21A is a chromatogram of NIST reference material 8671, an IgG1κ mAb, as obtained from injection 1 using hardware A, and uncoated.
Figure 21B:
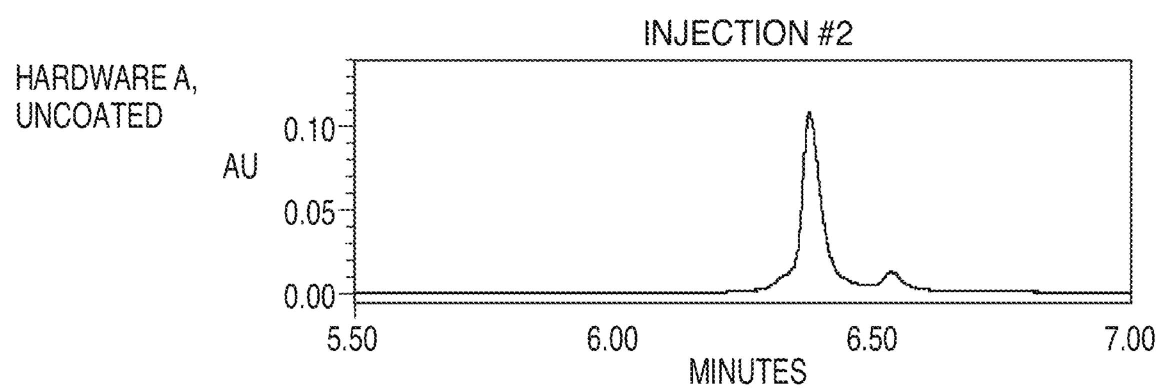
FIG. 21B is a chromatogram of NIST reference material 8671, an IgG1κ mAb, as obtained from injection 2 using hardware A, uncoated.
Figure 21C:
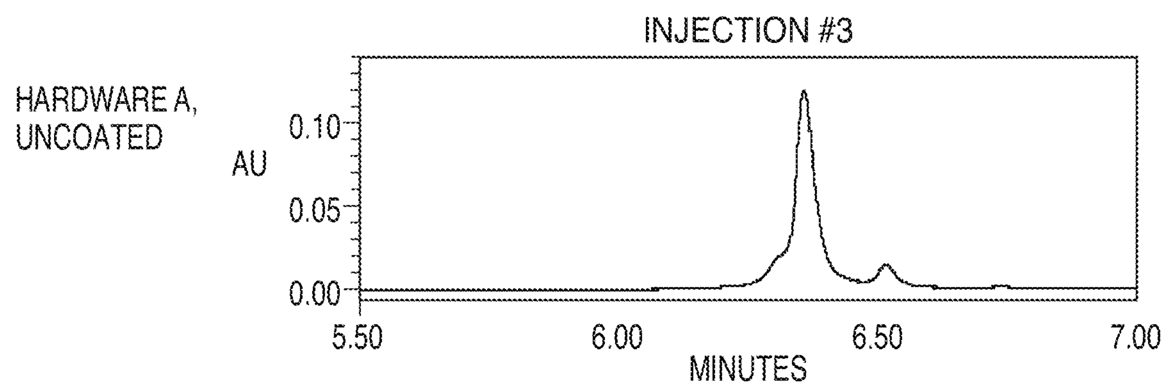
FIG. 21C is a chromatogram of NIST reference material 8671, an IgG1κ mAb, as obtained from injection 3 using hardware A, uncoated.
Figure 21D:
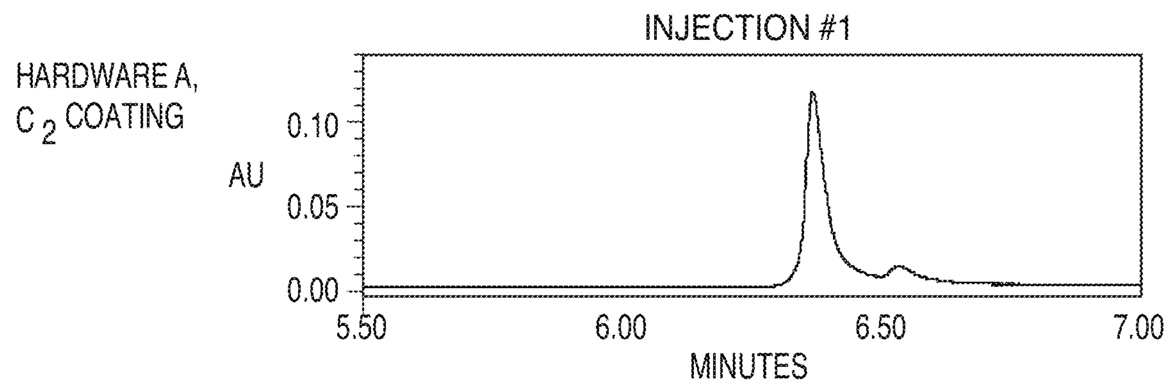
FIG. 21D is a chromatogram of NIST reference material 8671, an IgG1κ mAb, as obtained from injection 1 using hardware A, with a $C_2$ coating, in accordance with an illustrative embodiment of the technology.
Figure 21E:
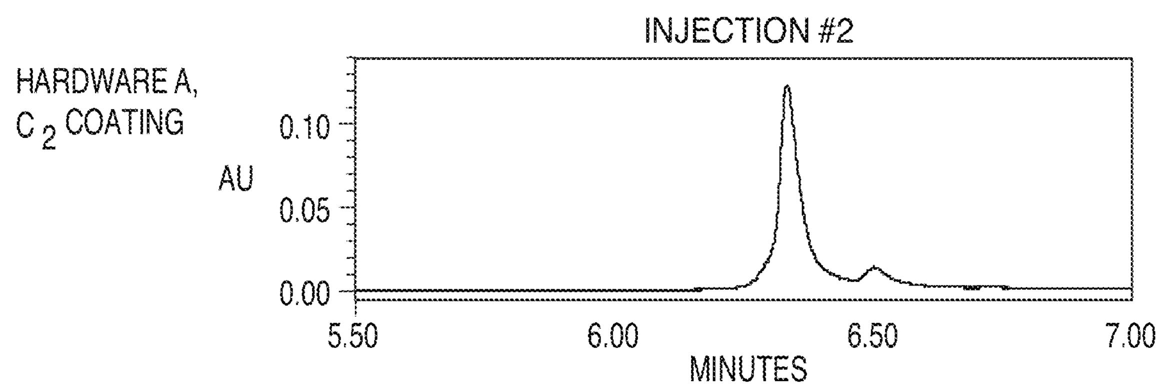
FIG. 21E is a chromatogram of NIST reference material 8671, an IgG1κ mAb, as obtained from injection 2 using hardware A, with $C_2$ coating, in accordance with an illustrative embodiment of the technology.
Figure 21F:
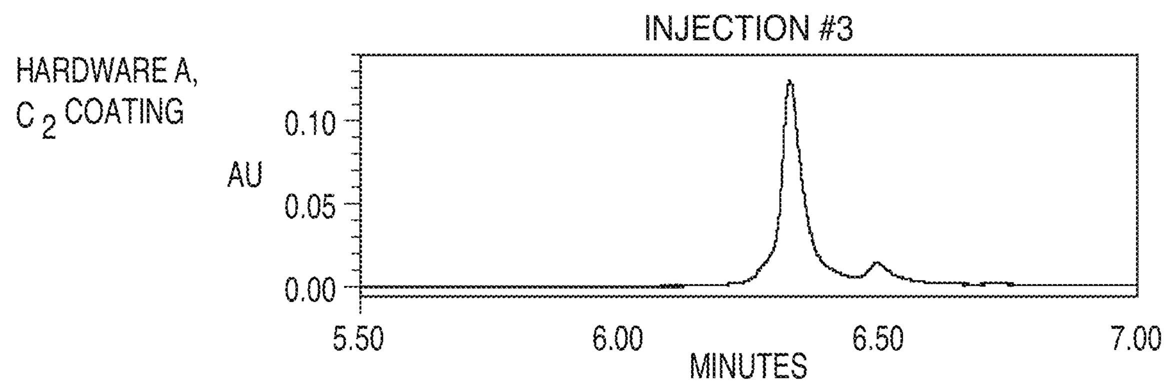
FIG. 21F is a chromatogram of NIST reference material 8671, an IgG1κ mAb, as obtained from injection 3 using hardware A, with $C_2$ coating, in accordance with an illustrative embodiment of the technology.
Figure 21G:
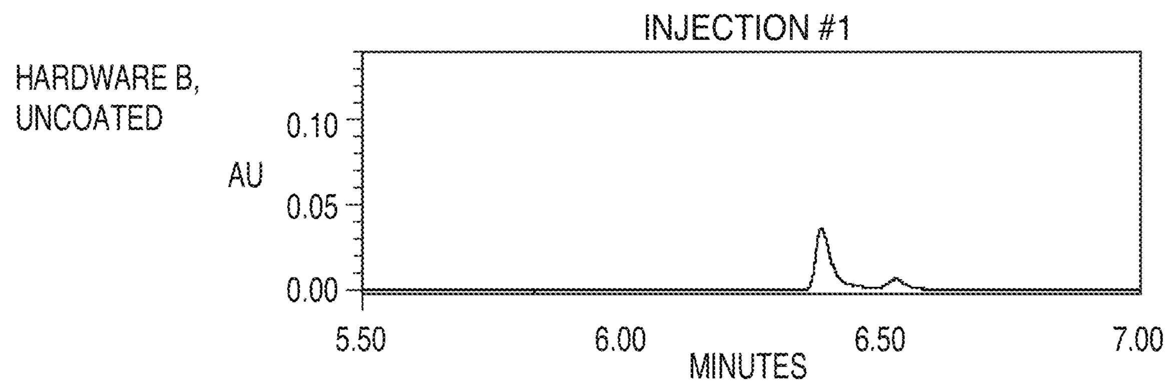
FIG. 21G is a chromatogram of NIST reference material 8671, an IgG1κ mAb, as obtained from injection 1 using hardware B, and uncoated.
Figure 21H:
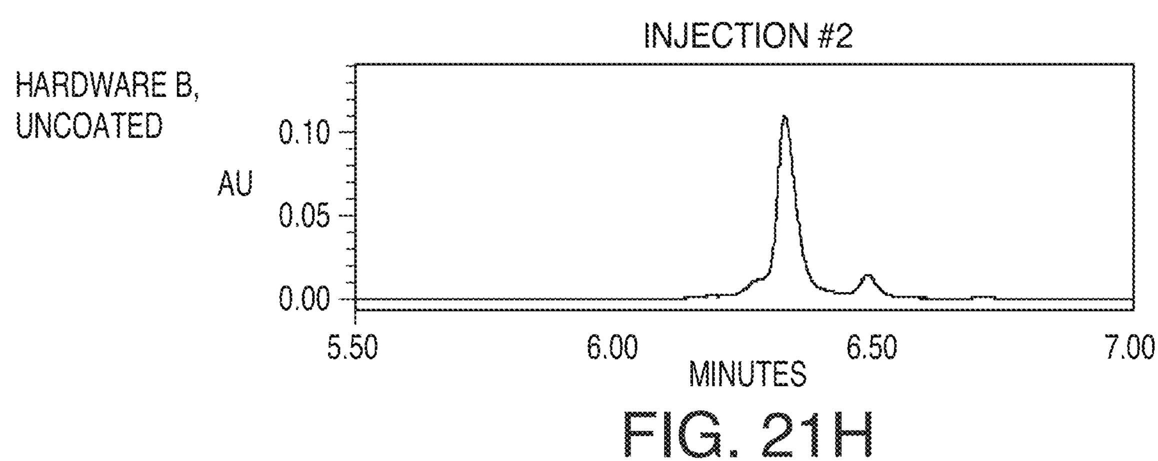
FIG. 21H is a chromatogram of NIST reference material 8671, an IgG1κ mAb, as obtained from injection 2 using hardware B, uncoated.
Figure 21I:
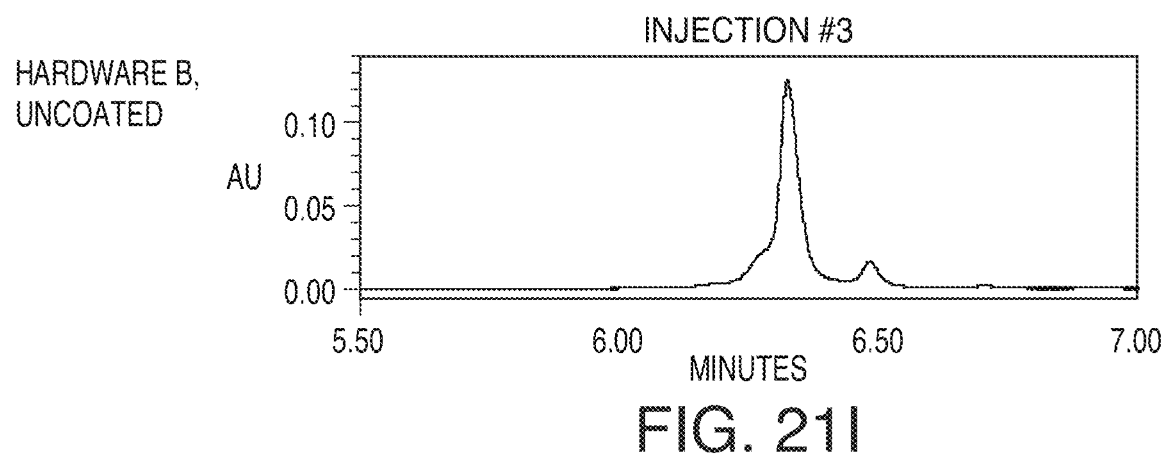
FIG. 21I is a chromatogram of NIST reference material 8671, an IgG1κ mAb, as obtained from injection 3 using hardware B, uncoated.
Figure 21J:
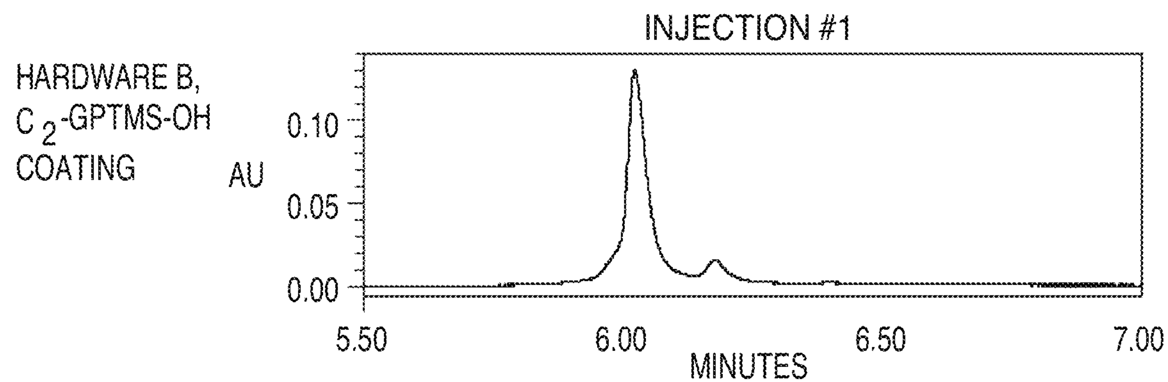
FIG. 21J is a chromatogram of NIST reference material 8671, an IgG1κ mAb, as obtained from injection 1 using hardware B, with a $C_2$-GPTMS-OH coating, in accordance with an illustrative embodiment of the technology.
Figure 21K:
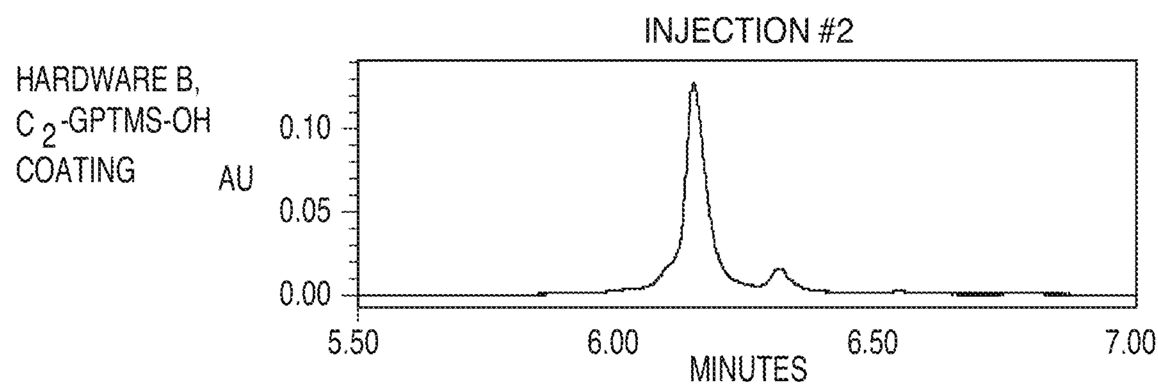
FIG. 21K is a chromatogram of NIST reference material 8671, an IgG1κ mAb, as obtained from injection 2 using hardware B, with a $C_2$-GPTMS-OH coating, in accordance with an illustrative embodiment of the technology.
Figure 21L:
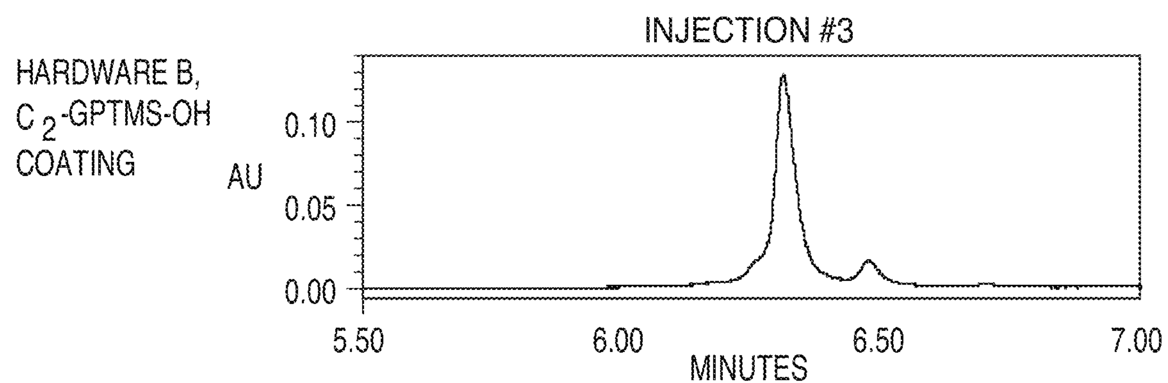
FIG. 21L is a chromatogram of NIST reference material 8671, an IgG1κ mAb, as obtained from injection 3 using hardware B, with a $C_2$-GPTMS-OH coating, in accordance with an illustrative embodiment of the technology.

ASTM G48 Method A is used to rank the relative pitting corrosion performance of various grades of stainless steel. It consists of placing a part in ~6% ferric chloride solution for 72 hours, and checking the mass loss of your component. The test can be run at room temperature, or at slightly elevated temperatures to increase the corrosion rate. The ferric chloride solution is similar to the environment inside a pit during "non-accelerated" pitting corrosion; an acidic, oxidizing, chloride containing environment. When an entire part of interest is submerged in the ferric chloride solution, pitting corrosion is greatly accelerated, with normal test times only being 72 hours. FIG. 20 displays the corrosion performance of a non-coated column tube, and various coatings on a column tube. The improvement ranges from ~10× to 100×.

Example 5

HILIC-Fluorescence-MS of Phosphoglycans

A recombinant alpha-galactosidase was diluted to 2 mg/mL. A 7.5 uL aliquot of the protein solution was then added to a 1 mL reaction tube containing 15.3 μL of water and 6 μL of buffered 5% RapiGest SF solution-commercially available from Waters Corporation (Milford, Mass.) (50 mM HEPES-NaOH, pH 7.9). The mixture was placed in a heat block at 90° C. for 3 minutes. Thereafter, the reaction tube was allowed to cool at room temperature for 3 minutes. To the reaction tube, 1.2 μL of PNGase F was then added and incubated at 50° C. for 5 minutes. After incubation, the reaction was again allowed to cool at room temperature for 3 minutes. To a vial containing 9 mg of RapiFluor-MS reagent, 131 uL of anhydrous DMF was added and vortexed to create a labeling solution. A 12 uL volume of this labeling solution was next added to the reaction tube. This labeling reaction was allowed to proceed for 5 minutes to produce the final sample.

A fully porous amide HILIC stationary phase (1.7 um, 130 Å) was used in a 2.1×50 mm column dimension to chromatograph the samples at a flow rate of 0.4 mL/min and temperature of 60° C. The gradient flow conditions initiated with 75.0% organic solvent (Acetonitrile) and 25.0% aqueous eluent (50 mM ammonium formate, pH 4.4) followed by a 11.66 min linear gradient to 54.0% organic/46% aqueous eluent. The column was then cycled through an aqueous regeneration step at 100% aqueous mobile phase at a flow rate of 0.2 mL/min for one minute. After the aqueous regeneration, the column was equilibrated at initial conditions for 4 minutes. Species eluting during the above separations were detected serially via fluorescence (Ex 265/Em 425, 2 Hz) followed by online ESI-MS. Mass spectra were acquired with a Xevo G2-XS QToF mass spectrometer operating with a capillary voltage of 2.2 kV, source temperature of 120° C., desolvation temperature of 500° C., and sample cone voltage of 50 V. Mass spectra were acquired at a rate of 2 Hz with a resolution of approximately 40,000 over a range of 700-2000 m/z. FIGS. 4A-4C present comparisons of this HILIC separation of RapiFluor-MS labeled released N-glycans from a recombinant alpha-galactosidase as performed with columns constructed of varying coatings and materials. FIGS. 6A-6C present comparisons of this HILIC separation as performed with columns constructed of varying coatings and materials in conjunction with a sample needle and column inlet tubing constructed of varying coatings.

Example 6

RPLC-UV-MS of Phosphopeptides

A vial of phosphopeptide test standard (Waters Corporation, Milford, Mass.) was reconstituted with 50 uL of 0.1% formic acid. A fully porous CSH C18 stationary phase material (1.7 um, 130 Å) was used in 2.1×50 mm column dimensions to chromatograph the samples at a flow rate of 0.2 mL/min at a temperature of 60° C. The gradient flow conditions initiated with 0.7% organic mobile phase (0.075% formic acid in acetonitrile) and 99.3% aqueous mobile phase (0.1% formic acid) followed by a 30 min linear gradient to 50% organic/50% aqueous. Species eluting during the above separations were detected serially via UV (220 nm) followed by online ESI-MS. Mass spectra were acquired with a Xevo G2-XS QToF mass spectrometer operating with a capillary voltage of 1.5 kV, source temperature of 100° C., desolvation temperature of 350° C., and sample cone voltage of 50 V. Mass spectra were acquired at a rate of 2 Hz with a resolution of approximately 40,000 over a range of 500-6500 m/z. FIGS. 7A-7C present comparisons of this reversed phase separation of the phosphopeptide standard performed with columns constructed of varying coatings and materials.

Example 7

RPLC/MS of Small Biomolecules (Nucleotides and Sugar Phosphates)

RPLC/MS analyses of two nucleotides (adenosine monophosphate and adenosine triphosphate) and two sugar phosphates (glucose-6-phosphate and fructose-6-phosphate) were performed by reversed phase separations with an organosilica C18 stationary phase according to the methods parameters noted below. FIGS. 8-11 present comparisons of these reversed phase separations as performed with columns constructed of varying coatings and materials.

| LC Conditions | |
|---|---|
| Columns: | BEH C18 130Å 1.7 μm 2.1 × 100 mm |
| Mobile Phase A: | 0.25% Octylamine in $H_2O$ pH adjusted to 9 with acetic acid |
| Mobile Phase B: | ACN |
| Column Temperature: | 35° C. |
| Injection Volume: | 10 μL (100 ng/ml sample concentrations) |
| Sample Diluent: | Water |
| Detection: | Tandem quadrupole mass spectrometer operating in ESI negative ionization mode and with MRM acquisition. |

Gradient Table:

| Time(min) | Flow Rate(mL/min) | % A | % B | Curve |
|---|---|---|---|---|
| Initial | 0.450 | 95 | 5 | Initial |
| 5 | 0.450 | 75 | 25 | 6 |
| 10 | 0.450 | 75 | 25 | 6 |
| 20 | 0.450 | 50 | 50 | 6 |
| 21 | 0.450 | 5 | 95 | 6 |
| 22 | 0.450 | 95 | 5 | 6 |
| 30 | 0.450 | 95 | 5 | 6 |

Example 8

LC-Fluorescence-MS of Highly Sialylated Glycans Using Charge Surface Reversed Phase Chromatography RapiFluor-MS labeled N-glycans were prepared from bovine fetuin (Sigma F3004) according to a previously published protocol (Lauber, M. A.; Yu, Y. Q.; Brousmiche, D. W.; Hua, Z.; Koza, S. M.; Magnelli, P.; Guthrie, E.; Taron, C. H.; Fountain, K. J., Rapid Preparation of Released N-Glycans for HILIC Analysis Using a Labeling Reagent that Facilitates Sensitive Fluorescence and ESI-MS Detection. Anal Chem 2015, 87 (10), 5401-9). Analyses of these released glycans were performed using a Waters ACQUITY UPLC H-Class Bio LC system and a separation method based on a previously described charged surface reversed phase chromatographic material described in International Application No. PCT/US2017/028856, entitled “CHARGED SURFACE REVERSED PHASE CHROMATOGRAPHIC MATERIALS METHOD FOR ANALYSIS OF GLYCANS MODIFIED WITH AMPHIPATHIC, STRONGLY BASED MOIETIES” (and incorporated by reference). Specifically, RapiFluor-MS labeled glycans (e.g., glycans labeled with the labeling reagent discussed in PCT/US2017/028856 were separated according to a mixed mode separation using a fully porous (130 Å) 1.7 μm diethylaminopropyl high purity chromatographic material (DEAP HPCM) in a 2.1×100 mm column configuration. Details of the method are described below. FIGS. 12 and 13 present comparisons of this mixed mode separation of sialylated glycans as performed with columns constructed of varying coatings and materials.

| LC Conditions | |
|---|---|
| Column: | DEAP HPCM 130Å 1.7 μm 2.1 × 100 mm |
| Mobile Phase A: | Water and 100 mM Formic Acid/100 mM Ammonium Formate in 60% |
| Mobile Phase B: | 100 mM Formic Acid/100 mM Ammonium Formate in 60% ACN |
| Column Temperature: | 60° C. |
| Injection Volume: | 4 μL |
| Sample Concentration: | 10 pmol/μL |
| Sample Diluent: | Water |
| Fluorescence Detection: | Ex 265 nm/Em 425 nm (10 Hz) |

| Gradient Table: | | | | |
|---|---|---|---|---|
| Time(min) | Flow Rate(mL/min) | % A | % B | Curve |
| Initial | 0.400 | 100.0 | 0.00 | Initial |
| 24.00 | 0.400 | 78.0 | 22.0 | 6 |
| 24.20 | 0.400 | 0.0 | 100.0 | 6 |
| 24.40 | 0.400 | 0.0 | 100.0 | 6 |
| 24.60 | 0.400 | 100.0 | 0.0 | 6 |
| 30.00 | 0.400 | 100.0 | 0.0 | 6 |

Example 9

LC/MS of a Reduced, IdeS Digested Monoclonal Antibody (mAb)

Formulated NIST mAb Reference Material 8671 (an IgG1×) was added to 100 units of IdeS and incubated for 30 minutes at 37° C. The resulting IdeS-digested mAb was then denatured and reduced by the addition of 1M TCEP and solid GuHCl. The final buffer composition for the denaturation/reduction step was approximately 6 M GuHCl, 80 mM TCEP, and 10 mM phosphate (pH 7.1). IdeS-digested NIST RM 8671 (1.5 mg/mL) was incubated in this buffer at 37° C. for 1 hour, prior to being stored at 4° C. Reversed phase (RP) separations of the reduced, IdeS-fragmented mAb were performed to demonstrate the effects of employing different vapor deposition coated column hardware pieces, namely the column tube and the frits that enclose the stationary phase into its packing.

A C4 bonded superficially porous stationary phase (2 μm, Rho 0.63, 290 Å) was used in a 2.1×50 mm column dimension to chromatograph the samples at a flow rate of 0.2 mL/min and temperature of 80° C. across a linear gradient consisting of a 20 min linear gradient from 15 to 55% organic mobile phase (aqueous mobile phase: 0.1% (v/v) formic acid in water; organic mobile phase: 0.1% (v/v) formic acid in acetonitrile). Species eluting during the above separations were detected serially via fluorescence (Ex 280/Em 320, 10 Hz) followed by online ESI-MS. Mass spectra were acquired with a Synapt G2-S mass spectrometer operating with a capillary voltage of 3.0 kV, source temperature of 150° C., desolvation temperature of 350° C., and sample cone voltage of 45 V. Mass spectra were acquired at a rate of 2 Hz with a resolution of approximately 20,000 over a range of 500-4000 m/z. FIGS. 14-17 present comparisons of this reversed phase C4 separation of reduced, IdeS-digested NIST Reference Material 8671 as performed with columns constructed of varying coatings and materials.

Example 10

Ion Exchange Chromatography

NIST mAb Reference Material 8671 (an IgG1κ) was separated using columns constructed from a 3 μm non-porous cation exchange stationary phase packed into either uncoated or vapor deposition coated hardware. Separations were performed with an ACQUITY UPLC H-Class Bio instrument according to the experimental conditions outlined below. FIGS. 21 and 22 present comparisons of these separations and their resulting data as obtained with columns constructed of varying coatings and materials.

| LC Conditions | |
|---|---|
| Columns: | 3 μm non-porous cation exchange stationary phase in a 2.1 × 50 mm column dimension |
| Sample: | NIST mAb Reference Material 8671 diluted to 2.5 mg/mL with 20 mM MES pH 6.0 buffer |
| Gradient: | 20 mM MES pH 6.0, 10-200 mM NaCl in 7.5 min |
| Flow Rate: | 0.2 mL/min |
| Column Temperature: | 30° C. |
| Injection Volume: | 1 μL (2.1 mm ID columns) |
| Detection: | 280 nm |
| Hardware Design: | Hardware A-Identical to ACQUITY UPLC BEH C18 column hardware<br>Hardware B-A design with an alternative sealing mechanism and some alternative material compositions. |

Example 11

Oligonucleotide Ion Pair RPLC

Testing has shown that flow paths modified with the vapor deposition coatings of this invention are also helpful in improving oligonucleotide separations. Example 11 provides evidence of such as observed in the form of improved recoveries and more accurate profiling of a sample's composition, particularly with respect to the first chromatograms obtained with a column.

In this work, a mixture of 15, 20, 25, 30, 35 and 40-mer deoxythymidine was separated using columns constructed from a 1.7 μm organosilica 130 Å $C_{18}$ bonded stationary phase packed into either uncoated or vapor deposition coated hardware. Separations were performed with an ACQUITY UPLC H-Class Bio instrument according to the experimental conditions outlined below. FIGS. 23A-F and 24 present comparisons of these separations and their resulting data as obtained with columns constructed of varying coatings and materials.

| LC Conditions | |
|---|---|
| Columns: | 1.7 μm organosilica 130Å $C_{18}$ bonded stationary phase in a 2.1 × 50 mm column dimension |
| Sample: | 15, 20, 25, 30, 35 and 40-mer deoxythymidine (0.5 pmol/μL) |
| Column Temperature: | 60° C. |
| Flow Rate: | 0.2 mL/min |
| Mobile Phase A: | 400 mM HFIP, 15 mM TEA in water |
| Mobile Phase B: | 400 mM HFIP, 15 mM TEA in methanol |
| Gradient: | 18 to 28% B in 5 min |
| Injection volume: | 10 μL |
| UV Detection: | 260 nm |

Example 12

RPLC of Citric and Malic Acid

It should also be pointed out that the benefits of this invention are not limited to only biomolecules or phosphorylated/phospho group containing analytes. In fact, numerous types of so-called "small molecules" can be seen to have their separations improved through the adoption of vapor deposition coated flow paths and column hardware. One notable class of small molecules corresponds to compounds having a carboxylic acid moiety. By their nature, these are ubiquitous compounds and some, like citric acid and malic acid, are important metabolites of living organisms, given that they are constituents of the Kreb's cycle.

Herein, we have investigated the effects of separating citric acid and malic acid with untreated versus vapor deposition coated columns. Citric acid and malic acid were analyzed by LC-MS with columns constructed from a 1.8 μm silica 100 Å $C_{18}$ bonded stationary phase packed into either uncoated or $C_2C_3$ vapor deposition coated hardware. Separations were performed with an ACQUITY UPLC I-Class PLUS instrument, and eluting analytes were detected with a Xevo TQ-S triple quadrupole mass spectrometer according to the experimental conditions outlined below. FIGS. 25A-D presents a comparison of these separations and their resulting data. It can be observed from these results that use of the vapor deposition coated column hardware led to improvements in recovery and peak shape and thus sizable increases in MS intensity. This is noteworthy as it highlights the fact that the vapor deposition coating can be used to facilitate the development of a more sensitive and more accurate quantitation assay of these and other chemically similar compounds, including but not limited to isocitric acid, α-ketoglutaric acid, succinic acid, fumaric acid, lactic acid, aconitic acid, itaconic acid, oxaloacetic acid, pyruvic acid, pantothenic acid, biotin, and folic acid. It is reasonable to assume that even zwitterionic small molecules would benefit from this invention. This class of compounds includes but is not limited to amino acids and neurotransmitters. Likewise, it is envisioned that this invention will be advantageous to be used to separate and analyze compounds containing metal binding moieties, such as cobalamin and the various types of porphyrins. Lastly, these same compounds would exhibit improved separations whether analyzed by RPLC or other modes of chromatography, such as hydrophilic interaction chromatography (HILIC), ion exchange, or mixed mode LC separations (i.e. ion exchange/reversed phase or ion exchange/HILIC).

| LC Conditions | |
|---|---|
| Columns: | 1.8 μm silica 100Å $C_{18}$ bonded stationary phase in a 2.1 × 50 mm column dimension |
| Sample: | Citric acid<br>Malic acid |
| Column Temperature: | 30° C. |
| Flow Rate: | 0.5 mL/min |
| Mobile Phase A: | 0.1% formic acid, water |
| Mobile Phase B: | 0.1% formic acid, acetonitrile |
| Injection volume: | 2 μL |

Gradient Table:

| Time(min) | Flow Rate(mL/min) | % A | % B | Curve |
|---|---|---|---|---|
| Initial | 0.500 | 100.0 | 0.00 | Initial |
| 0.25 | 0.500 | 100.0 | 0.00 | 6 |
| 2.00 | 0.500 | 75.0 | 25.0 | 6 |
| 2.50 | 0.500 | 5.0 | 95.0 | 6 |
| 3.00 | 0.500 | 5.0 | 5.0 | 6 |
| 3.10 | 0.500 | 100.0 | 0.0 | 6 |

| MS Conditions | |
|---|---|
| MS1 Resolution: | 1 Da |
| MS2 Resolution: | 0.75 Da |
| Capillary Voltage: | 1 kV |
| Source Offset: | 50 |
| Desolvation Temp.: | 600° C. |
| Desolvation Gas Flow: | 1000 L/hr |
| Cone Gas: | 150 L/hr |
| Nebulizer: | 7 bar |
| Source Temp.: | 150° C. |
| MRM (Citric Acid): | 191.2 > 87.1 |
| MRM (Malic Acid): | 133.2 > 115.2 |

Example 13

Mixed Mode Chromatography of Pesticides

Glyphosate is non-selective broad spectrum herbicide which is widely used across the globe as a crop desiccant. Maximum residue limits (MRLs) are enforced globally on various commodities of interest because of the potential health consequences posed to consumers. Glyphosate and its metabolite aminomethylphosphonic acid (AMPA) require unique approaches for sample preparation and chromatography separation. Various methods can be employed for quantitation, whether they are based on reversed phase, porous graphitizes carbon, ion chromatography, hydrophilic interaction chromatography (HILIC) or mixed mode retention mechanisms. No matter the separation mode, assays for glyphosate and other related herbicide compounds can prove to be problematic. First, polar pesticides are difficult to retain on reversed phase columns without derivatization. Second, glyphosate interacts with active metal surfaces. As a result, it is notoriously observed in the form of a broad peak or one with pronounced tailing.

Herein, we have investigated the separation of glyphosate with untreated versus vapor deposition coated mixed mode HILIC columns. Glyphosate was analyzed by LC-MS with 1.7 μm diethylamine bonded organosilica 130 Å columns constructed from either uncoated or $C_2C_{10}$ vapor deposition coated stainless steel hardware. Separations were performed with an ACQUITY UPLC H-Class Bio coupled with a Xevo TQ-XS triple quadrupole mass spectrometer according to the experimental conditions outlined below.

Figures 26A, 26B:
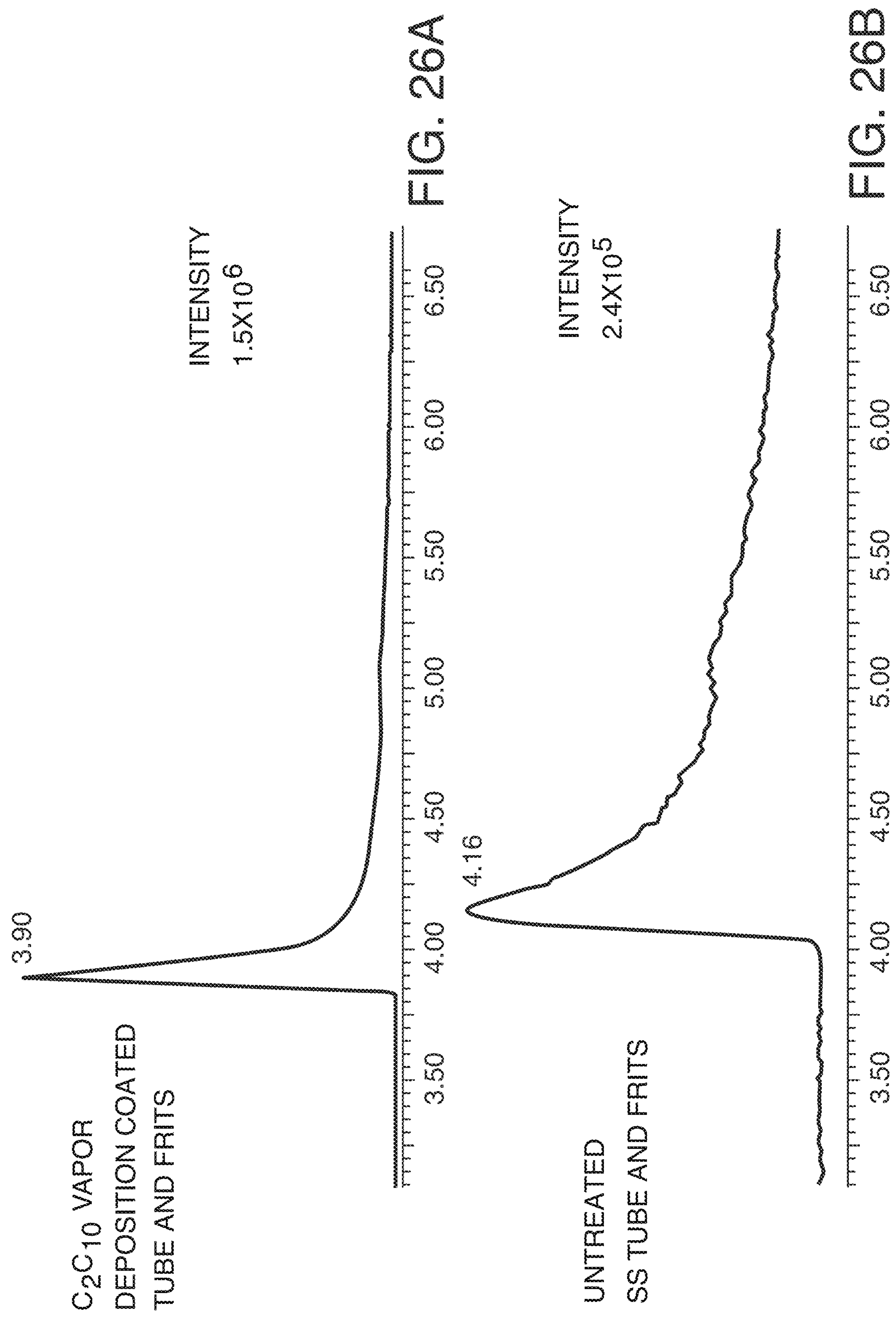
FIG. 26A is a mixed mode hydrophilic interaction chromatography (HILIC) MRM (multiple reaction monitoring) chromatogram of glyphosate showing MRM peak intensities obtained for glyphosate with the use of a 2.1×100 mm 1.7 μm diethylamine bonded organosilica 130 Å column constructed with $C_2C_{10}$ vapor deposition coated components, in accordance with an illustrative embodiment of the technology.
FIG. 26B is a mixed mode hydrophilic interaction chromatography (HILIC) MRM (multiple reaction monitoring) chromatogram of glyphosate showing MRM peak intensities obtained for glyphosate with the use of a 2.1×100 mm 1.7 μm diethylamine bonded organosilica 130 Å column with uncoated components.
Figure 27B:
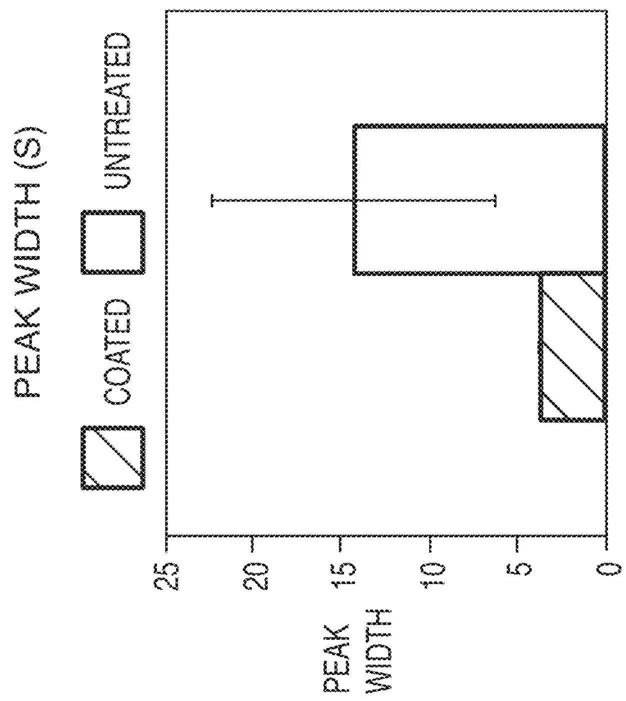
FIG. 27B is a graph showing the average peak widths of glyphosate as observed during mixed mode HILIC using either a 2.1×100 mm 1.7 μm diethylamine bonded organosilica 130 Å column constructed with either untreated or $C_2C_{10}$ vapor deposition coated components, in accordance with an illustrative embodiment of the technology. The analyses were performed with six replicate injections.
Figure 27A:
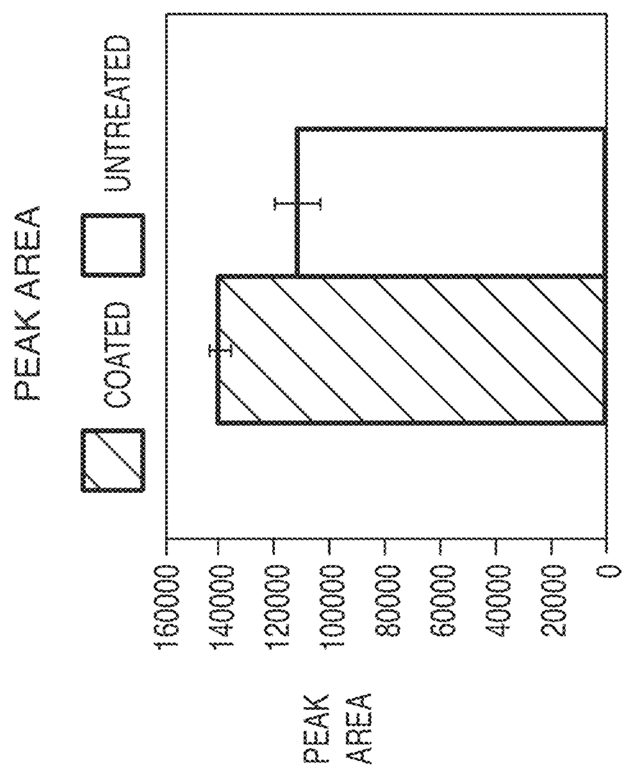
FIG. 27A is a graph showing the average peak areas of glyphosate as observed during mixed mode HILIC using either a 2.1×100 mm 1.7 μm diethylamine bonded organosilica 130 Å column constructed with either untreated or $C_2C_{10}$ vapor deposition coated components in accordance with an illustrative embodiment of the technology. The analyses were performed with six replicate injections.

FIGS. 26A-B and 27A-B show a comparison of coated and uncoated column performance for glyphosate in a solvent standard. As seen in FIG. 26B, glyphosate appears as a severely tailing, broad peak. In contrast, as seen in FIG. 26B, glyphosate is separated with much improved peak shape on the vapor deposition coated column. It can be observed from these results that the use of the vapor deposition coated column hardware led to significant improvements in peak shape, reduced peak widths and thus sizable increases in MS intensity (FIGS. 27A-B). It is reasonable to assume that the vapor deposition coated column also yielded higher recovery. These results are noteworthy as they demonstrate a means to developing more sensitive and more accurate quantitation assays for glyphosate and other chemically similar compounds, including but not limited to pesticides such as Ethephon, 2-Hydroxyethyl phosphonic acid (HEPA), Glufosinate-Ammonium, N-Acetyl-glufosinate, 3-Methylphosphinicopropionic acid (MPPA), Aminomethylphosphonic acid (AMPA), N-Acetyl-glyphosate, N-Acetyl-AMPA, Fosetyl-aluminium, Phosphonic acid, Maleic hydrazide, Perchlorate, and Chlorate.

| LC Conditions | |
|---|---|
| Columns: | 1.7 μm diethylamine bonded organosilica 130Å stationary phase in a 2.1 × 100 mm column dimension |
| Sample: | Glyphosate |
| Column Temperature: | 50° C. |
| Flow Rate: | 0.5 mL/min |
| Mobile Phase A: | 0.9% formic acid, water |
| Mobile Phase B: | 0.9% formic acid, acetonitrile |
| Injection volume: | 10 μL |

Gradient Table:

| Time (min) | Flow Rate (mL/min) | % A | % B | Curve |
|---|---|---|---|---|
| Initial | 0.500 | 10 | 90 | Initial |
| 4.00 | 0.500 | 85 | 15 | 2 |
| 10.0 | 0.500 | 85 | 15 | 6 |
| 16.0 | 0.500 | 10 | 90 | 1 |
| 20.0 | 0.500 | 10 | 90 | 1 |

| MS Conditions | |
|---|---|
| MS1 Resolution: | 1 Da |
| MS2 Resolution: | 0.75 Da |
| Capillary Voltage: | 2.4 kV |
| Ionization: | ESI- |
| Desolvation Temp.: | 600° C. |
| Desolvation Gas Flow: | 1000 L/hr |
| Cone Gas: | 150 L/hr |
| Nebulizer: | 7 bar |
| Source Temp.: | 150° C. |
| MRM 1: | 168.0 > 62.6 |
| MRM 2: | 168.0 > 149.8 |

Example 14

Interaction of Dexamethasone Sodium Phosphate Across Multiple Column Configurations Different chromatographic systems (e.g., a UHPLC system such as ACQUITY UPLC from Waters Technologies Corporation versus a HPLC system such as Arc also from Waters Technologies Corporation) have a different amount of wetted surface area. In addition, different column configurations (e.g., 2.1×50 mm vs. 4.6×150 mm) also provide a different amount of wetted surface area. This example presents a comparison of the amount of interaction of dexamethasone sodium phosphate versus an amount of uncoated metallic wetted surface area in a chromatographic system. The three chromatographic system configurations include: system 1: a stainless steel UHPLC system with a stainless steel column having uncoated frits (SS ACQUITY I-Class with SS column, from Waters Technologies Corporation); system 2: a stainless steel UHPLC system with a C2 coated stainless steel column (SS ACQUITY I-Class with C2 column with coated frits, from Waters Technologies Corporation); and system 3: a C2 coated UHPLC system with C2 coated column and frits (ACQUITY PREMIER and PREMIER COLUMN from Waters Technologies Corporation). A 100 ng on column injections of dexamethasone sodium phosphate on each of system 1, system 2, and system 3 was performed for the comparison.

Figure 28:
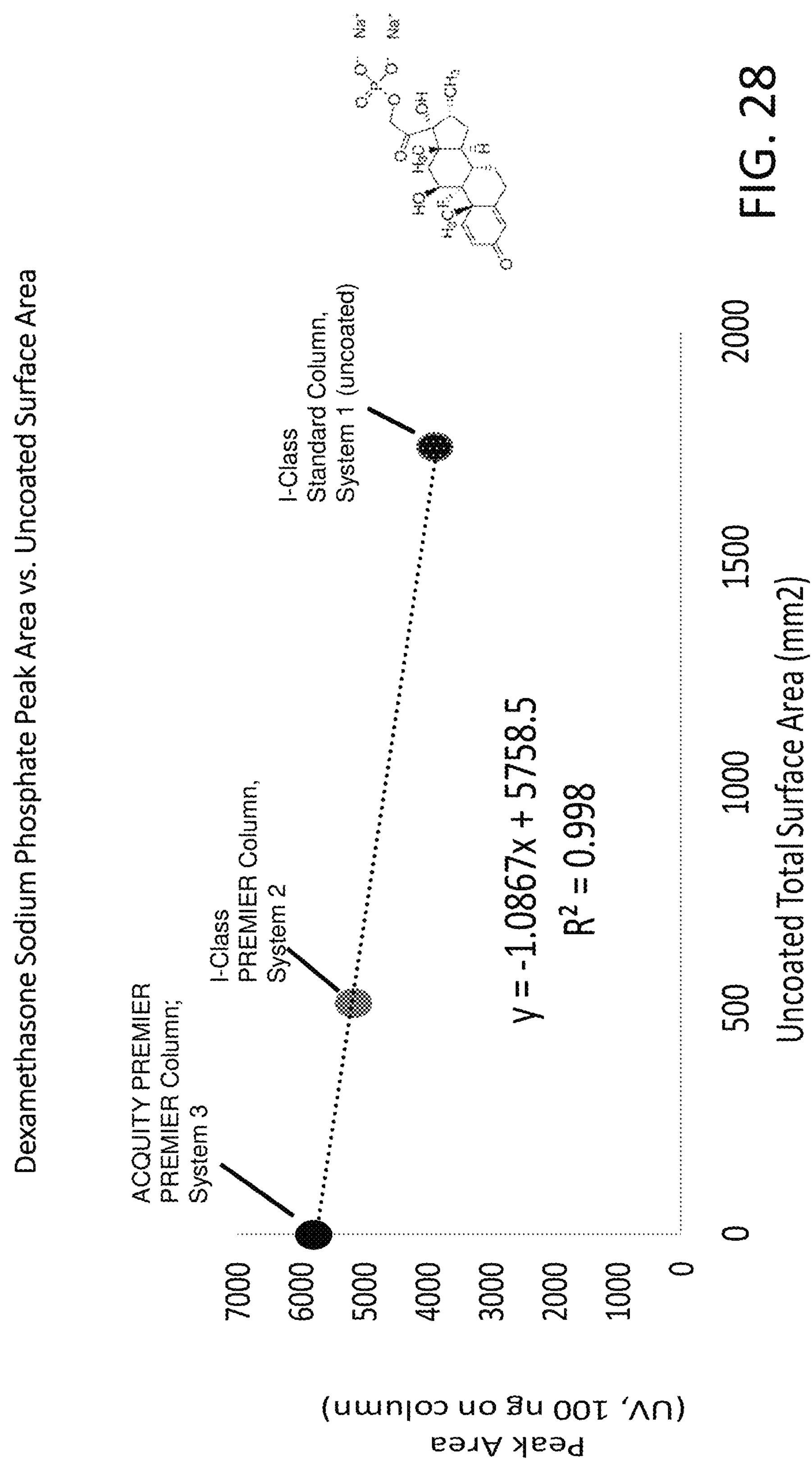
FIG. 28 is a graph showing average peak area for dexamethasone sodium phosphate versus uncoated total surface area for three different system configurations. Zero $mm^2$ of uncoated surface area corresponds to a fully coated system.

The wetted surface area of the system components is as follows: column surface area including the surface area of two frits is 1236 $mm^2$ and the surface area of the system not including the column and its internal components is 513 $mm^2$. Thus, system 1 has an uncoated surface area of 1748 $mm^2$; system 2 has an uncoated amount of 513 $mm^2$; and system 3 is coated (e.g., approximately 0 to 10 $mm^2$). The peak area for the dexamethasone sodium phosphate separation after three injections on each of the three columns was as follows: system 1 had a peak area average of 3873.0; system 2 had a peak area average of 5152.3; whereas system 3 had a peak area average of 5793.3. The data was plotted and is presented in FIG. 28 to show the relationship between peak area and surface area. If each of the systems were fully inert, the line would be horizontal or parallel with the x-axis (uncoated total surface area in $mm^2$). However, system 3 is the most inert, followed by system 2, and then last system 1. The difference between observed and expected area is the amount of analyte lost to the uncoated surface area.

Figure 29:
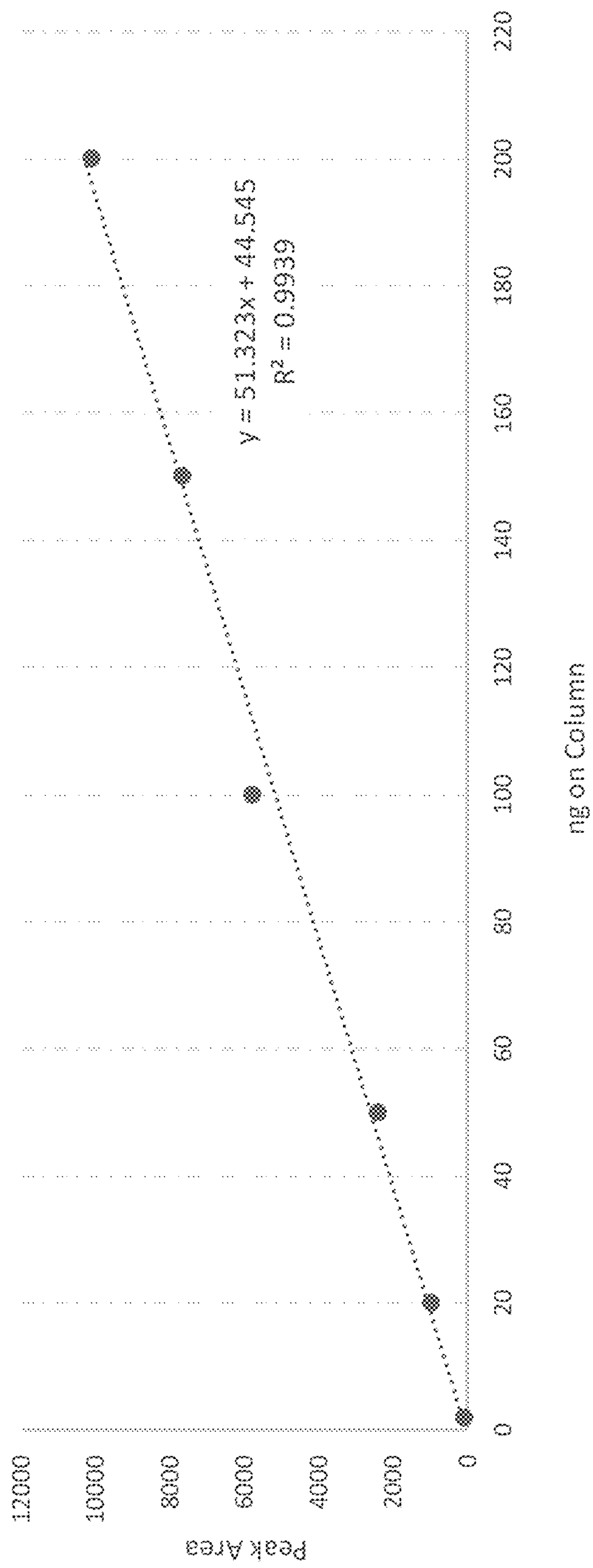
FIG. 29 is graph showing a calibration curve for dexamethasone sodium phosphate peak area versus the amount of dexamethasone injected on a fully coated system having a coated column.

This data was used to calculate the binding capacity of a system. Using the difference between system 3 (coated system and column) and system 2 (uncoated system and coated column), the binding capacity of the system was determined. From the data above, system 3 had a peak area of 5793.3, whereas system 2 had a peak of 5151.3. Both systems utilize coated columns. The difference between the two systems resides in that system 3 utilizes a coated tubing and components upstream of the column, whereas the upstream tubing and components of system 2 are uncoated. To calculate the binding capacity attributable to the system without a column (i.e., upstream tubing and components), the difference in peak areas for system 3 versus system 2 was calculated to be 642 (5793.3-5151.3). Using a calibration curve (shown in FIG. 29), area was converted back to mass and the calculated binding capacity for system 2 (attributable to upstream of the column tubing and components) was 513 $mm^2$. This is the mass loss due to metallic surface area, which can then be used to extrapolate binding capacity for any calculated metallic system surface area.

Example 15

Effect of Coating Frits Separately from Column Tubes

In Example 14, the binding capacity of an uncoated system was investigated. In this example, the effect of coating components within the column itself (e.g., frits 120) was evaluated. In this Example, three different column assemblies were tested. Assembly 1 was an uncoated 2.1 mm×150 mm column packed with 1.7 micrometer BEH C18, with uncoated stainless steel frits. Assembly 2 was an uncoated 2.1 mm×150 mm column packed with 1.7 micrometer BEH C18, with C2 coated stainless steel frits. And assembly 3 was a C2 coated 2.1 mm×150 mm column packed with 1.7 micrometer BEH C18, with C2 coated stainless steel frits. To form the coated frit, the uncoated stainless steel frit was coated via vapor deposition of C2. That is the only difference between the uncoated stainless steel frits and the coated stainless steel frits is the C2 coating. The two frits in each assembly have a total surface area of 1,376 $mm^2$ (673 $mm^2$ per frit). The total wetted surface area of a 2.1 mm×150 mm column is 519 $mm^2$. As each column assembly is formed of the same parts (with the exception of the vapor deposited C2 coatings), the total wetted surface area is 1,865 $mm^2$. As a result, the frits represent 72% of the calculated surface area, whereas the column tube represents 28%. The different column assemblies were evaluated using ATP as a sample for chromatographic separation. The following ATP test parameters were applied to evaluate each column assembly (assembly 1, assembly 2, and assembly 3) using an inert system including a PEEK injection needle, a C2 coated 10 microliter stainless steel loop, and a C2 coated MP35N (titanium alloy) APH.

| LC Conditions | |
|---|---|
| Columns: | 1.7 μm BEH C18 stationary phase in a 2.1 × 150 mm with the following assemblies<br>Assembly 1: uncoated stainless steel column, 2 uncoated stainless steel frits<br>Assembly 2: uncoated stainless steel column, 2 C2 coated stainless steel frits<br>Assembly 3: C2 coated stainless steel column, 2 C2 coated stainless steel frits |
| Sample: | ATP |
| Column Temperature: | 30° C. |
| Flow Rate: | 025 mL/min |
| Mobile Phase: | 10 mM ammonium acetate in 50/50 methanol/water |
| Sample Manager Temperature: | 4° C. |
| Injection volume: | 0.2 μL of 0.25 mg/mL ATP in water per injection (total 5 injections) |

Figure 30:
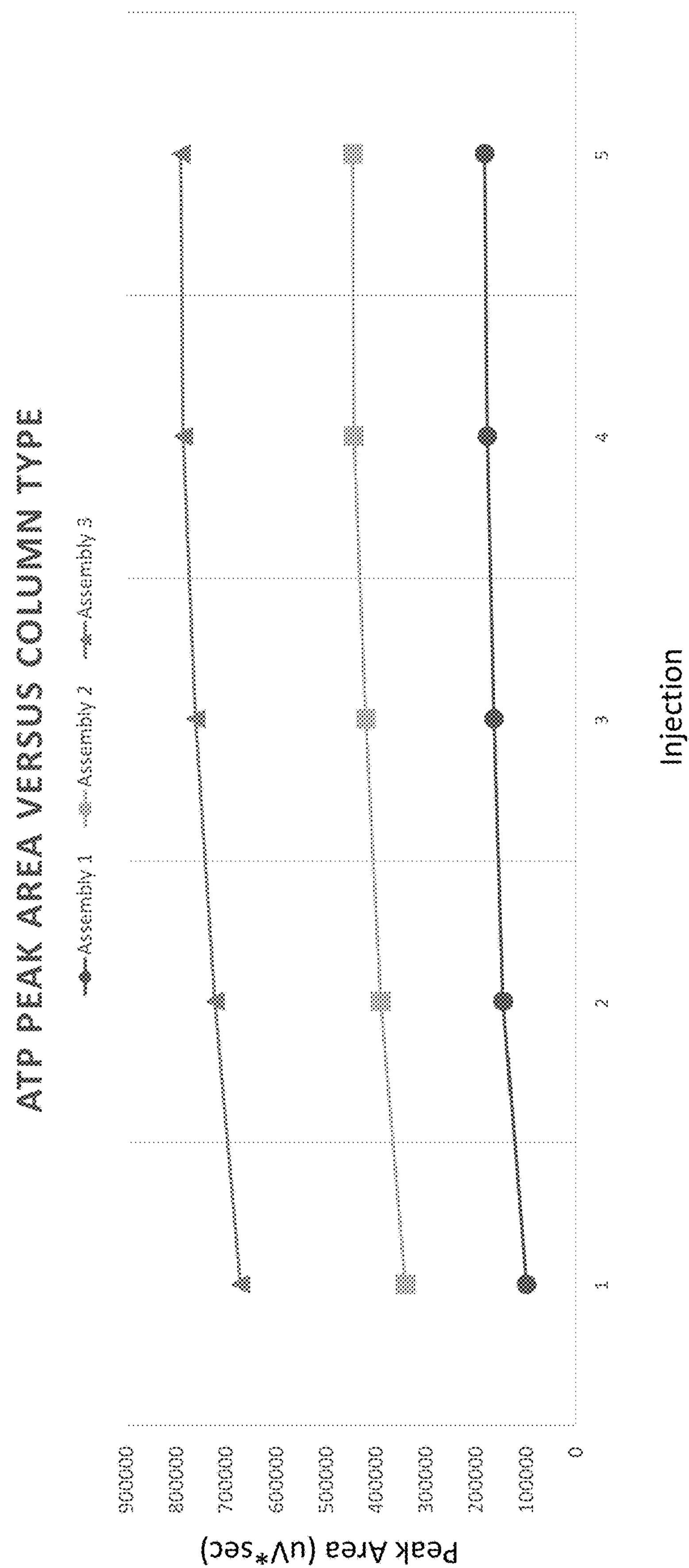
FIG. 30 is graph showing ATP peak area versus the amount of ATP injected (i.e., per injection) for three different column assemblies.

FIG. 30 plots peak area per injection number (i.e., first injection, second injection, etc.) for each of assembly 1 (circle), assembly 2 (square), and assembly 3 triangle). And Table 2 below provides the ATP peak area values and deviations for comparison purposes.

TABLE 2

| ATP Peak Areas | | | |
|---|---|---|---|
| Injection # | Assembly 1 | Assembly 2 | Assembly 3 |
| 1 | 100600 | 241858 | 329660 |
| 2 | 146717 | 245130 | 331658 |
| 3 | 164607 | 257430 | 340328 |
| 4 | 178101 | 267658 | 341251 |
| 5 | 183585 | 264845 | 343807 |
| Average | 154722 | 255384.2 | 337340.8 |
| StDev | 33431.4 | 11537.38 | 6271.24 |
| % RSD | 22% | 5% | 2% |

Figure 31:
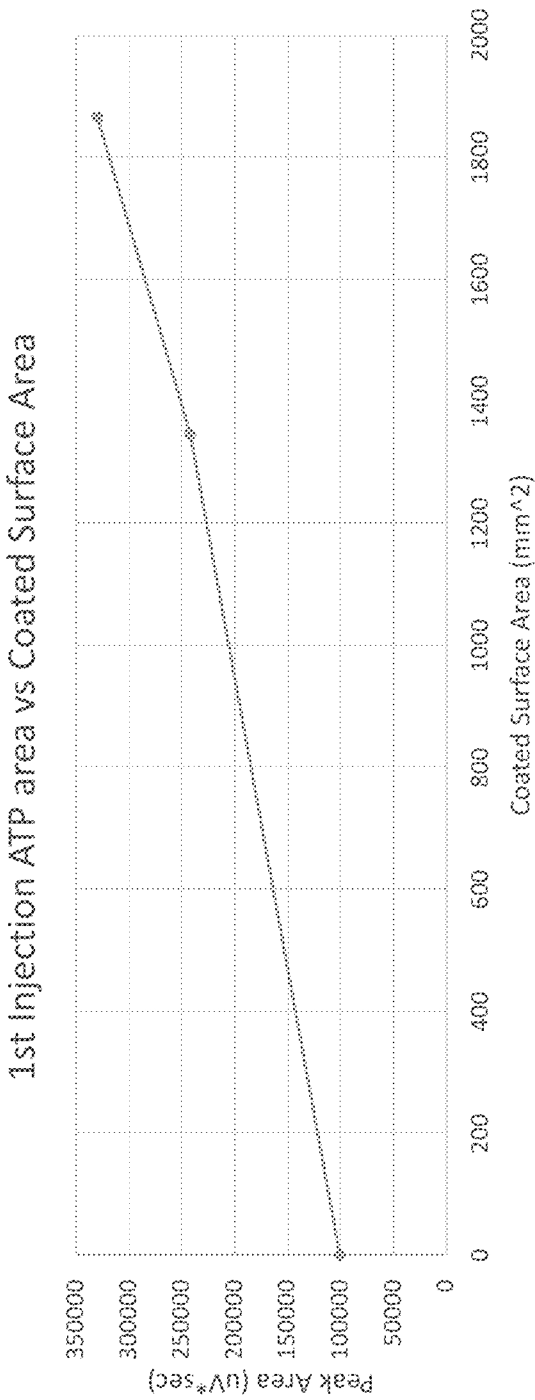
FIG. 31 is a graph showing ATP peak area after the first injection versus coated surface area for three different system configurations. Zero $mm^2$ of coated surface area corresponds to an uncoated assembly.

FIG. 31 is a graph of peak area after the first injection versus the amount of coated surface area. For assembly 1 there is no coated surface area (i.e., 0 $mm^2$). For assembly 2, which has coated frits but an uncoated column tube, the amount of coated surface area is 1,346 $mm^2$ and for assembly 3, a fully coated assembly, the amount of coated surface area is 1,865 $mm^2$. Comparing assemblies 1, 2, and 3, it was determined that the frits account for 62% of the ATP adsorption compared to an estimated 72% of the surface area. Thus, the column frits account for a majority of the metal interaction. Just coating the column frits with an alkylsilyl vapor deposited coating (e.g., vapor deposited C2) can dramatically improve chromatographic performance over an untreated system.

Example 16

Effect of Coating Frits for Various Column Formats

In Example 14, the binding capacity of uncoated versus coated systems was investigated utilizing dexamethasone sodium phosphate. In this example, the potential loss of dexamethasone sodium phosphate to frits in three different chromatographic formats (i.e., three different sizes) is presented.

The relationship between available metallic surface area and analyte loss (FIG. 28) was determined by plotting the peak area of a 100 ng injection of dexamethasone sodium phosphate versus the calculated uncoated metal surface area of the three different systems provided in Example 14. The slope of the linear curve fit represents the amount of analyte lost per additional square mm of exposed metal surface.

Figure 32:
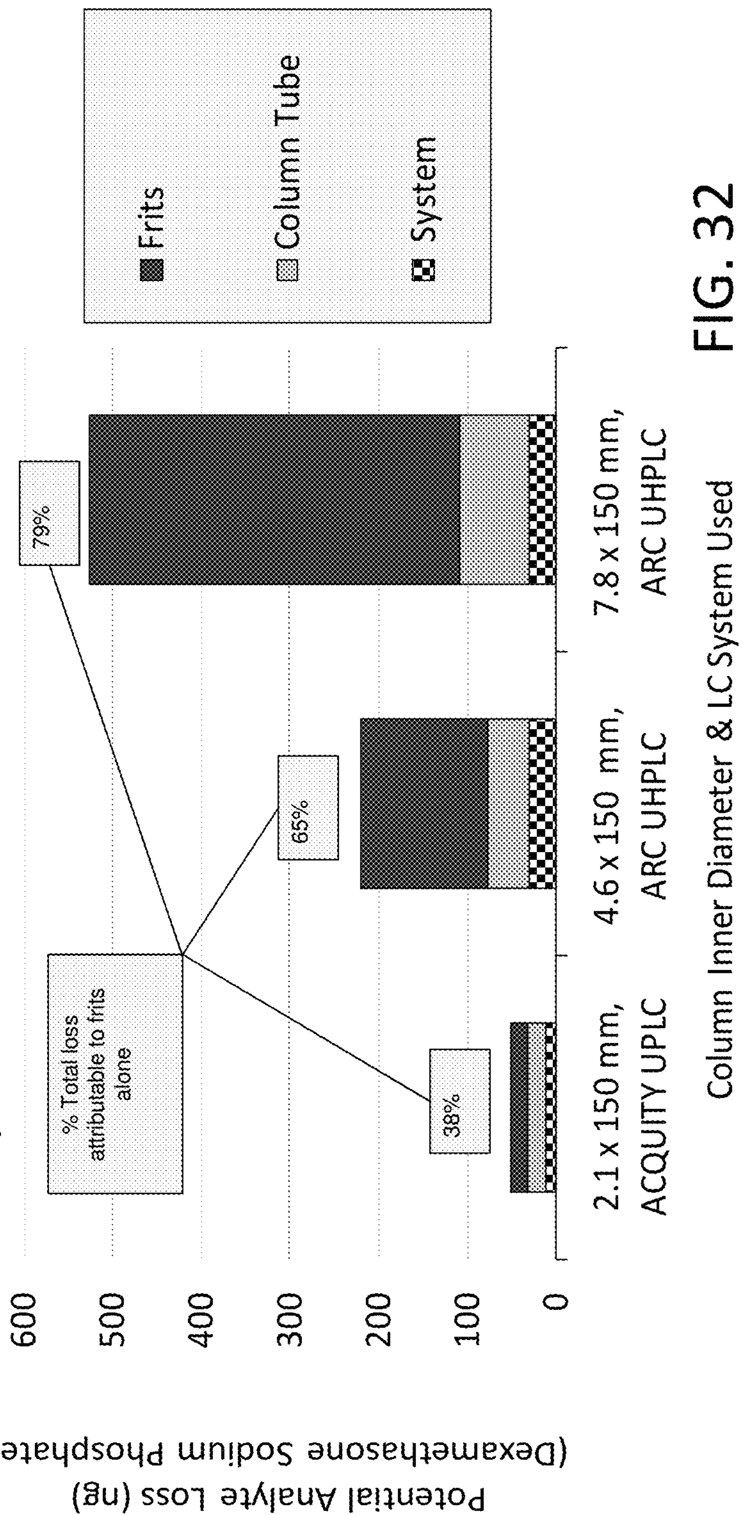
FIG. 32 is a graph showing potential loss of dexamethasone sodium phosphate in uncoated flow paths for three different system configurations.

The direct relationship between analyte loss and available metal surface area can then be used to extrapolate the potential for analyte loss for other combinations of system and column configurations. This is shown in FIG. 32 for two different LC systems (Acquity and ARC systems, both available from Waters Corporation, Milford, Mass.) and for three different column configurations (i.e., 2.1×150 mm; 4.6×150 mm, and 7.8×150 mm). Injecting anything less than the total potential analyte loss shown on the left axis of FIG. 32 for each configuration would result in complete loss of analyte. In such a scenario, the frits of an uncoated 2.1×150 mm column would be responsible for 38% of dexamethasone sodium phosphate loss when tested on an uncoated Acquity system. The frits in a 4.6×150 mm column configuration would be responsible for 65% of the loss of dexamethasone sodium phosphate when tested on an uncoated Arc system. The frits from a 7.8×150 mm column configuration would be responsible for 79% of the loss of dexamethasone sodium phosphate when tested on an uncoated Arc system. In the cases of using the 4.6 or 7.8 mm ID columns, applying the C2 coating to at least the frits in these columns provide a significant benefit (prevent 65% or more of the analyte loss).

Alternatives:

There are a number of alternative methods and uses for the present technology. While the above methods have generally been discussed with respect to chromatography or the use of a column. Other types of fluid components having an internal flow path may benefit from the present technology. For example, it is generally thought that capillary electrophoresis, such as capillary zone electrophoresis, exhibits relatively poor reproducibility. Much of the reproducibility issues can be reasoned to originate from irreproducible surface chemistry on the inner diameter of the tubular capillaries that are used to perform the separation. A vapor deposition coating on capillaries intended for a CE separation may therefore circumvent reproducibility issues as it can yield an inordinately thick, rugged coating. The inventions described herein may consequently be applicable to improving CE separations of both small and large biomolecules.

Other types of sample preparation devices, such as sample plates, vials, and extraction devices may also include a vapor deposited coating along wetted surfaces (i.e., internal pathways/surfaces in contact with the sample).

Moreover, while the examples of the described aspects employ comparatively hydrophobic coatings, with water contact angles ranging from 150 to 110°, it is reasonable to suggest that some separations could be enhanced through the application of hydrophilic coatings, including but not restricted to diol, amide/ureido type, and polyethylene oxide/glycol bondings.

Other analytes, not yet explicitly described, may also benefit from vapor deposition coated chromatographic flow paths, for instance phosphorothioated oligonucleotides. Nucleic acids inherently contain repeating phosphodiester bonds as part of their backbone. In some case, the phosphodiester backbone is replaced in part with a phosphorothioate backbone, which can impart in itself unique challenges for a separation. Similarly, intact and proteolytically digested antibody conjugates may benefit from methods entailing the use of vapor deposition chromatographic flow paths. Lastly, biomolecules containing histidine residues are likely to benefit from this invention as, like phosphorylated and carboxylate containing residues, they have a propensity for binding to metal.

What is claimed is:

1. A chromatographic column, comprising:

an uncoated tube comprising stainless steel or titanium or both; and a coated frit comprising a coating, wherein a vapor reagent used to form the coating is bis(trichlorosilyl) ethane or bis(trimethoxysilyl)ethane and the coated frit is disposed proximate to an end of the uncoated tube;

wherein the uncoated tube does not have the coating, and during a separation of sample components in the chromatography column, the coating reduces binding of one or more sample components to the coated frit relative to binding of the one or more sample components to the uncoated tube.

2. The chromatography column of claim 1, wherein the chromatography column is a preparative liquid chromatography column.

3. The chromatographic column of claim 1, wherein the coated frit is a tube outlet frit.

4. The chromatographic column of claim 1, wherein the coated frit is a tube inlet frit.

5. The chromatographic column of claim 1, wherein the coated frit includes an underlying substrate of titanium.

6. The chromatographic column of claim 1, wherein the uncoated tube has a length to diameter ratio of between 40 and 4.

7. The chromatographic column of claim 1, wherein the coating has a thickness of at least 100 Å.

8. The chromatographic column of claim 1, wherein the coating comprises a primer layer and a top layer.

9. The chromatographic column of claim 8, wherein the primer layer is an alkylsilyl formed using a vapor reagent selected from the group consisting of bis(trichlorosilyl) ethane or bis(trimethoxysilyl)ethane.

10. The chromatographic column of claim 8, wherein a vapor reagent used to form the top layer is (3-glycidyloxypropyl) trimethoxysilane, n-decyltrichlorosilane, trimethylchlorosilane, trimethyldimethyaminosilane, methoxy-polyethyleneoxy(1-10) propyl trichlorosilane, or methoxy-polyethyleneoxy(1-10) propyl trimethoxysilane.

11. The chromatographic column of claim 8, wherein a vapor reagent used to form the top layer comprises (3-glycidyloxypropyl) trimethoxysilane after hydrolysis.

12. The chromatographic column of claim 8, wherein a vapor reagent used to form the primer layer is bis(trichlorosilyl)ethane or bis(trimethoxysilyl)ethane and a second vapor reagent used to form the top layer is (3-glycidyloxypropyl)trimethoxysilane.

13. The chromatographic column of claim 8, wherein a vapor reagent used to form the primer layer is bis(trichlorosilyl)ethane or bis(trimethoxysilyl)ethane and a second vapor reagent used to form the top layer is (3-glycidyloxypropyl)trimethoxysilane after hydrolysis.

14. The chromatographic column of claim 8, wherein a vapor reagent used to form the primer layer is bis(trichlorosilyl)ethane or bis(trimethoxysilyl)ethane and a second vapor reagent used to form the top layer is n-decyltrichlorosilane.

15. The chromatographic column of claim 8, wherein a vapor reagent used to form the primer layer is bis(trichlorosilyl)ethane or bis(trimethoxysilyl)ethane and a second vapor reagent used to form the top layer is trimethylchlorosilane or trimethyldimethyaminosilane.

16. The chromatographic column of claim 8, wherein a vapor reagent used to form the primer layer is bis(trichlorosilyl)ethane or bis(trimethoxysilyl)ethane and a second vapor reagent used to form the top layer is methoxy-polyethyleneoxy(3)silane.

17. The chromatographic column of claim 8, wherein a vapor reagent used to form the top layer is bis(trichlorosilyl) ethane or bis(trimethoxysilyl)ethane.

18. The chromatographic column of claim 8, wherein a vapor reagent used to form the primer layer is bis(trichlorosilyl)ethane or bis(trimethoxysilyl)ethane and a second vapor reagent used to form the top layer is bis(trichlorosilyl) ethane or bis(trimethoxysilyl)ethane.

* * * * *